(12) United States Patent
Fukasawa et al.

(10) Patent No.: US 6,518,784 B2
(45) Date of Patent: Feb. 11, 2003

(54) TEST METHOD USING SEMICONDUCTOR TEST APPARATUS

(75) Inventors: Norio Fukasawa, Kawasaki (JP); Yukinori Sumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/984,781

(22) Filed: Oct. 31, 2001

(65) Prior Publication Data

US 2002/0036509 A1 Mar. 28, 2002

Related U.S. Application Data

(62) Division of application No. 08/946,593, filed on Oct. 7, 1997, now Pat. No. 6,333,638.

(30) Foreign Application Priority Data

Mar. 19, 1997 (JP) ............................................. 9-066918

(51) Int. Cl.[7] ............................................. G01R 31/26
(52) U.S. Cl. ..................... 324/765; 324/754; 324/755; 324/757
(58) Field of Search ................................ 324/72.5, 754, 324/755, 761, 756, 757, 765, 158.1; 29/840, 844

(56) References Cited

U.S. PATENT DOCUMENTS

| 5,289,631 | A |   | 3/1994  | Koopman et al. |
| 5,329,423 | A |   | 7/1994  | Scholz et al. |
| 5,481,205 | A |   | 1/1996  | Frye et al. |
| 5,625,298 | A |   | 4/1997  | Hirano et al. |
| 5,629,630 | A |   | 5/1997  | Thompson et al. |
| 5,789,271 | A | * | 8/1998  | Akram ........................ 438/18 |
| 6,072,326 | A | * | 6/2000  | Akram et al. ................ 324/755 |
| 6,333,638 | B1 | * | 12/2001 | Fukasawa et al. .......... 324/754 |

FOREIGN PATENT DOCUMENTS

JP            08306749 A    11/1996

\* cited by examiner

*Primary Examiner*—Kamand Cuneo
*Assistant Examiner*—Minh N. Tang
(74) *Attorney, Agent, or Firm*—Armstrong, Westerman & Hattori, LLP

(57) ABSTRACT

A semiconductor test apparatus tests a semiconductor device having plate connection terminals. The apparatus includes a test substrate having deformable connection parts connected with the plate connection terminals, and an upholding substrate which has upholding parts formed to project at a position that faces the connection part and which urges, in cooperation with the test substrate, the connection parts toward the plate connection terminals of the semiconductor device so as to electrically connect the connection parts to the plate connection terminals.

27 Claims, 63 Drawing Sheets

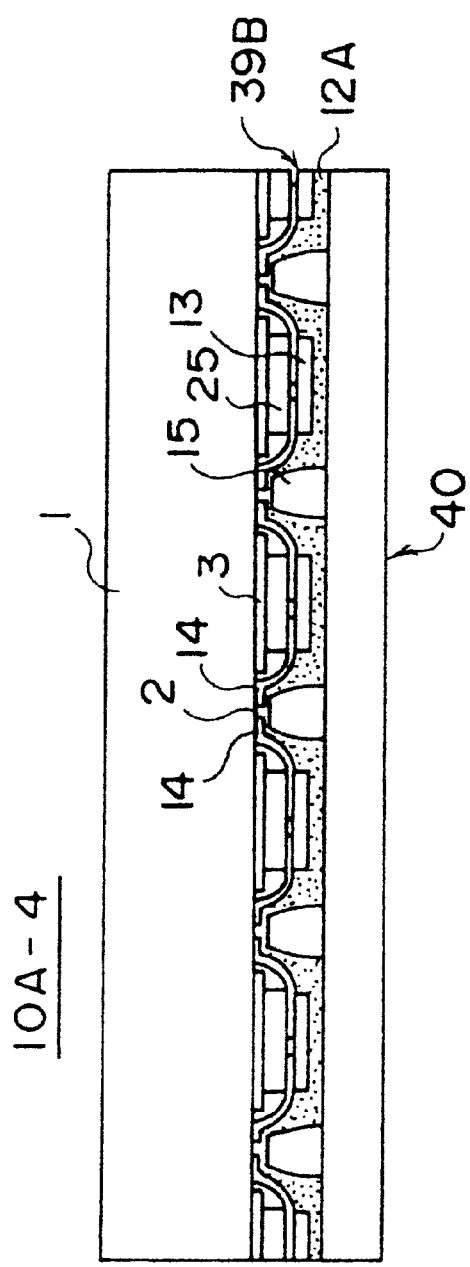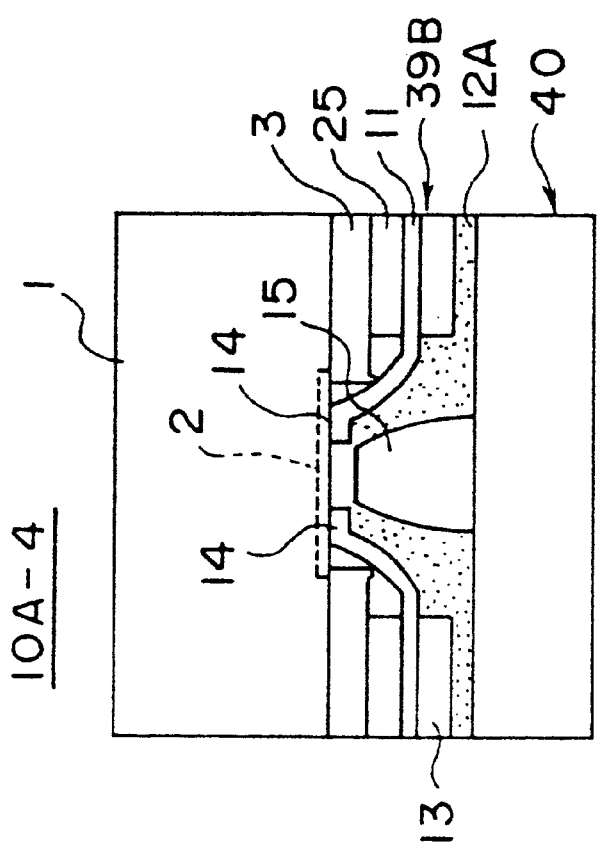
FIG. 9A
FIG. 9B

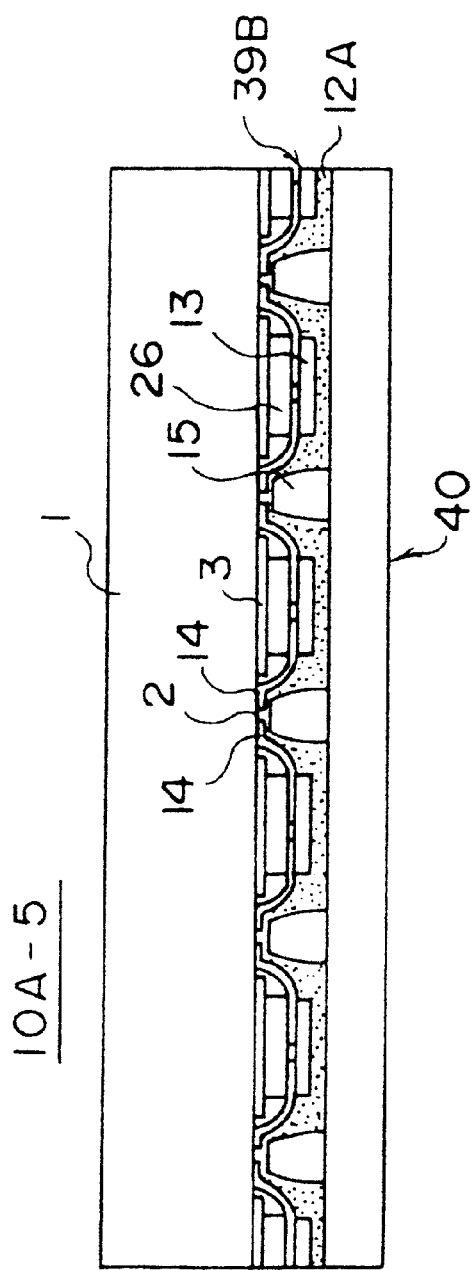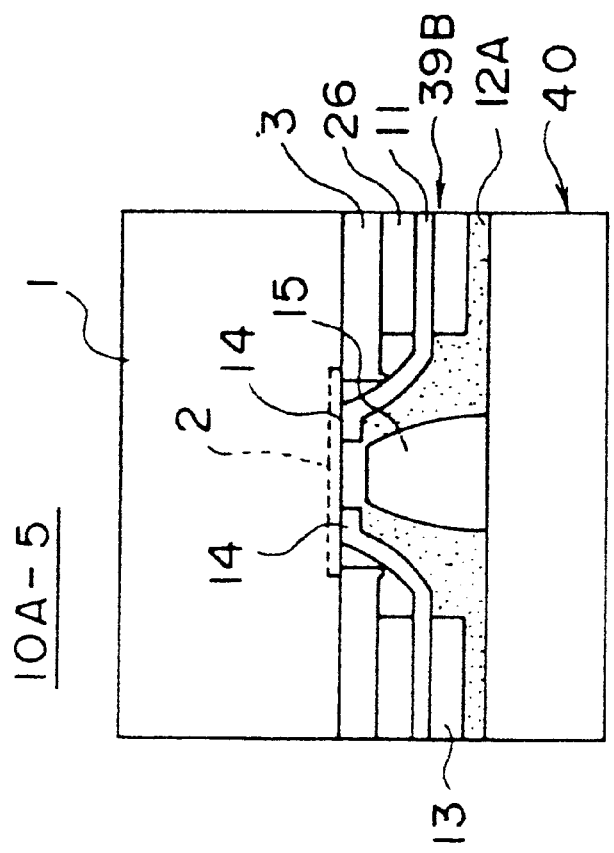
FIG. 10A
FIG. 10B

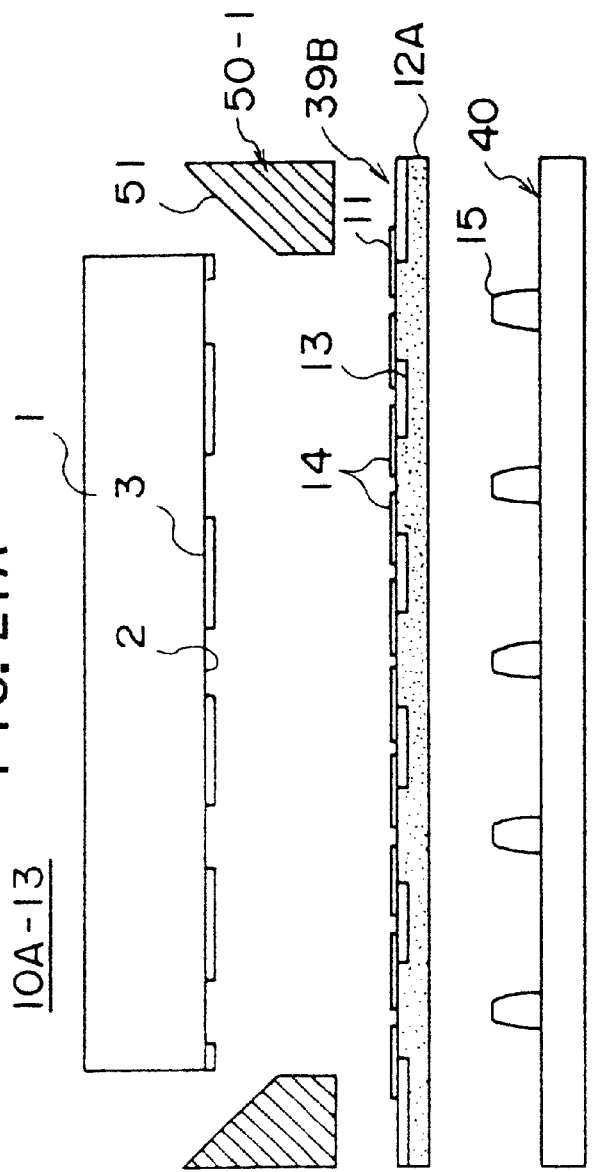
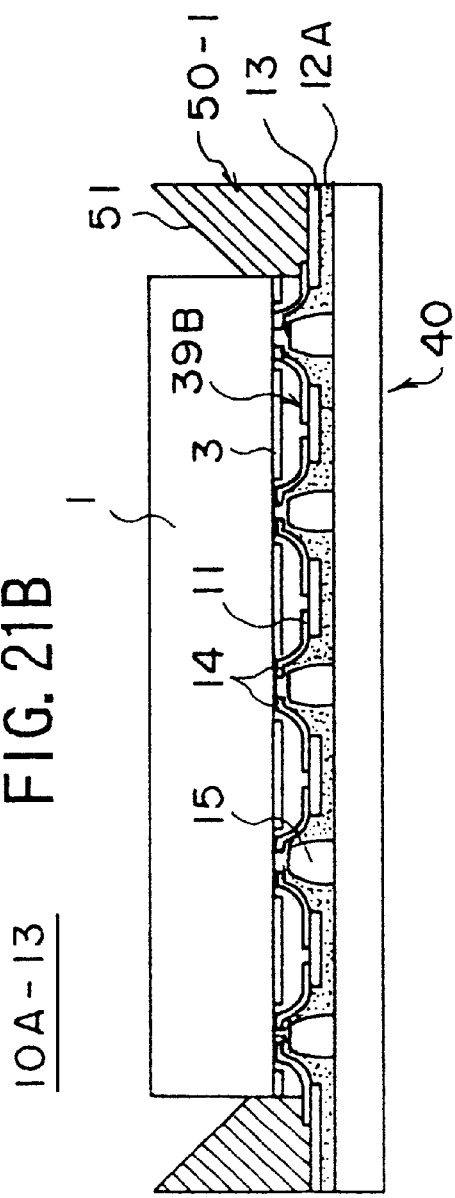

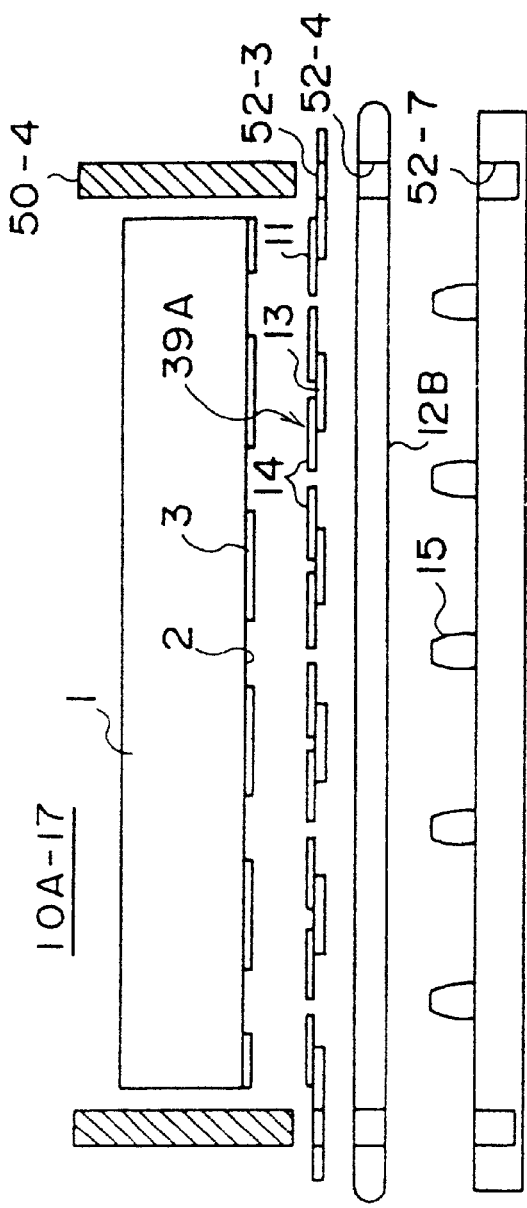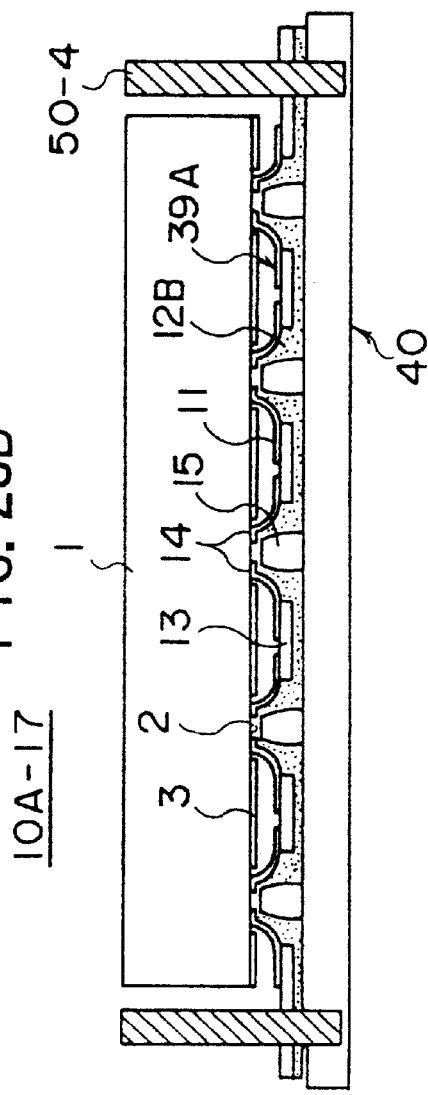

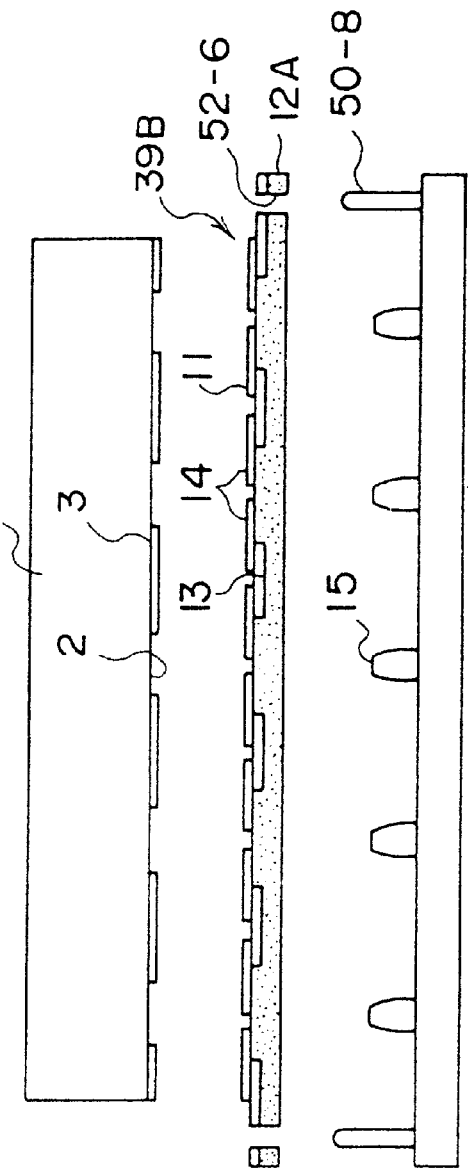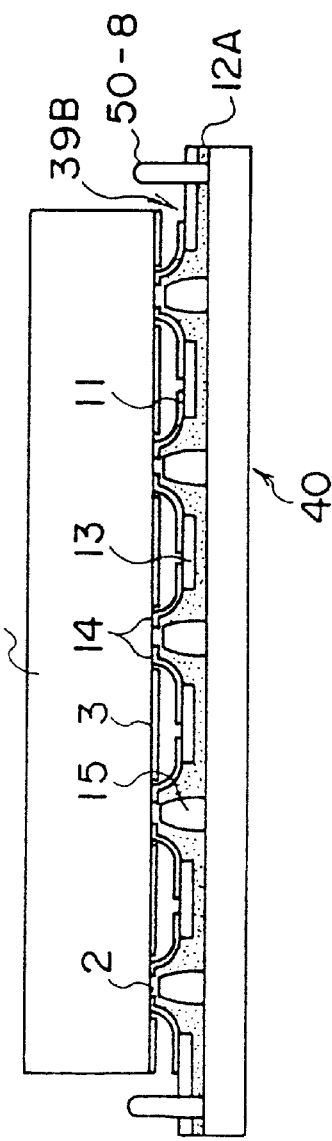

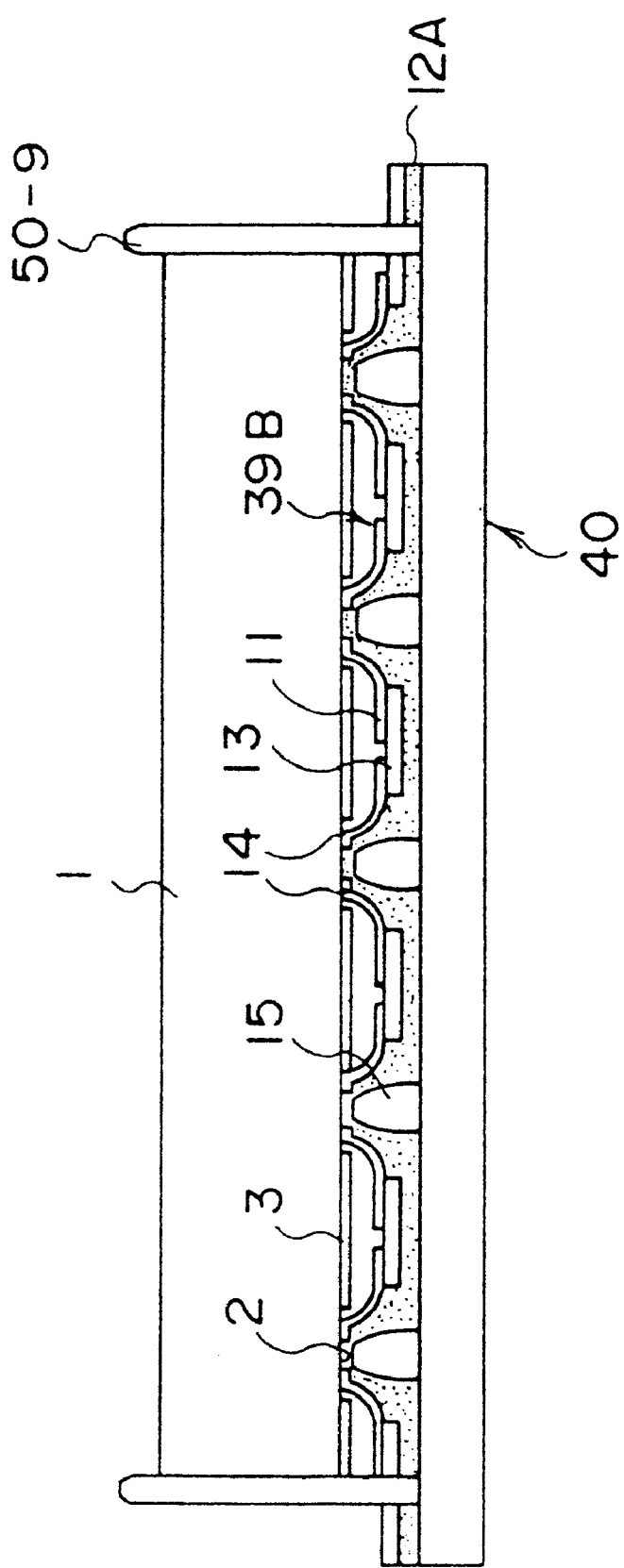

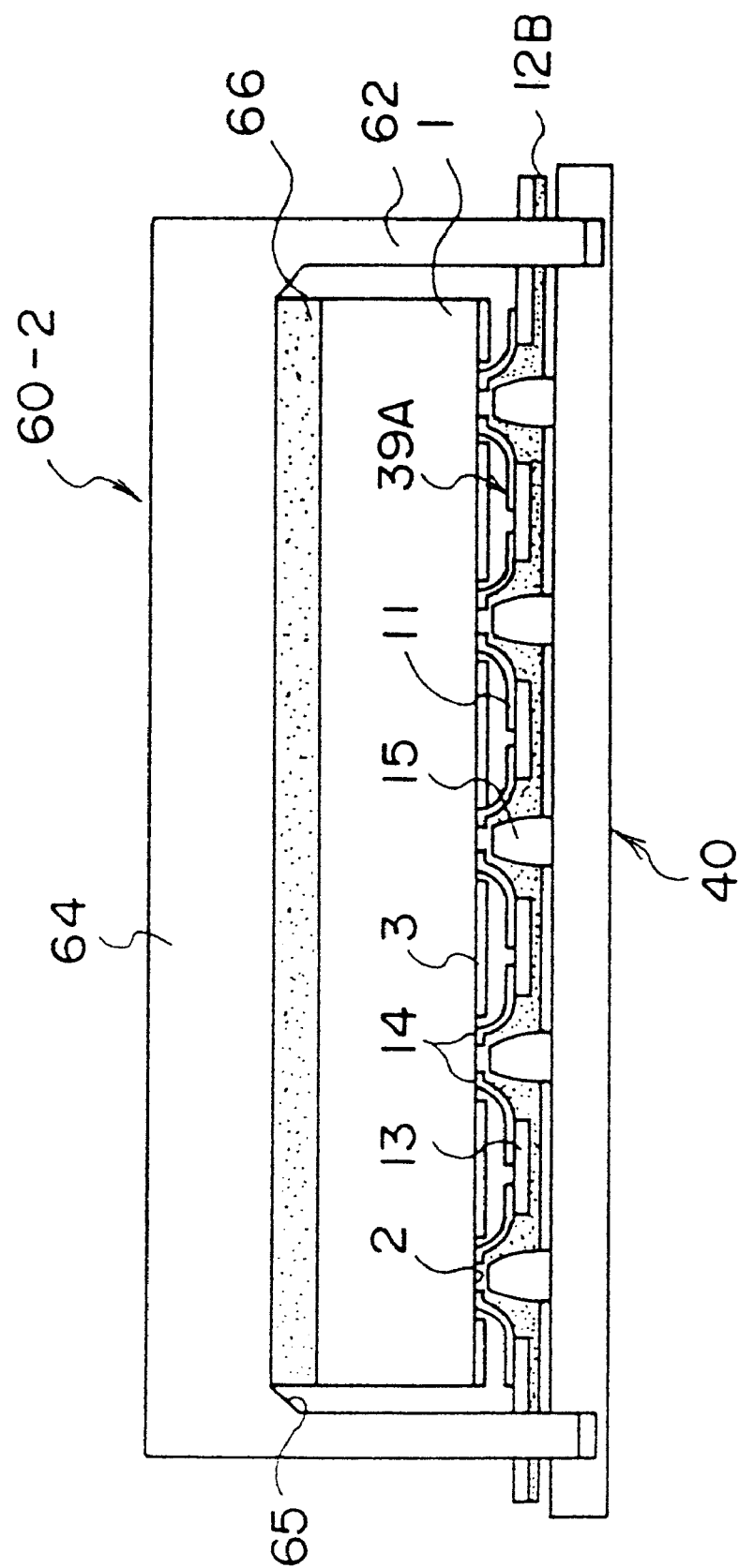

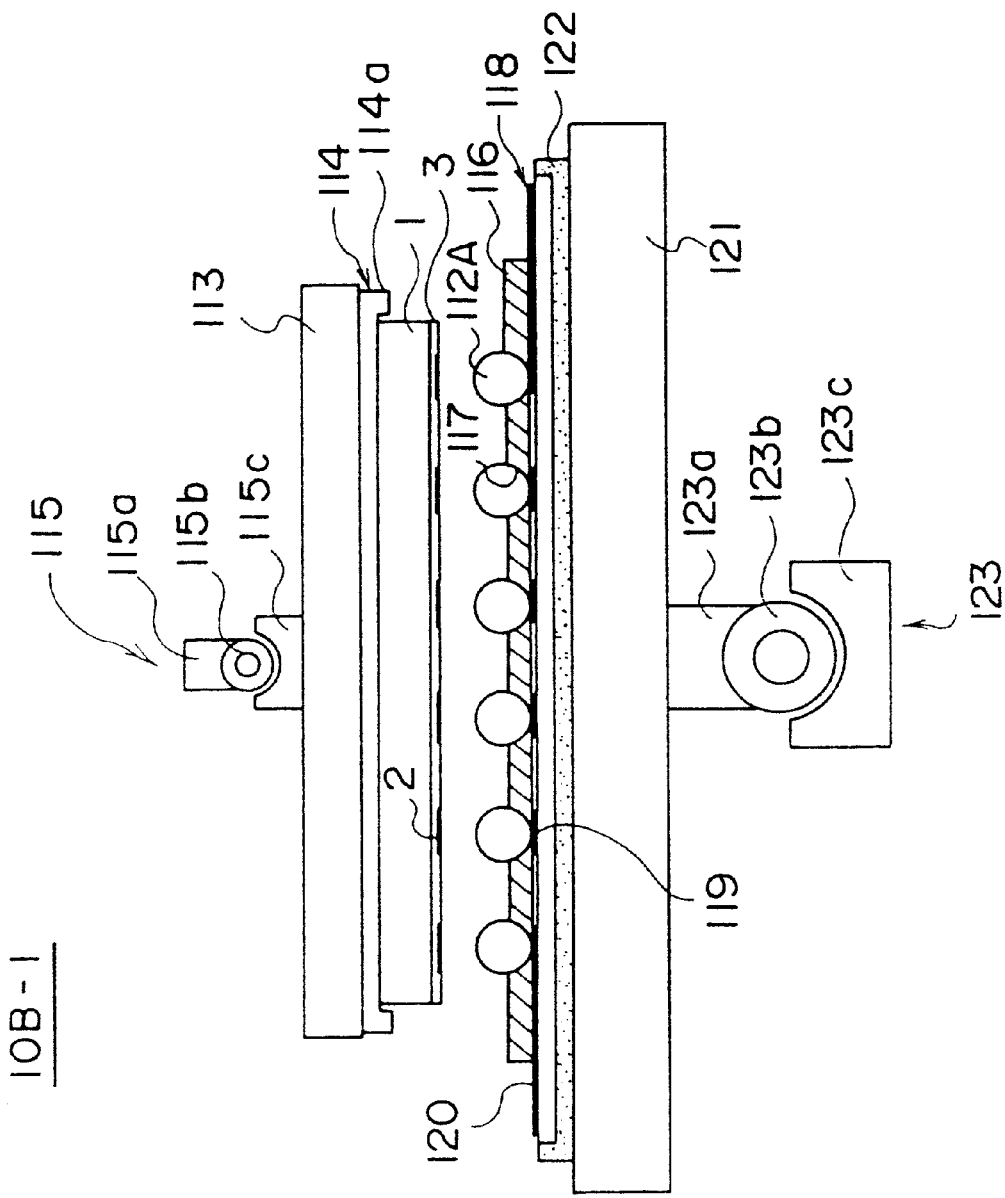

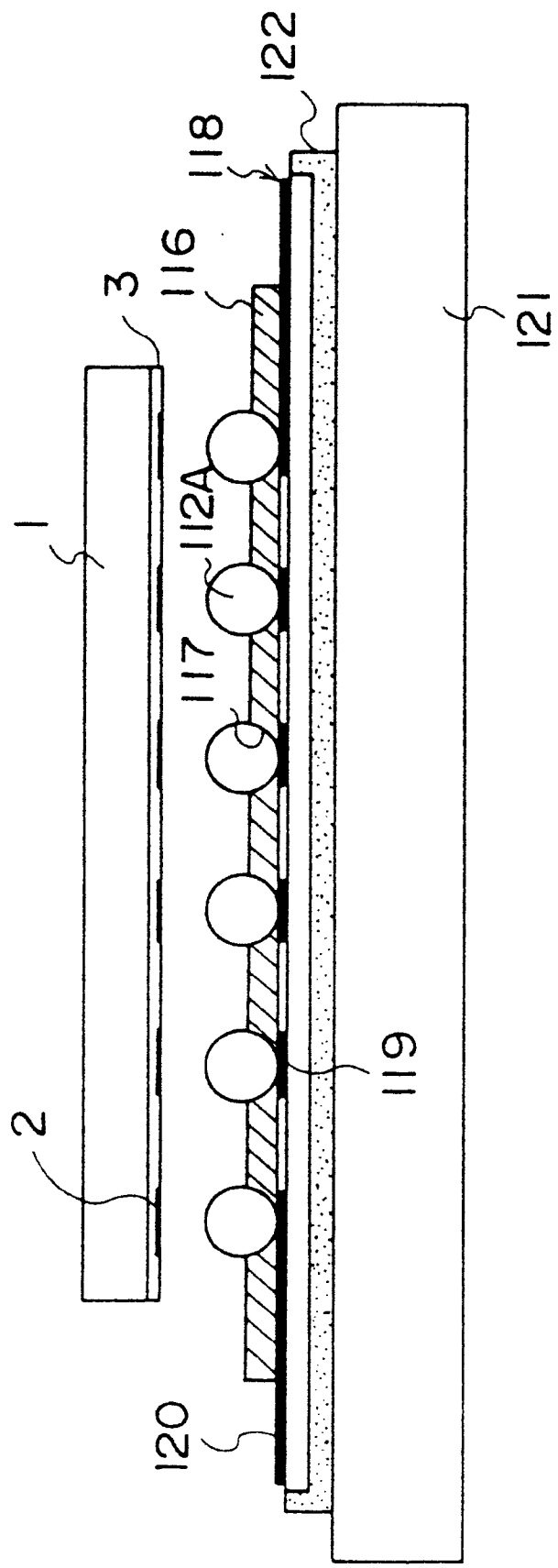

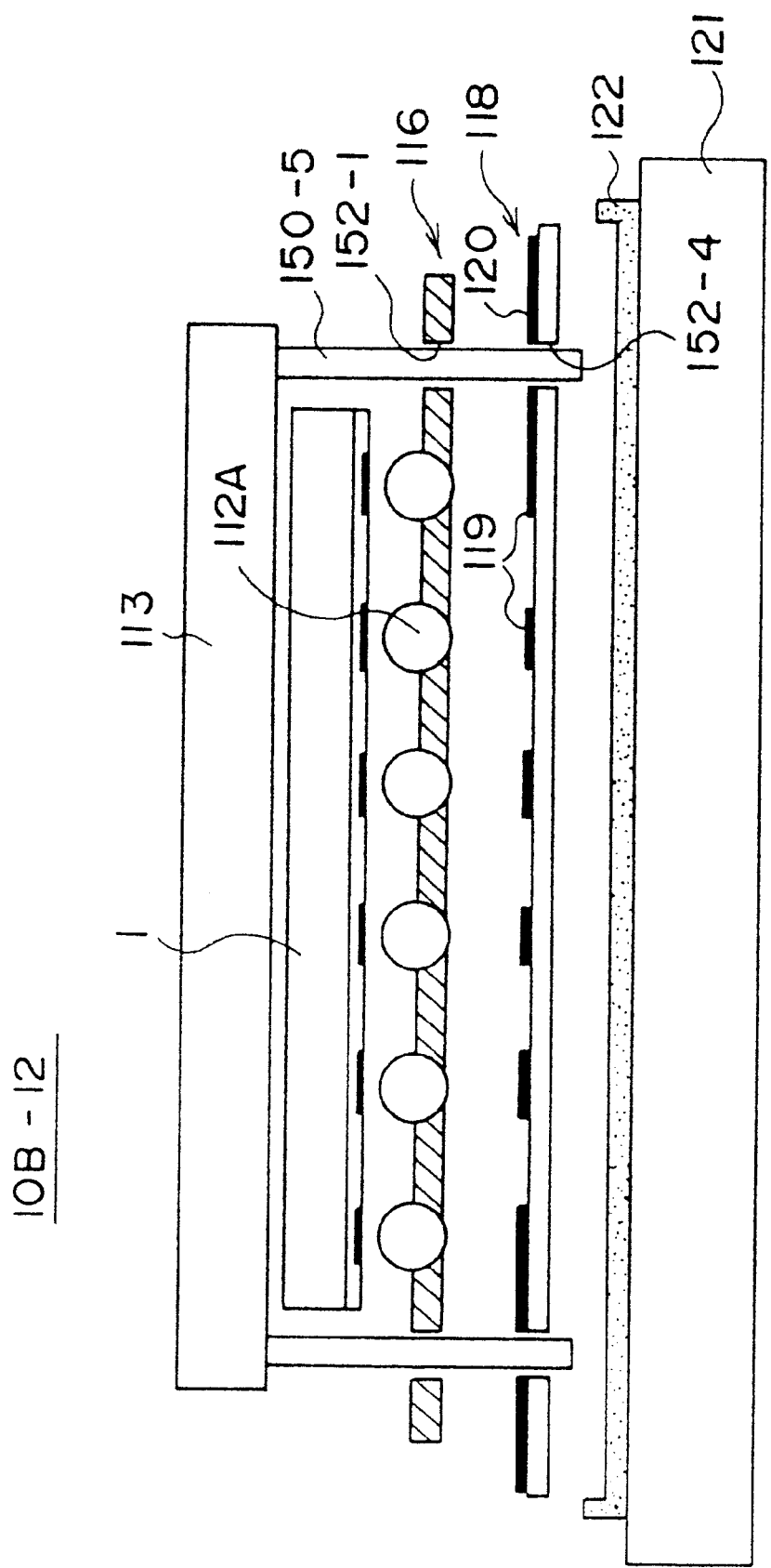

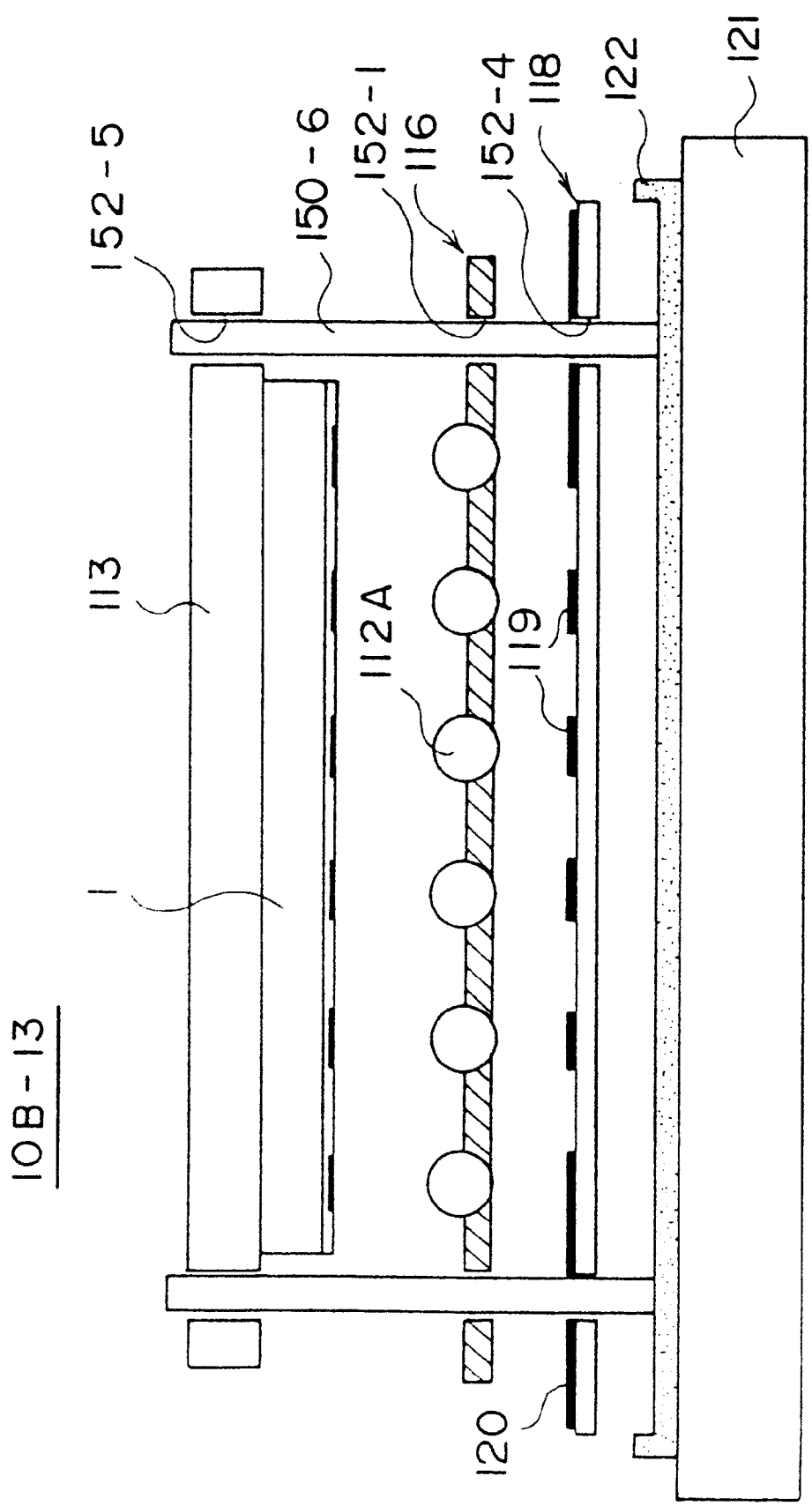

FIG. 67A
FIG. 67B
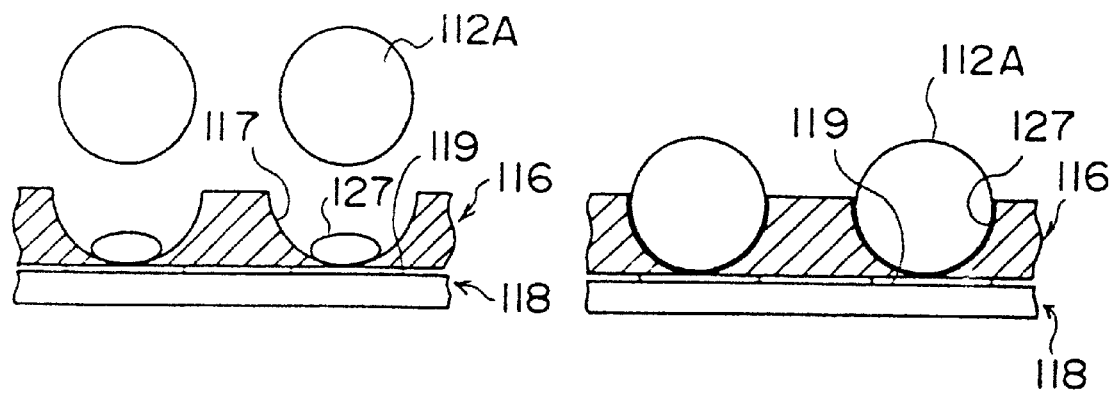
FIG. 68A
FIG. 68B
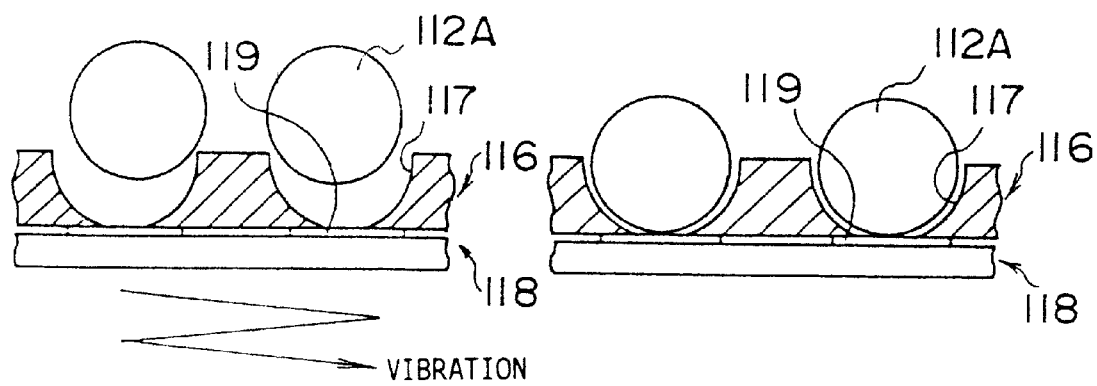

FIG. 71A
FIG. 71B
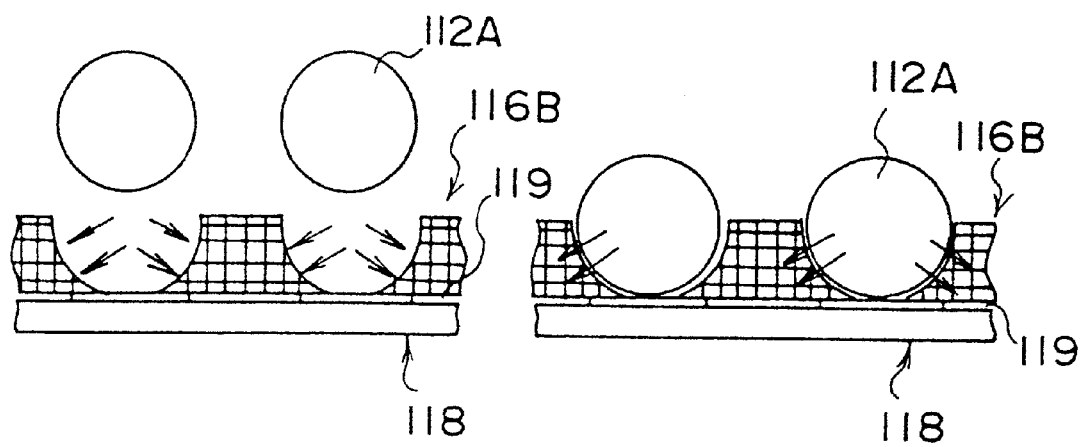
FIG. 72A
FIG. 72B
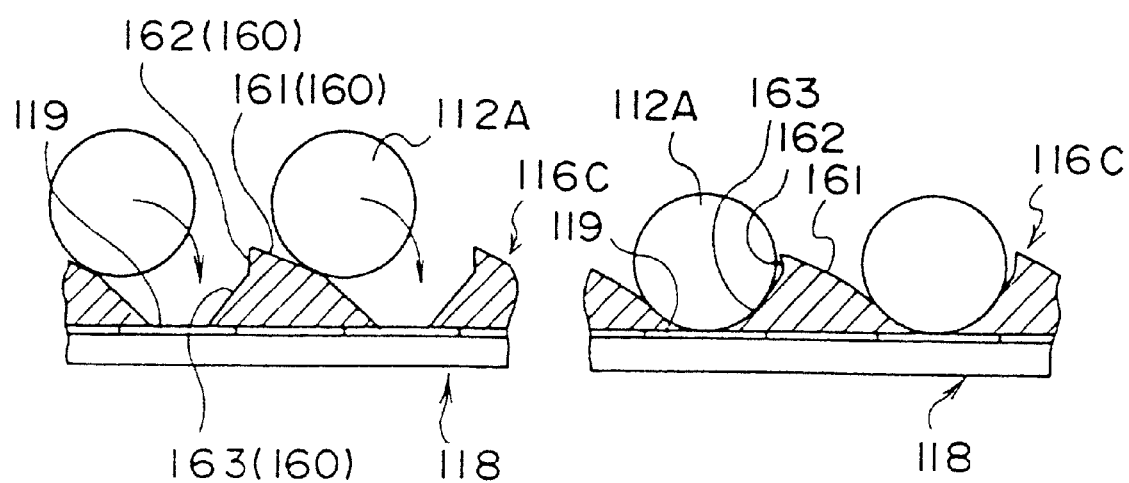

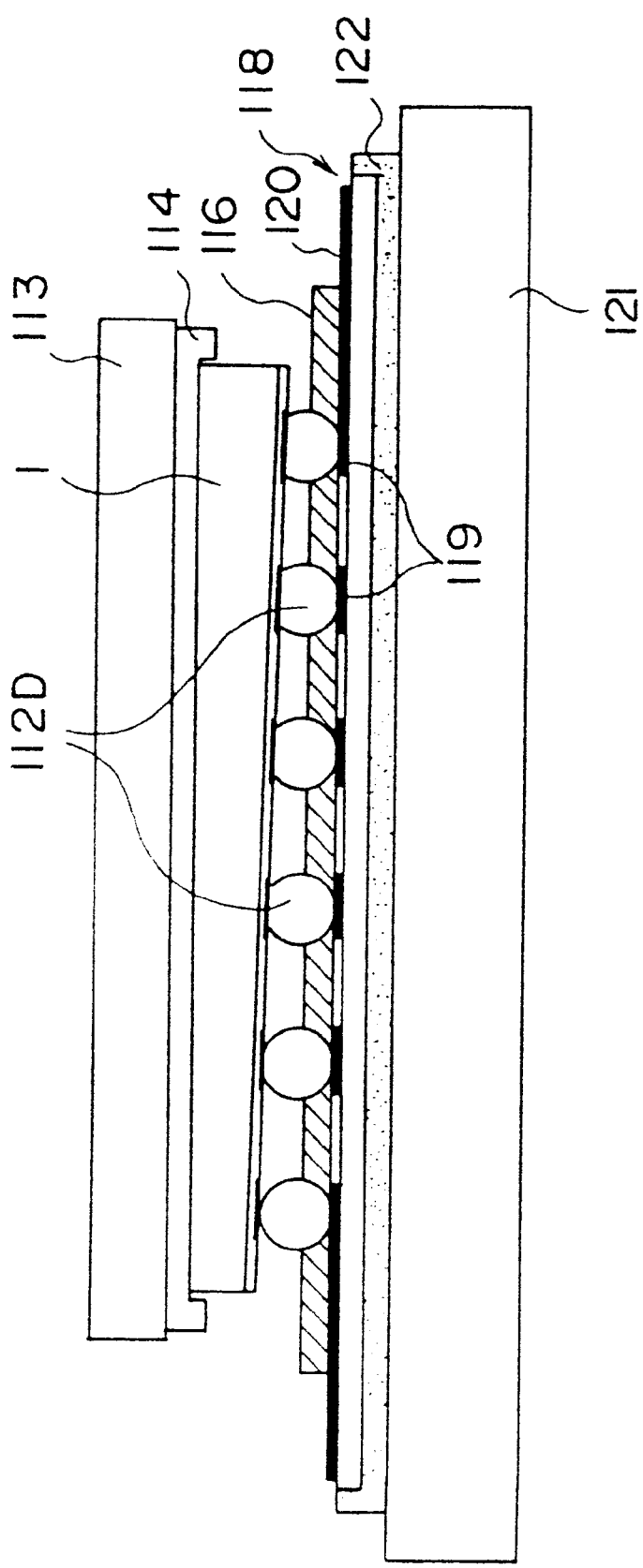

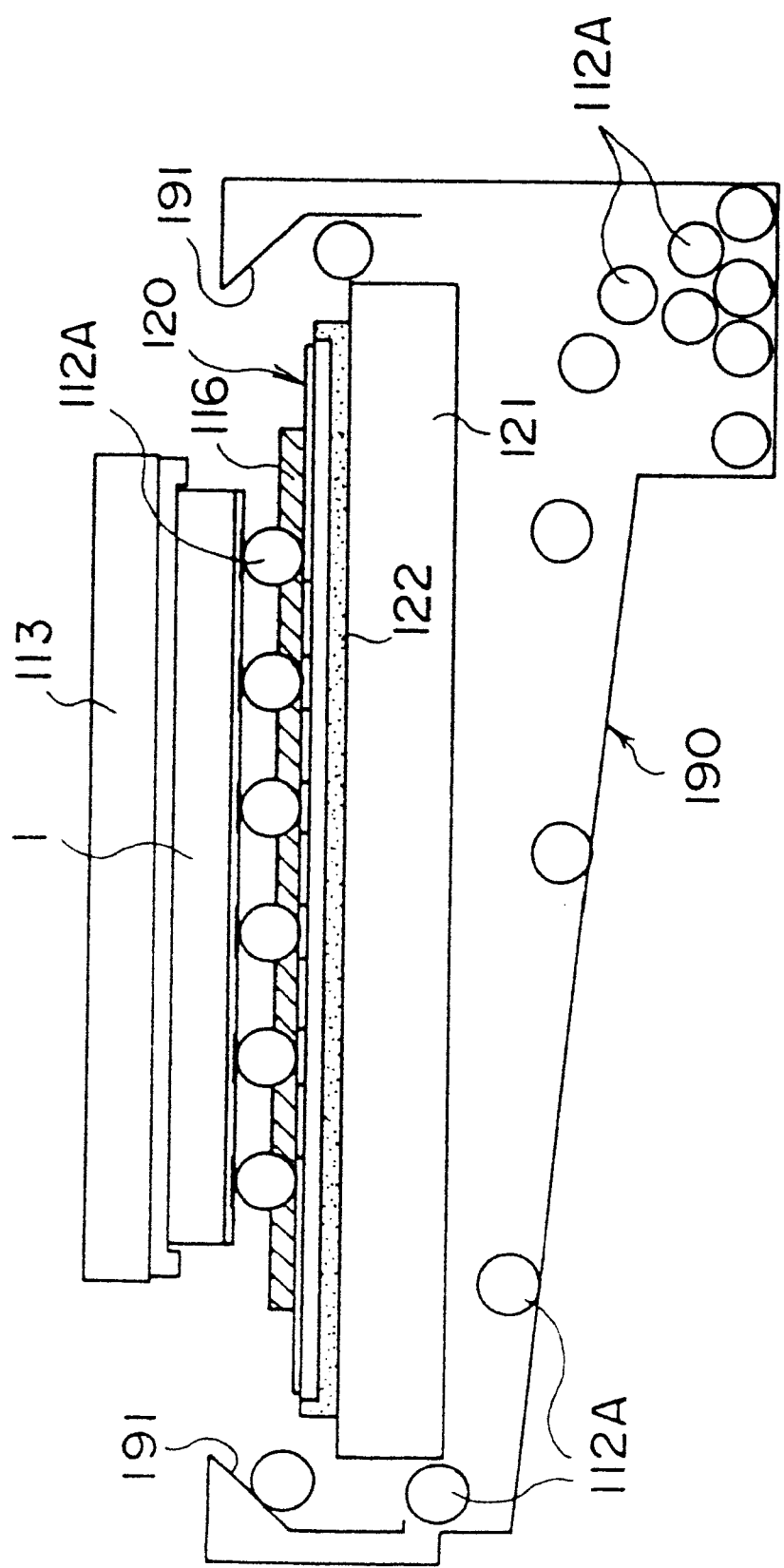

TEST METHOD USING SEMICONDUCTOR TEST APPARATUS

This application is a division of prior application Ser. No. 08/946,593, filed Oct. 7, 1997, now U.S. Pat. No. 6,333,638.

BACKGROUND OF THE INVENTION

1. Field of the Invention

The present invention generally relates to semiconductor test apparatuses and methods using the same and, more particularly, to a semiconductor test apparatus and a method using the same for testing a semiconductor chip and a semiconductor device (tested device) having plate connection terminals.

Recently, demands are mounting for high-density, high-speed and compact semiconductor devices. According to a mounting method widely used in the art in order to meet these demands, a plurality of pre-packaged semiconductor chips (so-called bare chips) or a plurality of semiconductor devices having a ball grid array (BGA) structure are mounted directly on a circuit board.

In such a mounting method, the entirety of the device would be defective if one of the plurality of bare chips or semiconductor devices is abnormal. Therefore, high reliability in each bare chip or semiconductor device is required.

Accordingly, a growing importance is being attached to a test for examining whether an individual bare chip or semiconductor device is functioning normally.

2. Description of the Related Art

Hereinafter, pre-packaged bare chips and resin-packaged semiconductor devices are inclusively referred to as semiconductor devices. Currently, various methods for testing a semiconductor device having plate connection terminals flush with a lower major surface of the device or relatively depressed therefrom have been proposed and practiced.

In testing electrical operation of such a semiconductor device, it is necessary to ensure that each of the plate connection terminals is in contact with a test probe of a test apparatus. Cares must be taken so that the plate connection terminals remain largely intact. Moreover, such a test should be reliable and should require a relatively low cost.

One of the most widely used test methods is a method using a probe. In this method, a plurality of probes are provided on a test substrate so as to correspond to a plurality of plate connection terminals formed on the lower major surface of a semiconductor device. A test is conducted by causing an end of each of the probes to be in direct contact with the corresponding plate connection terminal.

For this purpose, a semiconductor test socket having a plurality of probes provided with the same arrangement as the plurality of plate connection terminals of the semiconductor device is used. A U-shaped deflected part is provided in the probe. When the end of the probe is in contact with the plate connection terminal of the semiconductor device and pressed thereby, the deflected part is deformed so as to reduce damage to the plate connection terminal.

However, such a method of testing electrical performance of a semiconductor device has an inherent problem in that, as the number of terminals increases in the semiconductor device as a result of a high-density arrangement, it is difficult to arrange the probes in close proximity to each other. Connection between the end of the probe and the plate connection terminal may not be satisfactory, resulting in a drop in precision of the test. Also, manufacturing of a test apparatus having probes provided at close proximity to each other is difficult and requires a considerable cost.

SUMMARY OF THE INVENTION

Accordingly, an object of the present invention is to provide a semiconductor test apparatus and a test method using the same in which the aforementioned problems are eliminated.

Another and more specific object of the present invention is to provide a semiconductor test apparatus and a test method using the same in which a test on a semiconductor device having plate connection terminals is conducted in a highly reliable manner and at a relatively low cost.

The aforementioned objects can be achieved by a semiconductor test apparatus for testing a semiconductor device having plate connection terminals, comprising: a test substrate comprising a support film and a conductive layer, said support film formed of an insulating material and said conductive layer formed on said support film and having deformable connection parts connected with said plate connection terminals; and an upholding substrate having upholding parts formed to project at a position that faces said connection parts and which urges, in cooperation with said test substrate, said connection parts toward said plate connection terminals of said semiconductor device so as to electrically connect said connection parts to said plate connection terminals.

The aforementioned objects can also be achieved by a semiconductor test method for testing a semiconductor device having plate connection terminals, using a semiconductor test apparatus that comprises: a test substrate comprising a support film and a conductive layer, said support film formed of an insulating material and said conductive layer formed on said support film and having deformable connection parts connected with said plate connection terminals; and an upholding substrate having upholding parts formed to project at a position that faces said connection part and which urges, in cooperation with said test substrate, said connection parts toward said plate connection terminals of said semiconductor device so as to electrically connect said connection parts to said plate connection terminals, said semiconductor test method comprising the steps of: mounting said semiconductor device on said test substrate and assembling said test substrate to said upholding substrate; and deforming said connection parts by urging said connection parts against said upholding part as a result of said assembling, and establishing electrical connection between said connection parts and said plate connection terminals.

According to the semiconductor test apparatus and the semiconductor test method of the present invention, the connection parts formed in the test substrate are constructed to be deformable. Therefore, by combining the test substrate and the upholding substrate, the upholding part deformably urges the connection parts against the plate connection terminals of the semiconductor device. Thereby, the connection parts are projected with respect to the other parts of the test substrate.

Thus, even if the plate connection terminals formed in the semiconductor device are flush with the bottom surface of the semiconductor device or depressed from the same, electrical connection between the connection parts and the plate connection terminals is properly established since the connection parts is deformably pressed against the plate connection terminals.

The aforementioned objects can also be achieved by a semiconductor test apparatus for testing a semiconductor device having plate connection terminals, comprising: a measurement substrate havign which measurement terminals provided at positions that correspond to said plate connection terminals; an array substrate mounted on said tested substrate and having positioning depressions, for exposing said measurement terminals, provided at positions that correspond to said plate connection terminals; and connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, wherein a top of each of said connection electrodes is configured to project from said array substrate.

When a semiconductor device having plate connection terminals is mounted on the semiconductor test apparatus having the above-described construction, the connection electrodes are pressed against the plate connection terminals. Even if the plate connection terminals formed in the semiconductor device are flush with the bottom surface of the semiconductor device or depressed from the same, electrical connection between the connection electrodes and the plate connection terminals is properly established since the connection electrodes are projecting and are pressed against the plate connection terminals.

The aforementioned objects can also be achieved by a semiconductor test method for testing a semiconductor device having plate connection terminals, using a semiconductor test apparatus that comprises: a measurement substrate having measurement terminals provided at positions that correspond to said plate connection terminals; an array substrate mounted on said tested substrate and having positioning depressions, for exposing said measurement terminals, provided at positions that correspond to said plate connection terminals; and connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, wherein a top of each of said connection electrodes is configured to project from said array substrate, and wherein said semiconductor test method comprising the steps of: mounting said connection electrodes in said positioning depressions provided in said array substrate so as to position said connection electrodes; and testing said semiconductor device by electrically connecting said connection electrodes thus positioned to said plate connection terminals.

The connection electrodes are positioned using a simple process for mounting the connection electrodes in the positioning depressions formed in the array substrate. By conducting a test on the semiconductor device by maintaining the positioning and electrically connecting the connection electrodes to the plate connection terminals, the connection electrodes and the plate connection terminals are connected to each other with a high precision. Accordingly, the reliability of the test is improved.

BRIEF DESCRIPTION OF THE DRAWINGS

Other objects and further features of the present invention will be apparent from the following detailed description when read in conjunction with the accompanying drawings, in which:

FIG. 9A shows a semiconductor test apparatus according to a fourth embodiment of the present invention;

FIG. 9B shows the semiconductor test apparatus according to the fourth embodiment on an enlarged scale;

FIG. 10 shows a semiconductor test apparatus according to a fifth embodiment of the present invention;

FIG. 10B shows the semiconductor test apparatus according to the fifth embodiment on an enlarged scale;

FIGS. 21A and 21B show a semiconductor test apparatus according to a thirteenth embodiment of the present invention;

FIGS. 25A and 25B show a semiconductor test apparatus according to a seventeenth embodiment of the present invention;

FIGS. 30A and 30B show a semiconductor test apparatus according to a twenty-second embodiment of the present invention;

FIG. 31 shows a semiconductor test apparatus according to a twenty-third embodiment of the present invention;

FIG. 34 shows a semiconductor test apparatus according to a twenty-sixth embodiment of the present invention;

FIG. 40 shows a semiconductor test apparatus according to a thirty-first embodiment of the present invention;

FIG. 43 shows an array substrate on an enlarged scale;

FIG. 65 shows a semiconductor test apparatus according to a forty-second embodiment of the present invention;

FIG. 66 shows a semiconductor test apparatus according to a forty-third embodiment of the present invention;

FIGS. 67A and 67B show how a conductive resin is provided between the measurement terminal and the connection electrode;

FIGS. 68A and 68B show how the connection electrode is mounted on the array substrate using vibration;

FIGS. 71A and 71B show still another method whereby the connection electrode is secured in its position on the array substrate using suction;

FIGS. 72A and 72B show a method whereby the connection electrode is secured in its position on the array substrate using a slope;

FIG. 74 shows a construction in which the connection electrode is formed of a soft material having a low melting point;

FIG. 76 shows a construction in which a holder for preventing dispersion of the connection electrodes is provided;

DESCRIPTION OF THE PREFERRED EMBODIMENTS

Figure 1:
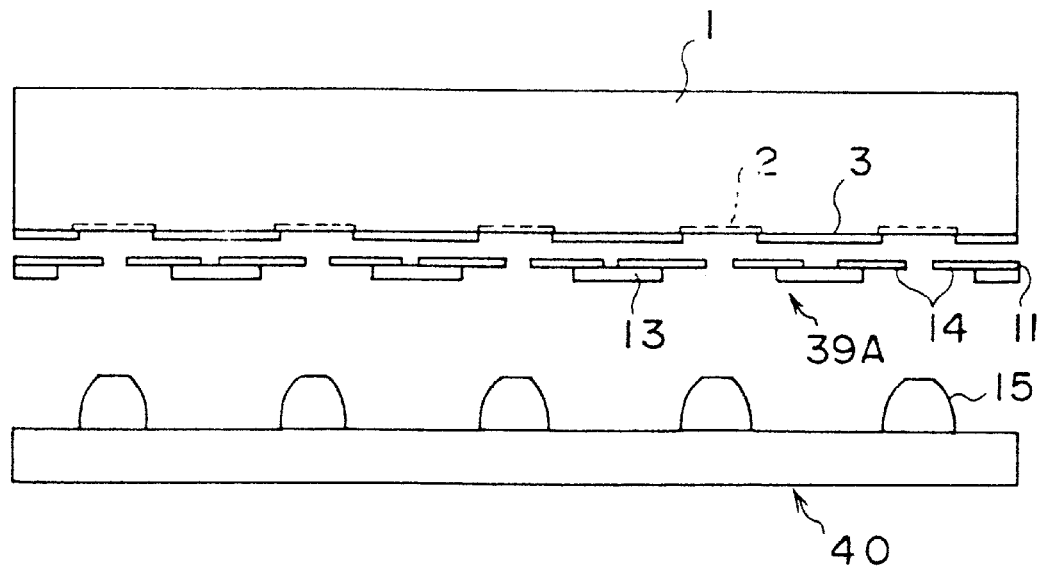
FIG. 1 shows a semiconductor test apparatus according to a first embodiment of the present invention.
Figure 2:
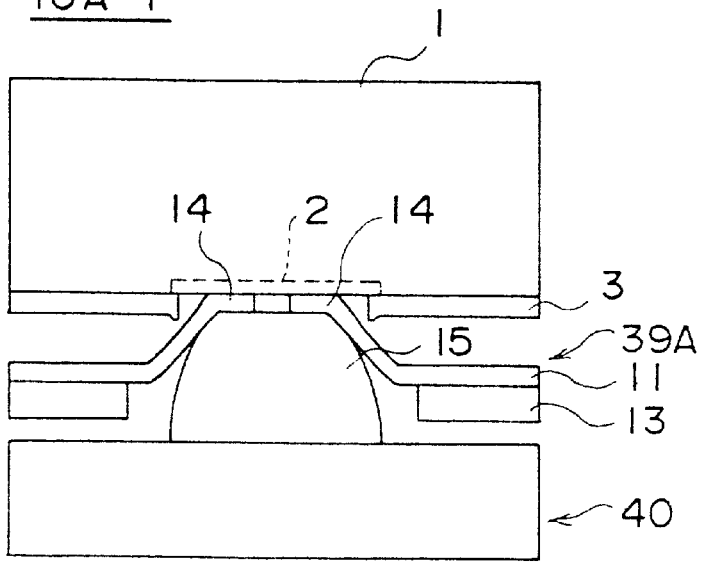
FIG. 2 shows how a connection part is connected to a plate connection terminal according to the first embodiment.

FIGS. 1 and 2 show a semiconductor test apparatus 10A-1 according to a first embodiment of the present invention and a test method using the same. The semiconductor test apparatus 10A-1 comprises a test substrate 39A and an upholding substrate 40.

A semiconductor device 1 (semiconductor device) is mounted on the semiconductor test apparatus 10A as illustrated so as to be tested for its electrical performance. The semiconductor device 1 tested by the semiconductor test apparatus 10A is provided with plate connection terminals 2 flush with the underside of the semiconductor device 1 or relatively depressed therefrom.

While the semiconductor device 1 having the plate connection terminals 2 is taken as an example of a test device, the semiconductor test apparatus according to the present invention can test a variety of devices (for example, circuit board devices) having plate connection terminals. In the semiconductor device 1 assumed in the following description, an insulating film 3 is formed on the lower major surface thereof so that the plate connection terminals 2 are depressed to a thickness of this insulating film 3.

A description will now be given of the semiconductor apparatus 10A-1.

The test substrate 39A comprises a conductive layer 11 and a support film 13. The conductive layer 11 is formed, for example, of a copper (Cu) film. The support film 13 is formed of an insulating resin material such as a polyimide. The conductive layer 11 is formed on the support film 13. The construction including the conductive layer 11 and the support film 13 is the same as the construction of a flexible printed circuit (FPC) normally used in electronic appliances. Accordingly, it is possible to use an FPC to embody the test substrate 39A.

A connection part 14 is formed in the conductive layer 11 where connection with the plate connection terminal occurs. The support film 13 adjacent to the connection part 14 is removed. The connection part 14 is formed as a projection of the conductive layer 11 like a cantilever above a space where the support film 13 is removed (see FIG. 17). Since the support film 13 is removed below the connection part 14, the connection part 14 formed as part of the conductive layer 11 is easily deformable.

The upholding substrate 40 is formed of a hard resin or the like having insulating capability. Upholding part 15 are formed on the upholding substrate 40 so that each of the upholding parts 15 is aligned with a corresponding one of the plate connection terminals 2 provided on the semiconductor device 1. Accordingly, the upholding part 15 is also aligned with the corresponding connection part 14 formed in the test substrate 39A. The upholding part 15 is a projection which projects toward the test substrate 39A. As shown in FIG. 2, when the test substrate 39A and the upholding substrate 40 are assembled to each other, the upholding part 15 presses the connection part 14 toward the plate connection terminal 2.

A description will now be given of a method of testing the semiconductor device 1 using the semiconductor test apparatus 10A-1.

In testing the semiconductor device 1, the plate connection terminals 2 provided in the semiconductor device 1, the connection parts 14 formed in the test substrate 39A and the upholding parts 15 formed in the upholding substrate 40 are properly positioned. Subsequently, the semiconductor device 1, the test substrate 39A and the upholding substrate 40 are assembled to each other.

The semiconductor device 1 may be mounted on the test substrate 39A first to form a unit and the upholding substrate 40 may be assembled to the unit subsequently. Alternatively, the test substrate 39A and the upholding substrate 40 may be assembled to each other first to form a unit and the semiconductor device 1 is mounted on the unit subsequently.

Since the connection parts 14 formed in the test substrate 39A are formed to be deformable, the upholding parts 15 are engaged with the respective connection parts 14 so as to deform and press the connection parts 14 against the corresponding plateline connection terminals 2 of the semiconductor device 1, when the test substrate 39A and the upholding substrate 40 are assembled to each other. As a result, the connection parts 14 project from the test substrate 39A.

Thus, even when the plate connection terminals 2 are formed to be flush with the lower major surface of the semiconductor device 1 or depressed therefrom, electrical connection between the connection parts 14 and the respective plate connection terminals 12 is ensured since the connection parts 14 are deformed and urged by the respective upholding parts 15 against the respective plate connection terminals 2, as shown in FIG. 2. Accordingly, high-reliability, high-precision tests are conducted on the semiconductor device 1.

The semiconductor test apparatus 10A-1 is connected to a semiconductor tester (not shown). A test for electrical performance is conducted while the semiconductor device 1 is being mounted on the semiconductor test apparatus 10A-1.

In order for the connection parts 14 to be deformed, the conductive layer 11 should be formed to be thin. However, the mechanical rigidity of the conductive layer 11 does not suffer because the conductive layer 11 is supported by the support film 13.

A description will now be given of a second embodiment of the present invention.

Figure 3:
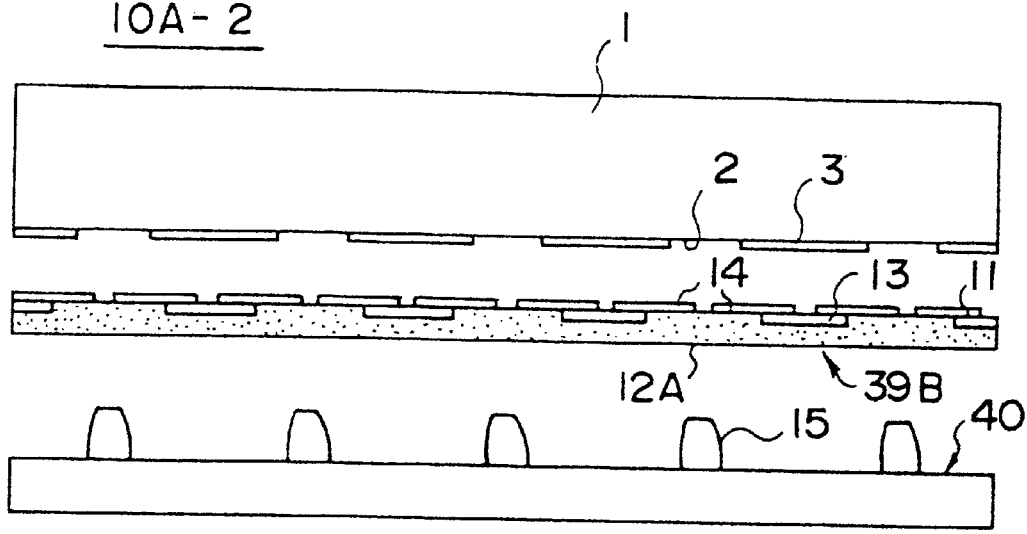
FIG. 3 shows a semiconductor test apparatus according to a second embodiment of the present invention.
Figure 4:
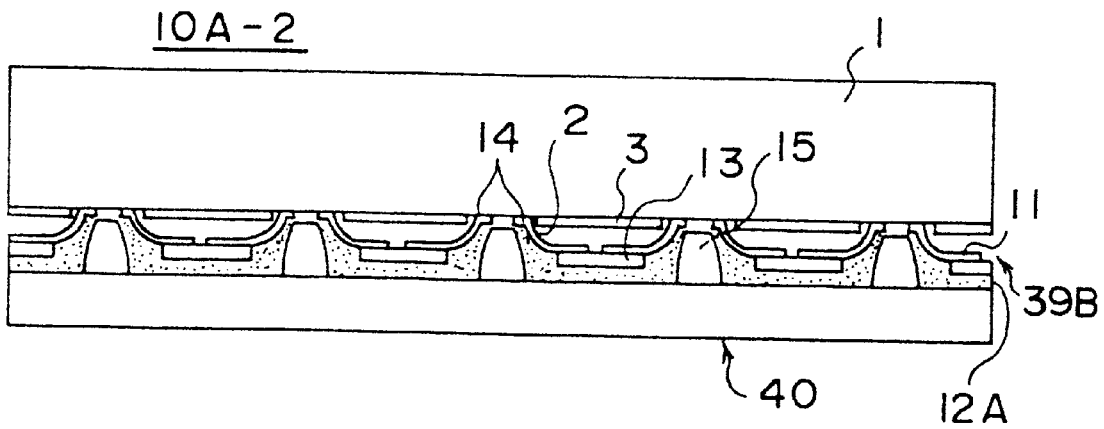
FIG. 4 shows how the connection part is connected to the plate connection terminal according to the seconds embodiment.
Figure 5:
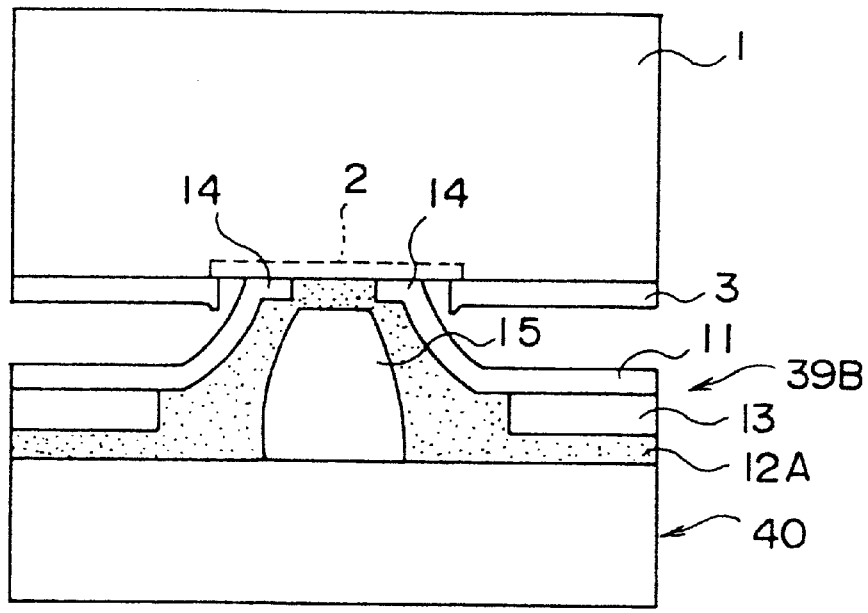
FIG. 5 shows how the connection part is connected to the plate connection terminal according to the second embodiment on an enlarged scale.

FIGS. 3 through 5 show a semiconductor test apparatus 10A-2 according to a second embodiment of the present invention. In the following description, those components that are the same as the corresponding components in the semiconductor test apparatus 10A-1 according to the first embodiment described with reference to FIGS. 1 and 2 are designated by the same reference numerals, and the description thereof is omitted.

The semiconductor test apparatus 10A-2 according to the second embodiment is constructed such that a test substrate 39B provided with a buffer member 12A is used in place of the test substrate 39A. The buffer member 12A is formed of an insulating material (for example, rubber, flexible resin or the like) having insulating capability and is provided (fixed) to the side of the support film 13 facing the upholding substrate 40, as shown in FIG. 3.

In the semiconductor test apparatus 10A-2 having the above-described construction, the upholding part 15 urges and deforms the corresponding connection part 14 via the buffer member 12A. This ensures that the upholding part 15 formed of a hard resin is not in direct contact with the corresponding connection part 14, thus reducing friction between the upholding part 15 and the connection part 14. As a result, damage is prevented from occurring in the connection part 14, ensuring a long life of the connection part 14.

By deforming the connection part 14 via the buffer member 12A, it is possible to deform the connection part 14 to a larger extent than when the connection part 14 is deformed merely by the upholding part 15. Consequently, an area of contact between the connection part 14 and the corresponding plate connection terminal 2 is increased so that proper electrical connection is established between the connection part 14 and the plate connection terminal 2.

The buffer member 12A also provides a buffer when the semiconductor device 1 is mounted on the semiconductor test apparatus 10A-2, or when an unexpected force is applied to the assembly. Thus, the buffer member 12A protects the plate connection terminals 2 and the connection parts 14.

The buffer member 12A also serves as a support for the connection parts 14. As described before, in forming the connection part 14, the support film 13 should be removed in order to improve electrical connection with the plate connection terminal 2. Merely removing the support film 13 may cause the mechanical rigidity of the connection part 14 to be reduced. By providing the buffer member 12A, the connection part 14 is supported by the buffer member 12A. Thus, the mechanical rigidity of the connection part 14 is substantially increased due to the buffer member 12A. Accordingly, it is always possible to conduct a test in a highly reliable manner.

A description will now be given of a fourth embodiment of the present invention.

Figure 6:
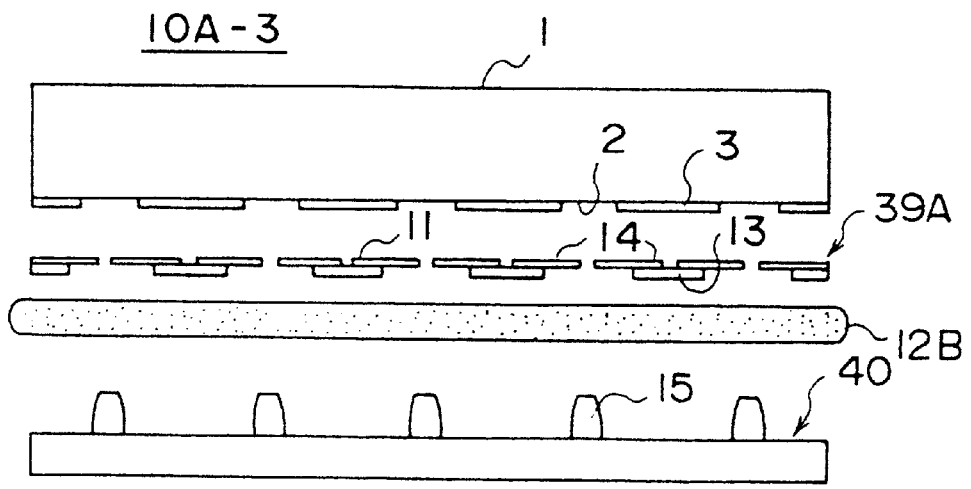
FIG. 6 shows a semiconductor test apparatus according to a third embodiment of the present invention.
Figure 7:
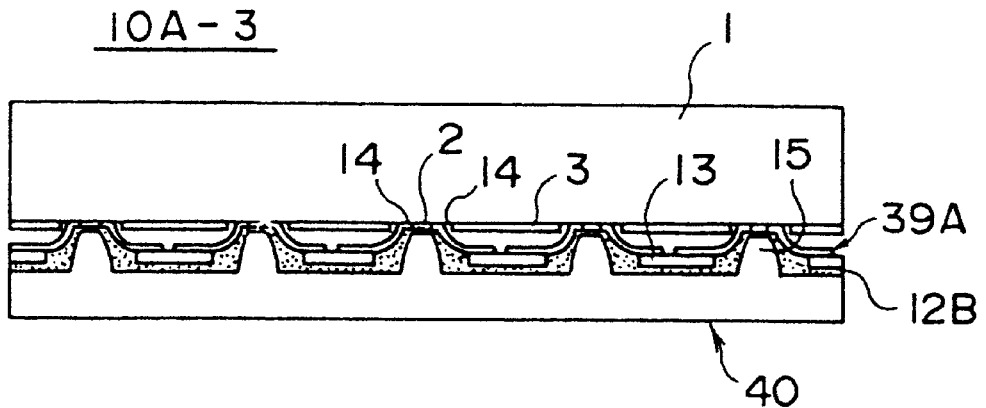
FIG. 7 shows how the connection part is connected to the plate connection terminal according to the third embodiment.
Figure 8:
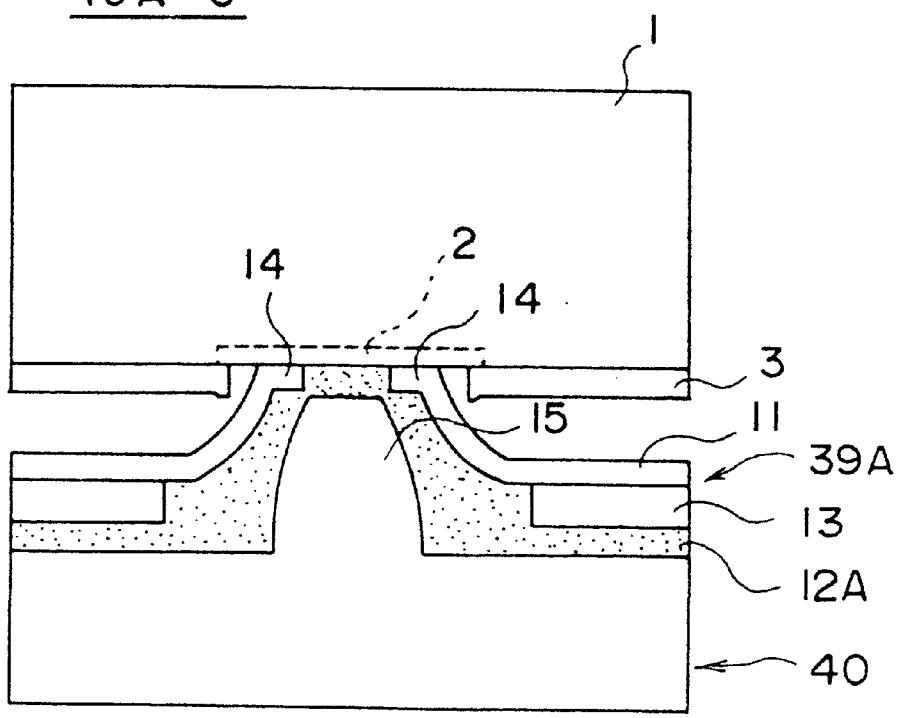
FIG. 8 shows how the connection part is connected to the plate connection terminal according to the third embodiment on an enlarged scale.

FIGS. 6–8 show a semiconductor test apparatus 10A-3 according to a third embodiment of the present invention. FIG. 6 is an exploded view of the semiconductor test apparatus 10A-3. FIGS. 7 and 8 show the semiconductor test apparatus 10A-3 in operation.

In the semiconductor test apparatus 10A-2 according to the second embodiment, the buffer member 12A is integral with the test substrate 39B. The semiconductor test apparatus 10A-3 according to the third embodiment uses the test substrate 39A of the first embodiment. In the third embodiment, a buffer member 12B separate from the test substrate 39 is used.

With this construction in which the buffer member 12B is separate from the test substrate 39A, the same effect achieved in the second embodiment is achieved. An advantage of the third embodiment is that the process for adhesively attaching the support film 13 and the buffer member 12A to each other required in the second embodiment is eliminated.

A description will now be given of a fourth embodiment of the present invention.

FIGS. 9A and 9B show a semiconductor test apparatus 10A-4 according to a fourth embodiment of the present invention. An insulating member 25 is provided on the support film 13 and the conductive layer 11 so as to face the semiconductor device 1 outside the connection parts 14.

The insulating member 25 is formed of an insulating resin or the like. As shown in FIGS. 9A and 9B, its height is controlled to touch the bottom of the semiconductor device 1 or is slightly removed therefrom while a test is being conducted. Thus, by providing the insulating member 25 on the surface of the test substrate 39B facing the semiconductor device 1, it is possible to prevent the conductive layer 11 from coming into contact with the semiconductor device 1.

Generally, the semiconductor device 1 is provided with a circuit on the (bottom) surface thereof provided with the plate-line connection terminals 2. Therefore, a malfunction may result if the bottom comes into contact with the conductive layer 11. By providing the insulating member 25 on that surface of the test substrate 39 facing the semiconductor device 1, it is ensured that the conductive layer 11 is prevented from being in contact with the semiconductor device 1. Consequently, highly reliable tests are conducted.

A description will now be given of a fifth embodiment of the present invention.

FIGS. 10A and 10B show a semiconductor test apparatus 10A-5 according to a fifth embodiment of the present invention.

In the fifth embodiment, an elastic member 26 is provided on the support film 13 and the conductive layer 11 so as to face the semiconductor device 1 outside the connection parts 14 while a test is being conducted.

The elastic member 26 is formed of a material (such as a silicone rubber) having insulating capability and elastically deformable. As shown in FIGS. 10A and 10B, its height is controlled to touch the bottom of the semiconductor device 1 while a test is being conducted.

By providing the elastic member 26 on the surface of the test substrate 39B facing the semiconductor device 1, the semiconductor device 1 is supported not only at the positions of the connection parts 14 but also supported by the elastic member 26. Accordingly, pressure applied to the connection parts 14 is distributed so that damage is prevented from occurring in the connection parts 14.

Even when an unexpected external force is applied to the semiconductor device 1, the elastic member 26, in addition to the buffer member 12A, provides a buffer to the external force so that the plate connection terminals 2 and the connection parts 14 are protected in a reliable manner.

A description will now be given of a sixth embodiment of the present invention.

Figure 11:
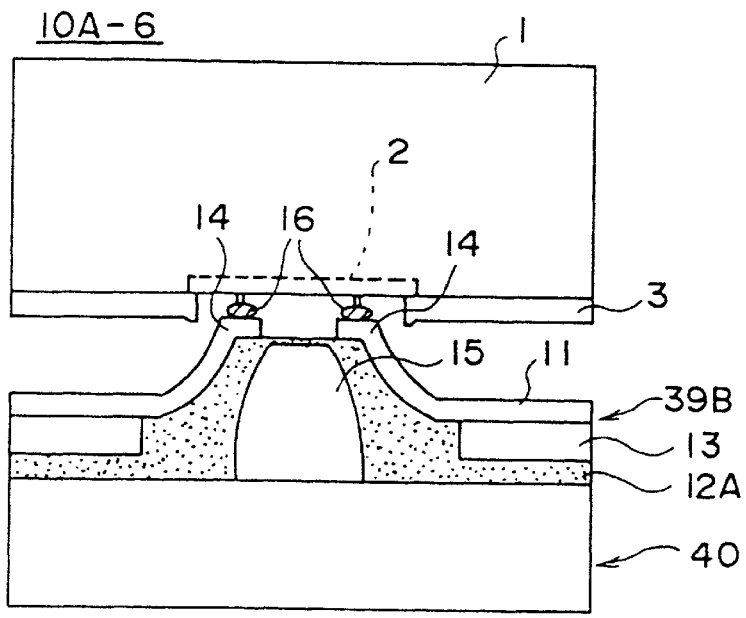
FIG. 11 shows a semiconductor test apparatus according to a sixth embodiment of the present invention.

FIG. 11 is a magnified view of the connection part 14 of a semiconductor test apparatus 10A-6 according to the sixth embodiment.

This embodiment features formation of a stud bump 16 (a projection electrode) on an end part of the connection part 14 (the part connected with the plate connection terminal 2).

For example, the stud bump 16 may be formed in a simple manner using the wire bonding method such that a so-called nail head part is formed at an end of the connection part 14 using a capillary provided in a wire bonding device and a wire is cut off after slightly raising the capillary.

By forming the stud bump 16 in this way at an end of the connection part 14, the end of the connection part 14 turns into a projecting structure. The plate connection terminal 2 is connected with the corresponding connection part 14 such that the stud bump 16 projecting from the connection part 14 is mated with the plate connection terminal 2. In this state, the stud bump 16 bites into the plate connection terminal 2. This ensures that the connection part 14 is protected and improves electrical connection between the connection part 14 and the plate connection terminal 2.

While FIG. 11 shows the stud bump 16 out of proportion so that it looks excessively large in comparison with the other components, the stud bump 16 is actually smaller in proportion than illustrated such that the plate connection terminal 2 is not damaged even if the stud bump 16 bites into the plate connection terminal 2.

By employing the wire bonding technology used to produce semiconductor devices, the stud bump 16 is efficiently formed at a low cost.

A small sharp projection usually formed at an end of the stud bump 16 as a result of wirecutting enhances electrical connection between the connection part 14 (stud bump 16) and the plate connection terminal 2.

Figure 12:
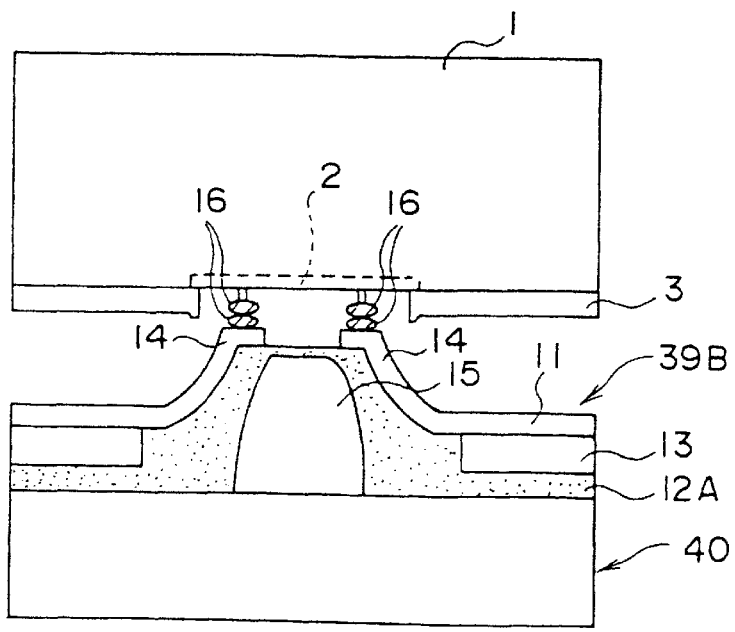
FIG. 12 shows a semiconductor test apparatus according to a first variation of the sixth embodiment.

FIG. 12 is a magnified view of the connection part 14 of the semiconductor test apparatus according to a first variation of the sixth embodiment described above. This variation features building a plurality of (in this variation, two) stud bumps 16 in layers.

As illustrated, by building a plurality of stud bumps 16 one upon another, the entire stud bumps 16 project higher from the connection part 14 than a single stud bump. The height could be controlled so as to be most suitable for the depression of the plate connection terminal 2 from the lower major surface of the semiconductor device 1, thus improving electrical connection with the plate connection terminal 2.

Figure 13:
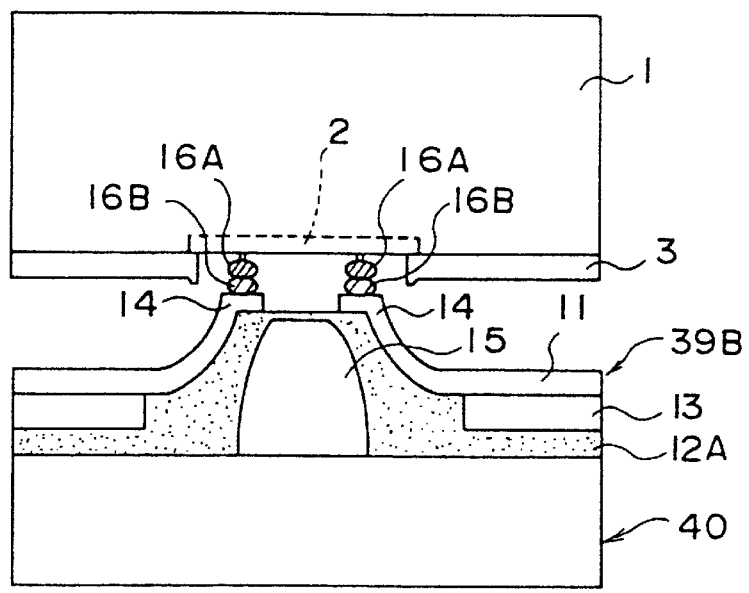
FIG. 13 shows a semiconductor test apparatus according to a second variation of the sixth embodiment.

FIG. 13 is a magnified view of the connection part 14 of the semiconductor test apparatus according to a second variation of the sixth embodiment described above. In this variation, a plurality of (in this variation, two) stud bumps 16A and 16B formed of metals of different kinds are built on the connection part 14 in multiple layers.

The stud bump 16A on top is formed of a palladium (Pd) and the stud bump 16B at the bottom is formed of a gold (Au).

The stud bump 16A on top is formed of palladium (Pd) so that it is properly mated with the plate connection terminal 2 which is usually formed of solder. The stud bump 16B at the bottom is formed of gold (Au) so as that it is properly mated with the connection part 14 which is usually formed of copper (Cu), and with the stud bump 16A on top which is formed of palladium (Pd).

An advantage of forming the plurality of stud bumps 16A and 16B of metals of different kinds is that it is possible to select a material most adapted to the plate connection terminal 2 in forming the stud bump 16A, and to select a material most adapted to the connection part 14 in forming the stud bump 16B.

Accordingly, it is possible to ensure favorable connection between the stud bump 16A and the plate connection terminal 2, between the stud bump 16B and the connection part 14 and between the stud bumps 16B in case a plurality of the stud bumps 16B are provided.

Figure 14:
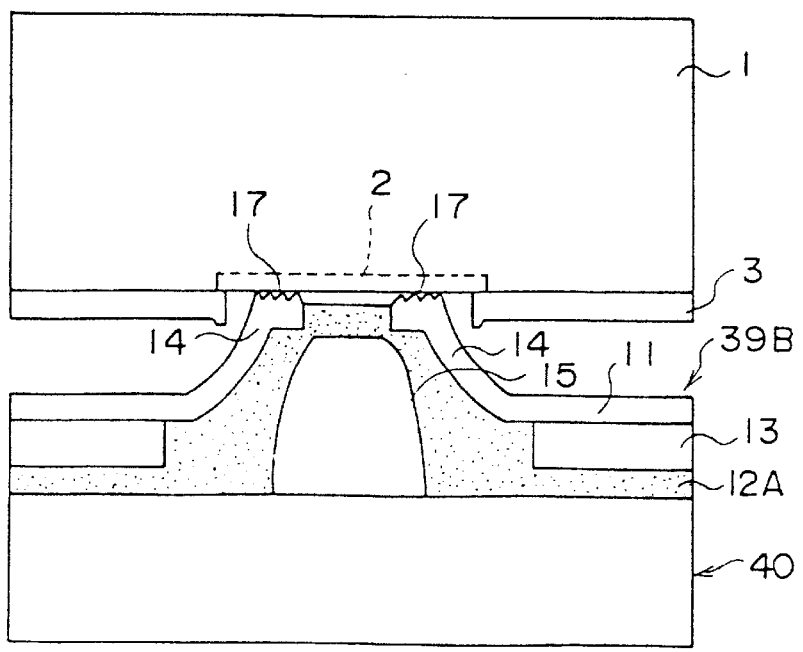
FIG. 14 shows a semiconductor test apparatus according to a third variation of the sixth embodiment.

FIG. 14 is a magnified view of the connection part 14 of the semiconductor test apparatus according to a third variation of the sixth embodiment described above. This variation features formation of a coarse surface 17 at an end of the connection part 14 (the part connected with the plate connection terminal 2).

The coarse surface 17 is formed on the surface of the connection part 14 by a blast process or a chemical process (for example, the connection part 14 is steeped in a strong acid). Since the coarse surface 17 formed in this way is such that minute unevenness exists on its surface, the effective surface area of the connection part 14 is enlarged. When the plate connection terminal 2 comes into contact with the coarse surface 17, a minute projection constituting the unevenness bites into the plate connection terminal 2. Therefore, electric connection between the connection part 14 and the plate connection terminal 2 is ensured.

Figure 15:
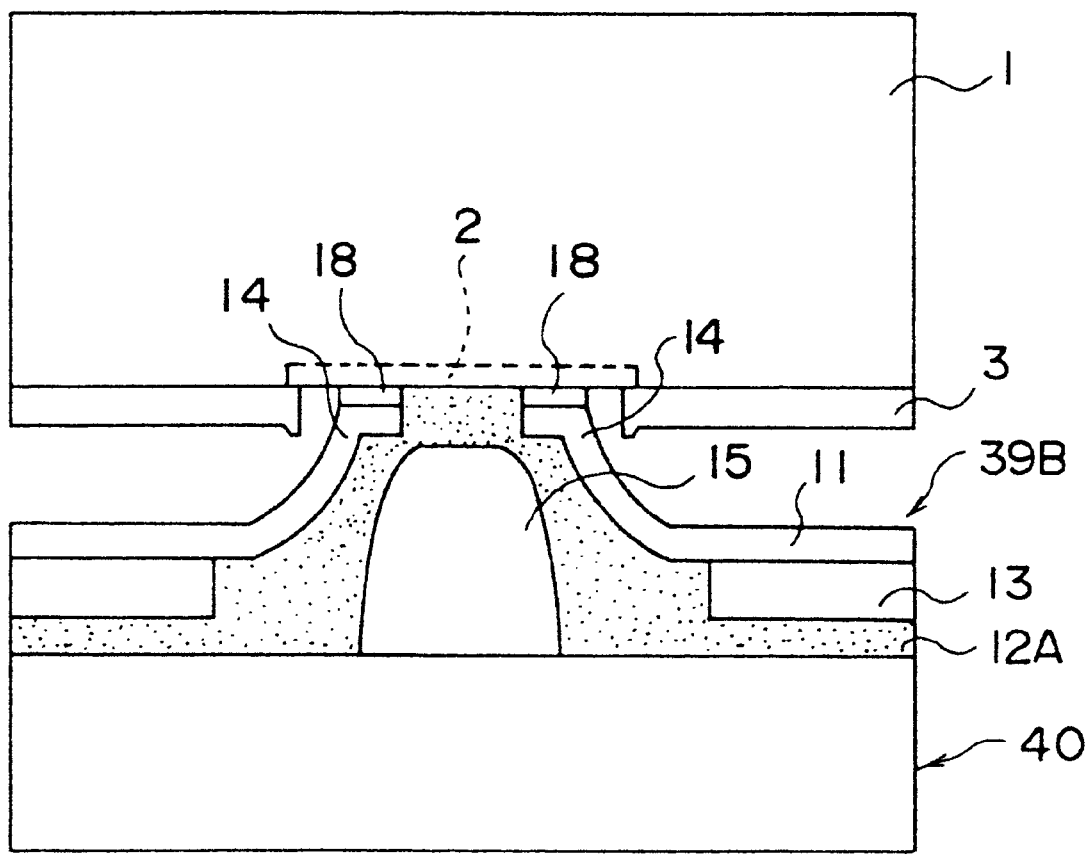
FIG. 15 shows a semiconductor test apparatus according to a fourth variation of the sixth embodiment.

FIG. 15 is a magnified view of the connection part 14 of the semiconductor test apparatus according to a fourth variation of the sixth embodiment described above. This variation features formation of a metal film 18 on the top end of the connection part 14 (the part connected with the plate connection terminal 2).

The metal film 18 is formed of a material different from the material for the connection part 14. More specifically, the connection part 14 is formed of copper (Cu), and the metal film 18 may be formed of nickel (Ni) or palladium (Pd).

Nickel (Ni) or palladium (Pd) is selected as a material for the metal film 18 because of its adaptability for both the connection part 14 (formed of copper) and the plate connection terminal 2 (usually provided with a solder gild).

In this way, by forming the metal film 18 adapted for both the connection part 14 and the plate connection terminal 2 on the surface of the connection part 14, the metal film 18 ensures proper electrical connection between the connection part 14 and the plate connection terminal 2 even if adaptability of the connection part 14 to the plate connection terminal 2 is poor. Since the surface of the connection part 14 in contact with the plate connection terminal 2 when the semiconductor device 1 is mounted is covered by the metal film 18, the connection part 14 is properly protected.

Figure 16A:
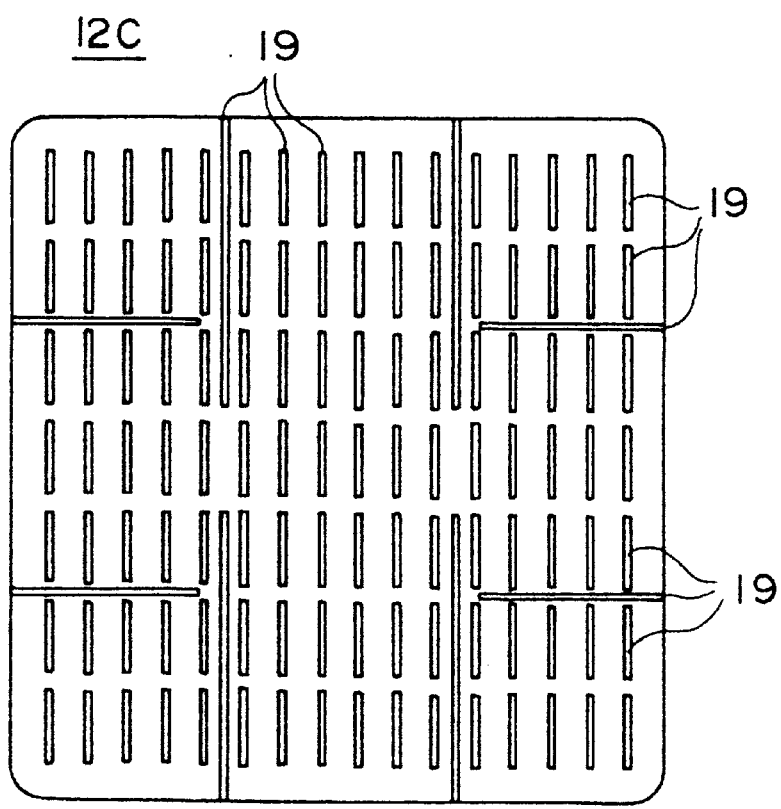
FIGS. 16A and 16B show how a buffer member is formed.
Figure 16B:
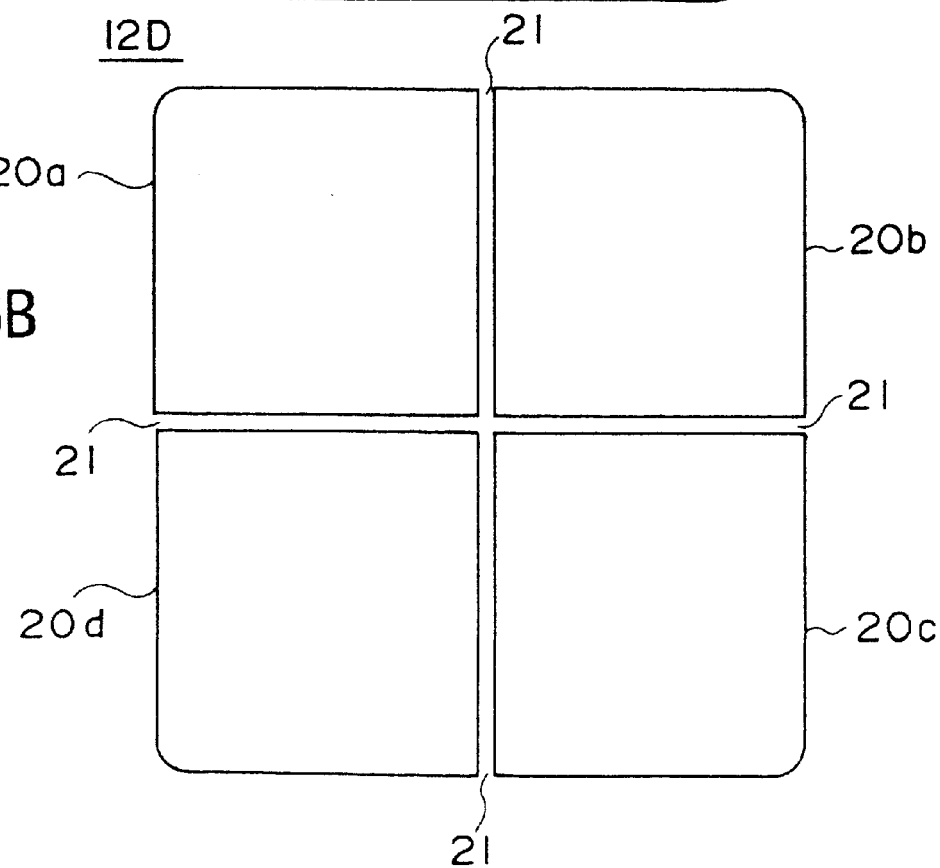

FIGS. 16A and 16B show another construction of the buffer members 12A and 12B described above.

The buffer members 12A and 12B shown in FIG. 3 and FIG. 6, respectively, are flat plate members where no ditch or cut is formed. The construction shown in FIG. 16A is characterized by a large number of cuts 19 formed in a buffer member 12C. A variation shown in FIG. 16B is characterized by a plurality of individual members 20a–20d comprising a buffer member 12D.

By forming cuts 19 in the buffer member 12C, or by forming the buffer member 12D of a plurality of (in this variation, four) individual members 20a to 20d, the elasticity of the buffer member 12C and 12D increases. In the case of the buffer member 12C, the cuts 19 extend or shrink as an external force is applied to the buffer member 12C, resulting in reduction of hardness of the buffer member 12C.

In the case of the buffer member 12D, a gap 21 is formed on the boundary of each of the individual members 20a to 20d assembled to each other. The gap 21 plays the same function as the cut 19 of the buffer member 12C. Therefore, the buffering action of the buffer members 12C and 12D increases so that the connection parts 14 are protected more reliably.

A description will now be given of seventh and eighth embodiments of the present invention.

Figure 17A:
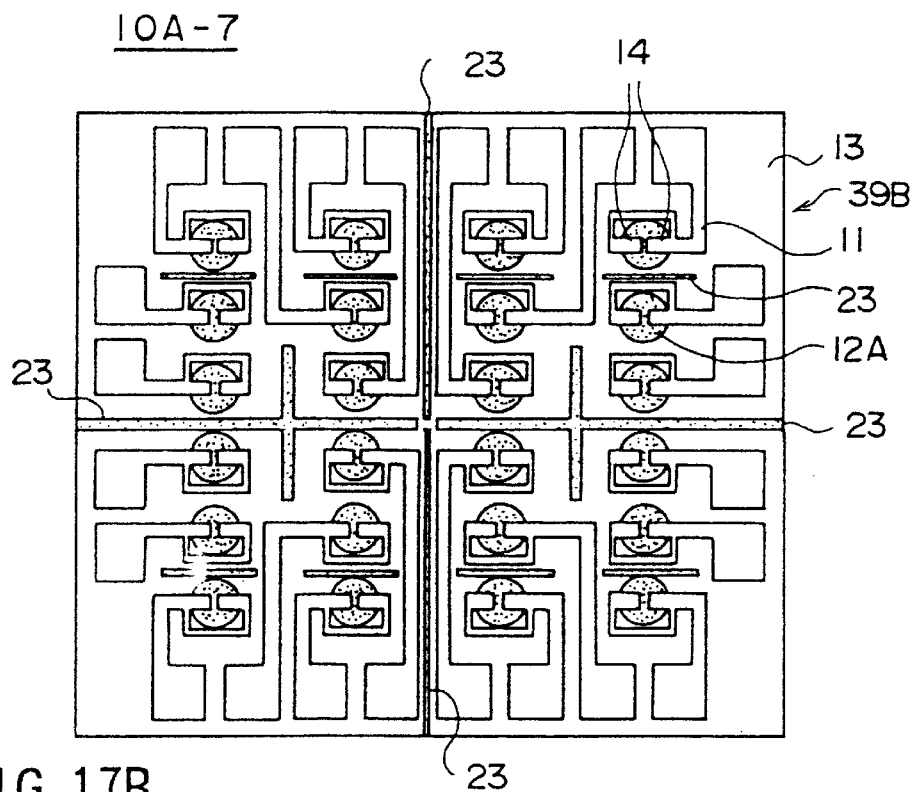
FIG. 17A is a top view of a semiconductor test apparatus according to a seventh embodiment of the present invention.
Figure 17B:
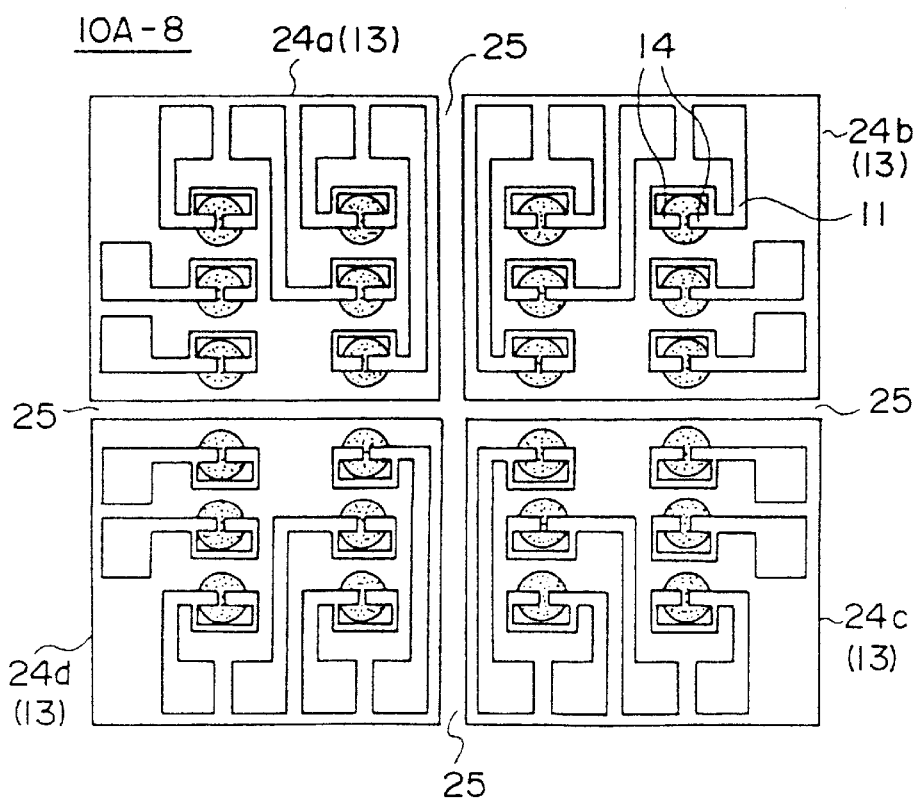
FIG. 17B is a top view of a semiconductor test apparatus according to an eighth embodiment of the present invention.

FIG. 17A is a top view of a semiconductor test apparatus 10A-7 according to a seventh embodiment of the present invention; and FIG. 17B is a top view of a semiconductor test apparatus 10A-8 according to an eighth embodiment of the present invention.

The semiconductor test apparatus 10A-7 shown in FIG. 17A features formation of cuts 23 in the support film 13. The semiconductor test apparatus 10A-8 shown in FIG. 17B features formation of the support film 13 from a plurality of (in this embodiment, four) individual film members 24a to 24d. By forming the cuts 23 in the support film 13, the support film 13 is elastic. By constructing the support film 13 of the plurality of individual film members 24a–24d, a gap 25 is formed between the individual film members 24a–24d assembled together, as shown in FIG. 17B.

Accordingly, various stresses (for example, stress occurring due to the plate connection terminal 2 pressing the connection part 14, or thermal stress occurring due to heat generation in the semiconductor device 1) occurring when the semiconductor 1 is mounted are canceled as the cuts 23 are enlarged or diminished by deformation or as the individual film members 24a to 24d move in the gap 25.

This prevents an unnecessary stress from being applied to a point of contact between the connection part 14 and the plate connection terminal 2 so that favorable connection is maintained between the connection part 14 and the plate connection terminal 2.

A description will now be given of a ninth embodiment of the present invention.

Figure 18:
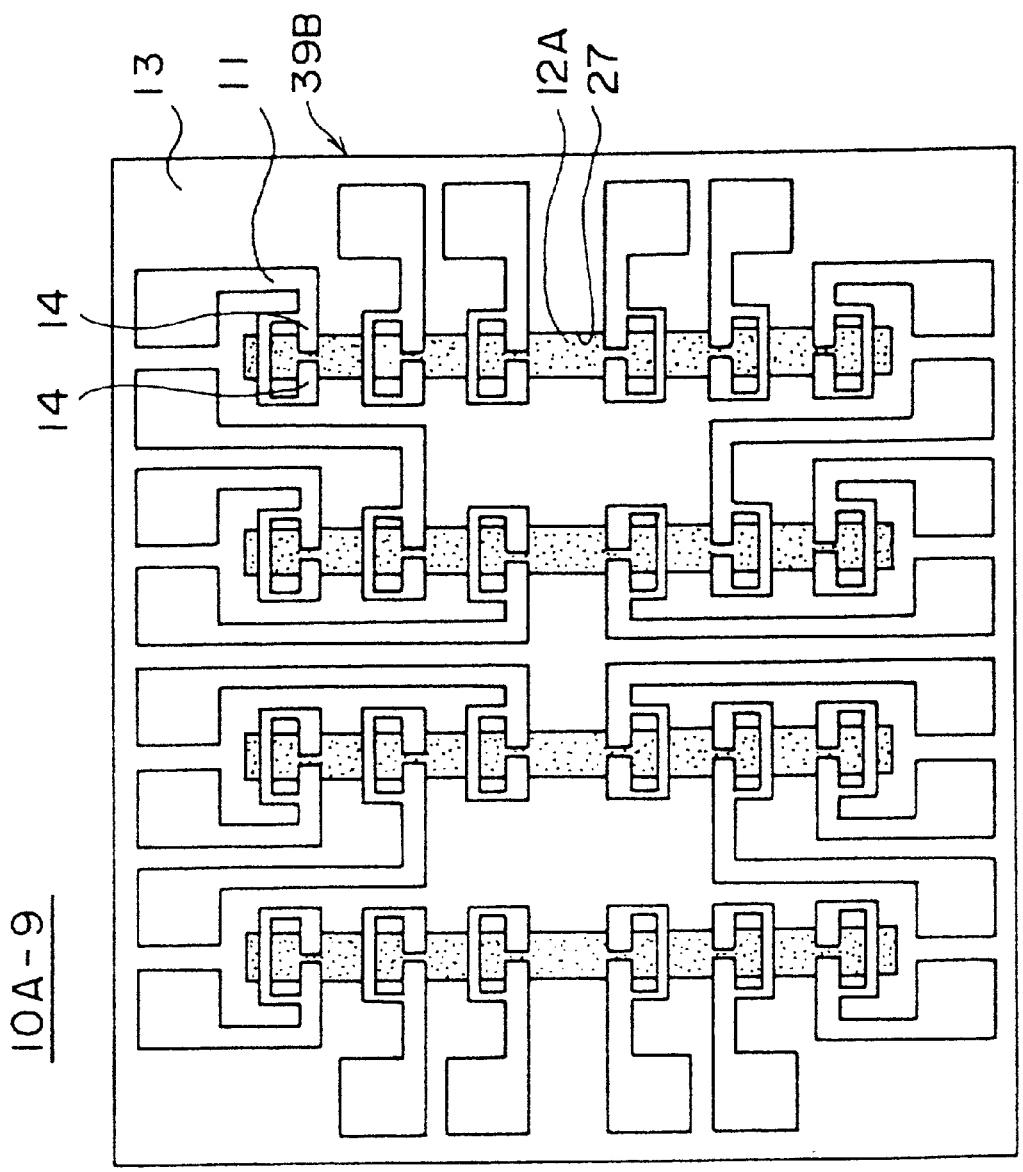
FIG. 18 is a top view of a semiconductor test apparatus according to a ninth embodiment of the present invention.

FIG. 18 is a top view of a semiconductor test apparatus 10A-9 according to the ninth embodiment of the present invention.

In contrast with the foregoing embodiments where the support film 13 is removed at each connection part 14, the semiconductor test apparatus 10A-9 according to this embodiment is constructed such that a communicating groove 27 that provides communication between the connection parts 14 is formed.

The communicating groove 27 provided between the connection parts 14 has the same function as the cuts 23 shown in FIG. 17A. Therefore, while a restriction is imposed on the arrangement of the conductor layer 11 according to the constitution of FIGS. 17A and 17B by forming the cuts 23, the construction of the ninth embodiment ensures that the support film 13 is elastic and the degree of freedom in the arrangement of the conductor layer 11 is improved.

A description will now be given of tenth through twelfth embodiments of the present invention.

Figure 19:
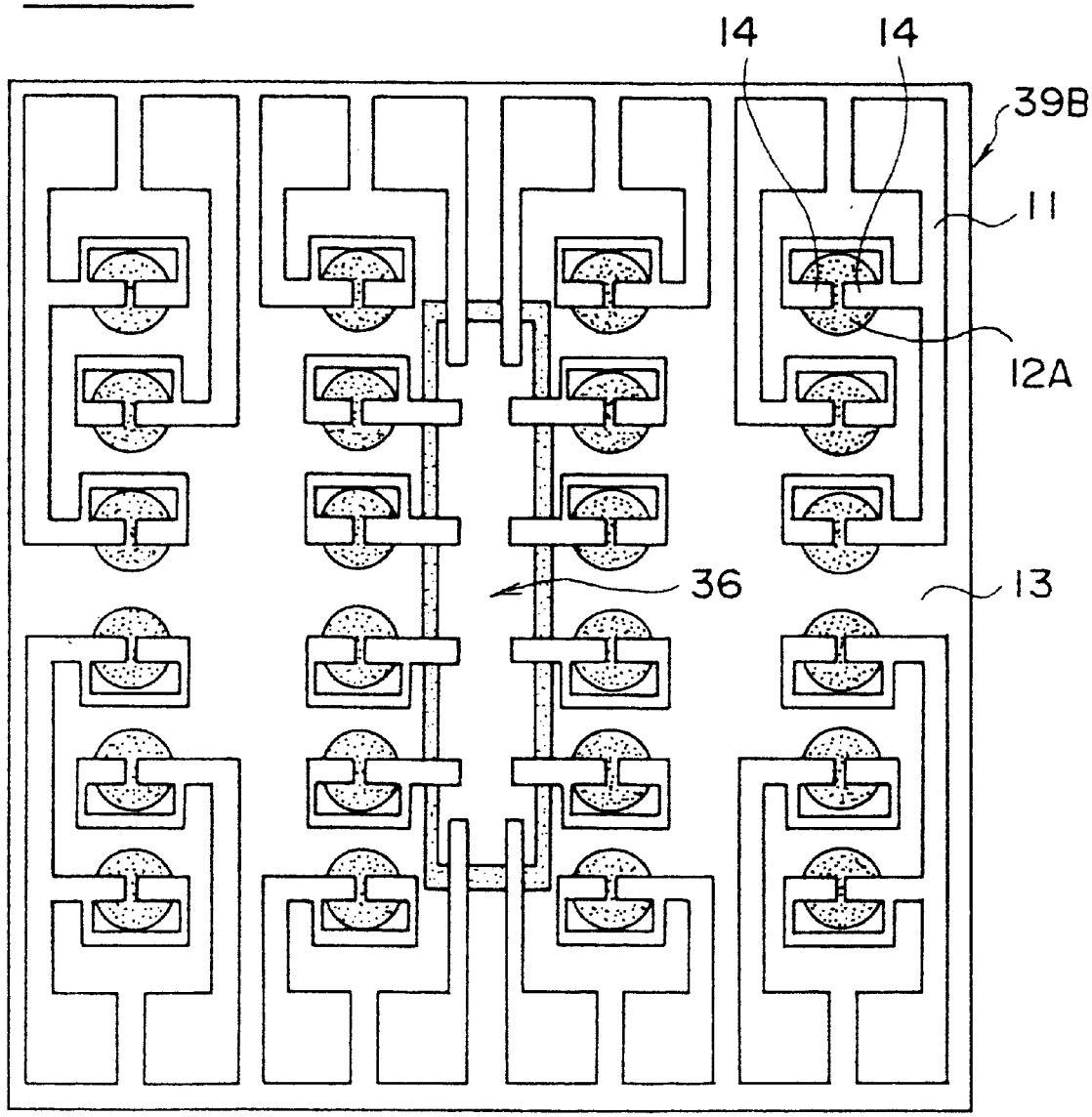
FIG. 19 is a top view of a semiconductor test apparatus according to a tenth embodiment of the present invention.
Figure 20A:
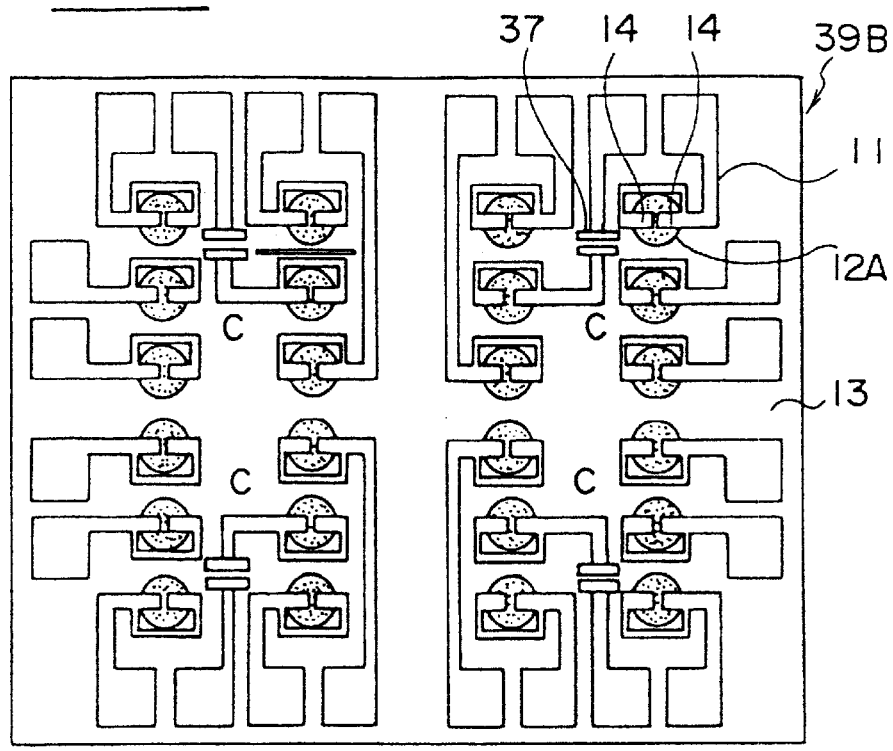
FIG. 20A is a top view of a semiconductor test apparatus according to an eleventh embodiment of thee present invention.
Figure 20B:
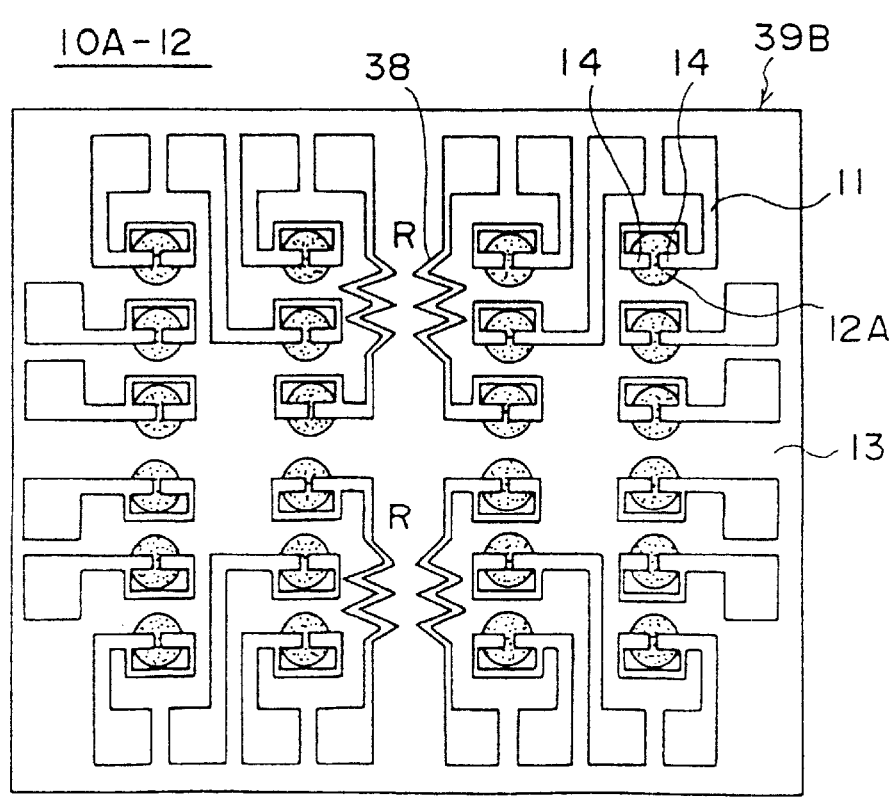
FIG. 20B is a top view of a semiconductor test apparatus according to a twelfth embodiment of the present invention.

FIG. 19 is a top view of a semiconductor test apparatus 10A-10 according to the tenth embodiment of the present invention; FIG. 20A is a top view of a semiconductor test apparatus 10A-11 according to the eleventh embodiment of the present invention; and FIG. 20B is a top view of a semiconductor test apparatus 10A-12 according to the twelfth embodiment of the present invention.

The semiconductor test apparatuses 10A-10–10A-12 according to the tenth through twelfth embodiments, respectively, are constructed such that electronic components 36–38 connected to the conductor layer 11 are provided on top of the test substrate 39B.

The semiconductor test apparatus 10A-10 shown in FIG. 19 is constructed such that a semiconductor device (IC) 36 is provided on top of the substrate 39B so as to be electrically connected to the conductive layer 11. The semiconductor test apparatus 10A-11 shown in FIG. 20A is constructed such that a capacitor 37 is provided on top of the test substrate 39B so as to be electrically connected to the conductor layer 11. The semiconductor test apparatus 10A-12 shown in FIG. 20B is constructed such that a resistance 38 is provided on top of the test substrate 39B so as to be electrically connected to the conductor layer 11.

As described above, inductance matching or impedance matching is effected easily by providing the test substrate 39B with the electronic components 36–38. Errors in precision of a test originating in the semiconductor test apparatus 10A-10–10A-12 are prevented. Thus, high-precision semiconductor tests are performed.

By providing the semiconductor test apparatus 10A-10 with the IC 36 functioning as an active element, part or the entirety of semiconductor test process may be performed with the semiconductor test apparatus 10A-10, reducing a test load on a semiconductor tester.

A description will now be given of thirteenth through thirtieth embodiments of the present invention.

In the semiconductor test apparatuses 10A-1–10A-12 according to the embodiments described above, a test is conducted by pressing the plate connection terminals 2 provided in the semiconductor device 1 against the respective connection parts 14 provided in the semiconductor test apparatuses 10A-1–10A-12. Accordingly, the semiconductor device 1 is not tested precisely if the plate connection terminal 2 and the connection part 14 are not precisely positioned.

The embodiments described below feature provision for a positioning mechanism for positioning the semiconductor device 1 (the plate connection terminal 2) with respect to the connection parts 14. Each of the embodiments will be explained as follows.

First of all, a construction using guide pins as a positioning mechanism will be explained with reference to FIGS. 21–31. It is desirable that the guide pins used in each of the following embodiments have insulating capability and are formed of a material which has a low thermal expansion coefficient.

A semiconductor test apparatus 10A-13 according to the thirteenth embodiment shown in FIGS. 21A and 21B is constructed such that guide pins 50-1 are provided to extend from the top of the test substrate 39B. The guide pins 50-1 are positioned to correspond to the periphery of the semiconductor device 1 mounted properly on the semiconductor test apparatus 10A-13.

Therefore, by mounting the semiconductor device 1 on the semiconductor test apparatus 10A-13 as the guide pins 50-1 guide the semiconductor device 1, the plate connection terminals 2 and the connection part 14 are properly positioned with respect to each other. A tapered part 51 is formed at an end of the guide pins 50-1 so as to facilitate mounting of the semiconductor device 1.

Figure 22A:
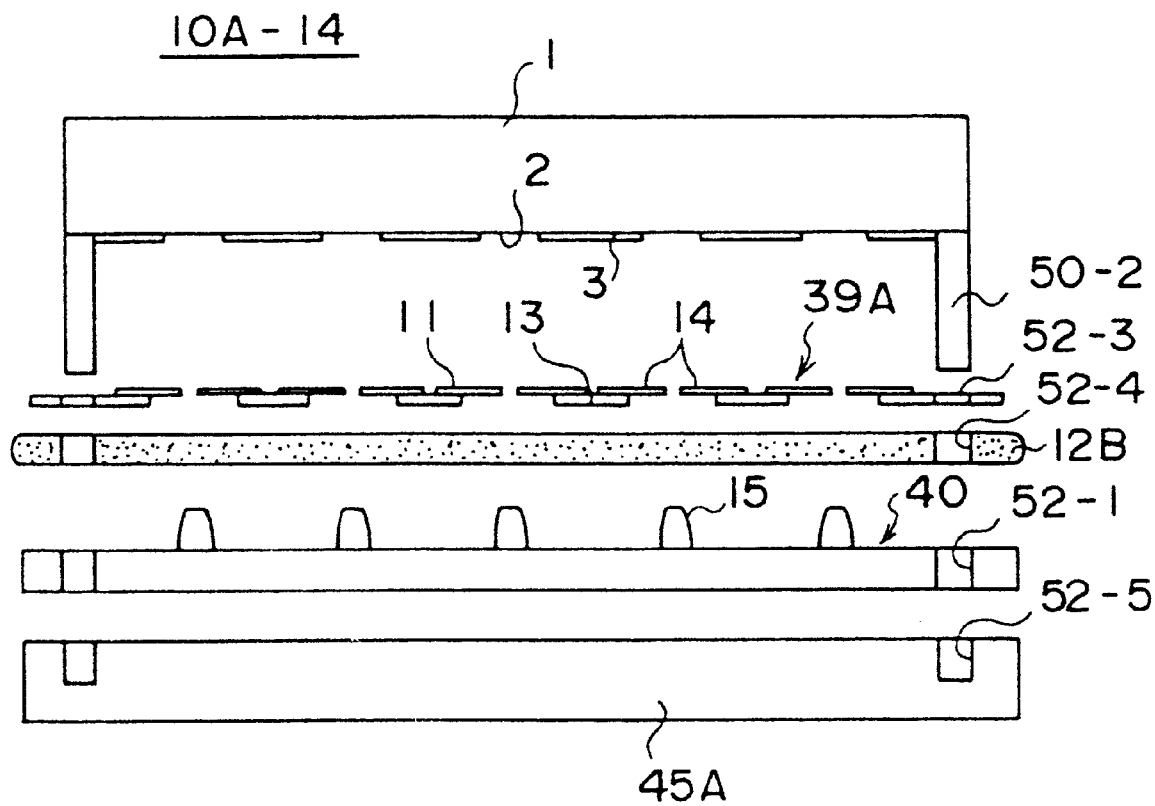
FIGS. 22A and 22B show a semiconductor test apparatus according to a fourteenth embodiment of the present invention.
Figure 22B:
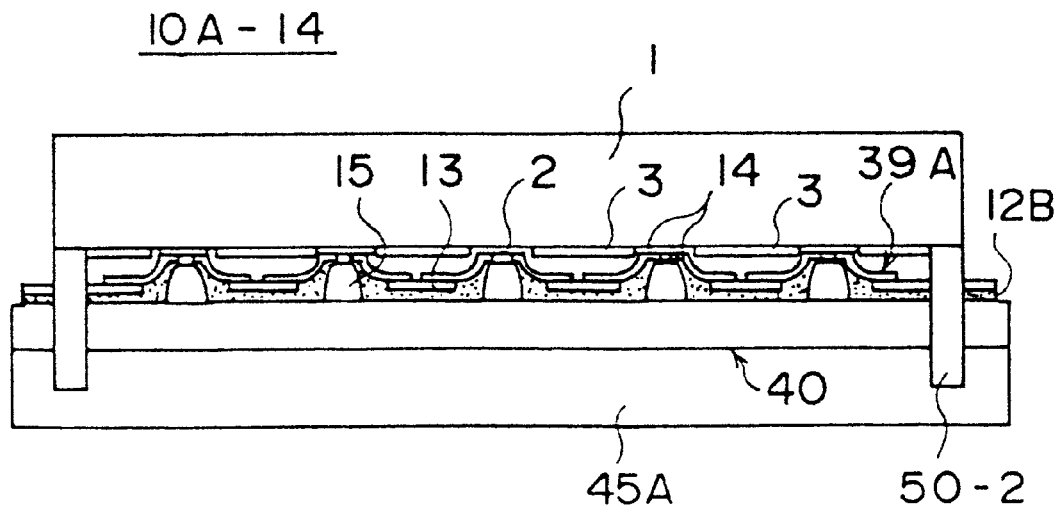

In a semiconductor test apparatus 10A-14 according to the fourteenth embodiment shown in FIGS. 22A and 22B, the semiconductor device 1 provided with guide pins 50-2 is subject to a test. As shown in FIG. 22A, positioning holes 52-3, 52-4 and 52-1 in which the guide pins 50-2 are positioned are formed in the test substrate 39A, the buffer member 12B and the upholding base 40, respectively. In this embodiment, a stage 45A is provided below the upholding substrate 40, and positioning holes 52-5 in which the guide pins 50-2 are positioned are formed in the stage 45A.

As shown in FIG. 22B, positioning of the plate connection terminals 2 and the connection parts 14 with respect to each other and positioning of the connection parts 14 and the upholding parts 15 with respect to each other is performed by inserting the guide pins 50-2 provided in the semiconductor device 1 in the positioning holes 52-3, 52-4, 52-1 and 52-5 provided in the test substrate 39A, the buffer member 12B, the upholding substrate 40 and the stage 45A, respectively.

Figure 23A:
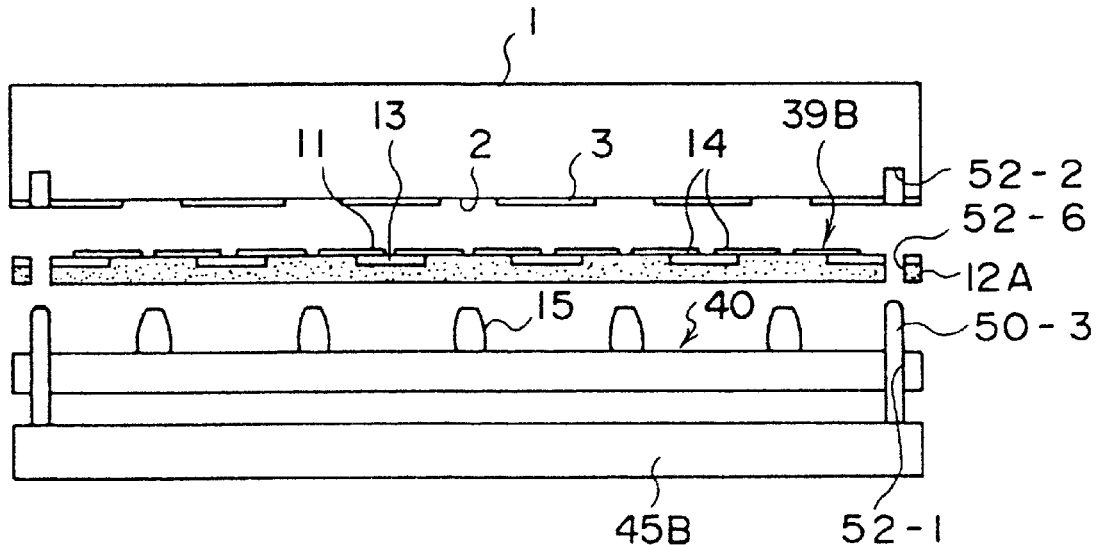
FIGS. 23A and 23B show a semiconductor test apparatus according to a fifteenth embodiment of the present invention.

As shown in FIG. 23A, a semiconductor test apparatus 10A-15 according to the fifteenth embodiment is constructed such that positioning holes 52-2 are formed in the semiconductor device 1, and guide pins 50-3 are formed to stand on a stage 45B. Positioning holes 52-1 and 52-6 are formed in the upholding substrate 40 and the test substrate 39B, respectively.

Figure 23B:
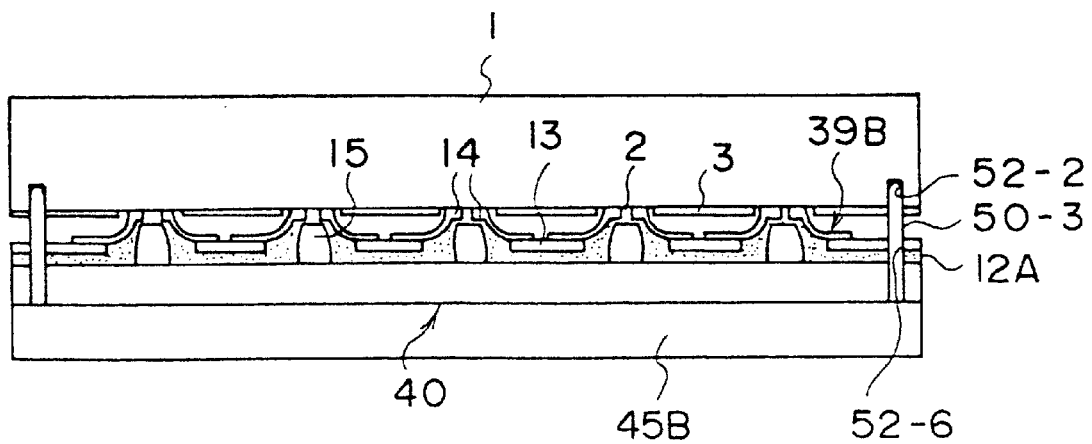

In this construction, as shown in FIG. 23B, positioning of the plate connection terminals 2 and the connection parts 14 with respect to each other and positioning of the connection parts 14 and the upholding parts 15 with respect to each other is effected by inserting the guide pins 50-3 of the stage 45B through the positioning holes 52-1 and 52-6 formed in the upholding substrate 40 and the test substrate 39B, respectively, and by inserting the guide pins 50-3 in the respective positioning holes 52-2 formed in the semiconductor device 1.

Figure 24A:
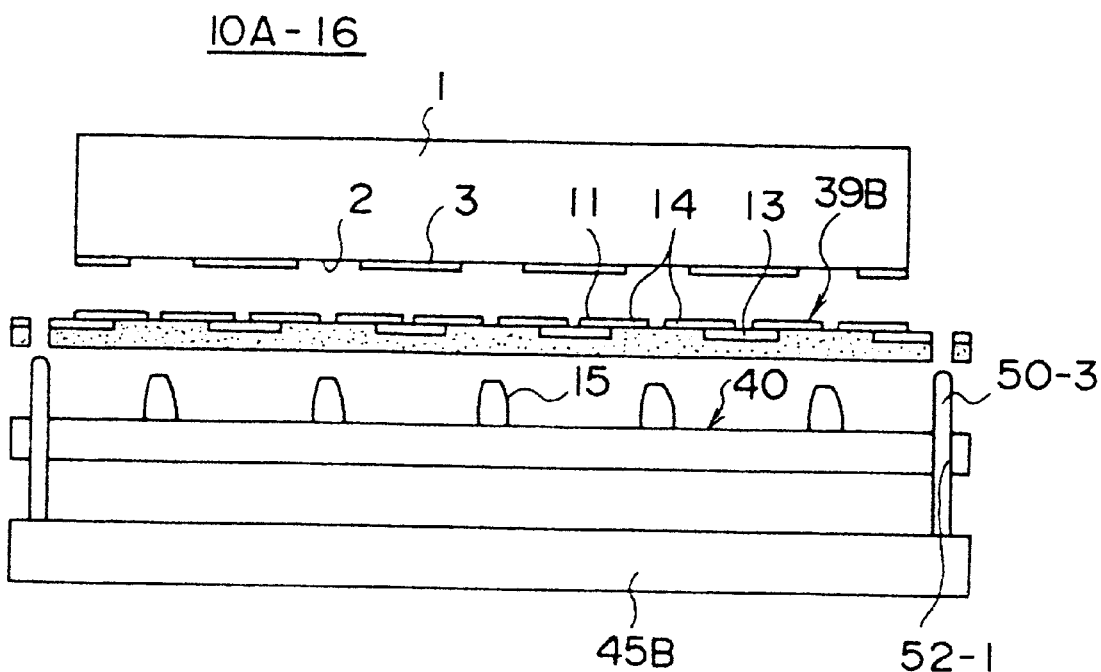
FIGS. 24A and 24B show a semiconductor test apparatus according to a sixteenth embodiment of the present invention.

As shown in FIG. 24A, a semiconductor test apparatus 10A-16 according to the sixteenth embodiment is constructed such that the guide pins 50-3 are provided to extend from the stage 45B and forming of the positioning holes in the semiconductor device 1 is omitted. Only the positioning holes 52-1 and 52-6 are formed in the upholding substrate 40 and the test substrate 39B, respectively.

Figure 24B:
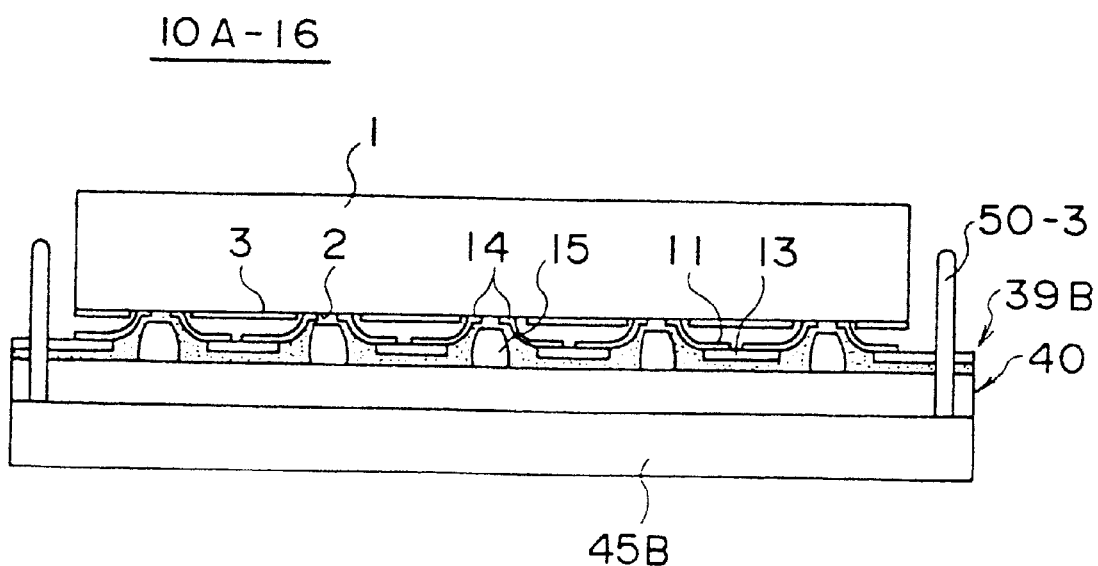

In this construction, as shown in FIG. 24B, positioning of the connection parts 14 and the upholding parts 15 with respect to each other is performed such that the guide pins 50-3 provided to extend from the stage 45B are inserted through the positioning holes 52-1 and 52-6. The positioning holes are not formed in the semiconductor device 1 because a space in which the positioning holes are formed in the fifteenth embodiment is not available due to the high-density constitution of the semiconductor device 1. Positioning of the semiconductor device 1 with respect to the test substrate 39B may be performed using a positioning jig.

In a semiconductor test apparatus 10A-17 according to the seventeenth embodiment shown in FIG. 25, guide pins 50-4 are used in order to position the test substrate 39A, the buffer member 12B and the upholding substrate 40. For this purpose, as shown in FIG. 25A, the positioning holes 52-3 are formed at predetermined positions in the test substrate 39A, the positioning holes 52-4 are formed at predetermined positions in the buffer member 12B, and positioning holes 52-7 are formed at predetermined positions in the upholding substrate 40.

As shown in FIG. 25B, the guide pins 50-4 are inserted through the positioning holes 52-3, 52-4 and 52-7. With this, the positions of the test substrate 39, the buffer member 12D and the upholding substrate 40 are defined by the guide pins 50-4 so that the connection parts 14 are positioned with respect to the respective upholding parts 15. In this way, it is important that the test substrate 39, the buffer member 12D and the upholding substrate 40 are positioned with respect to each other for a high-precision test of the semiconductor device 1.

Figure 26:
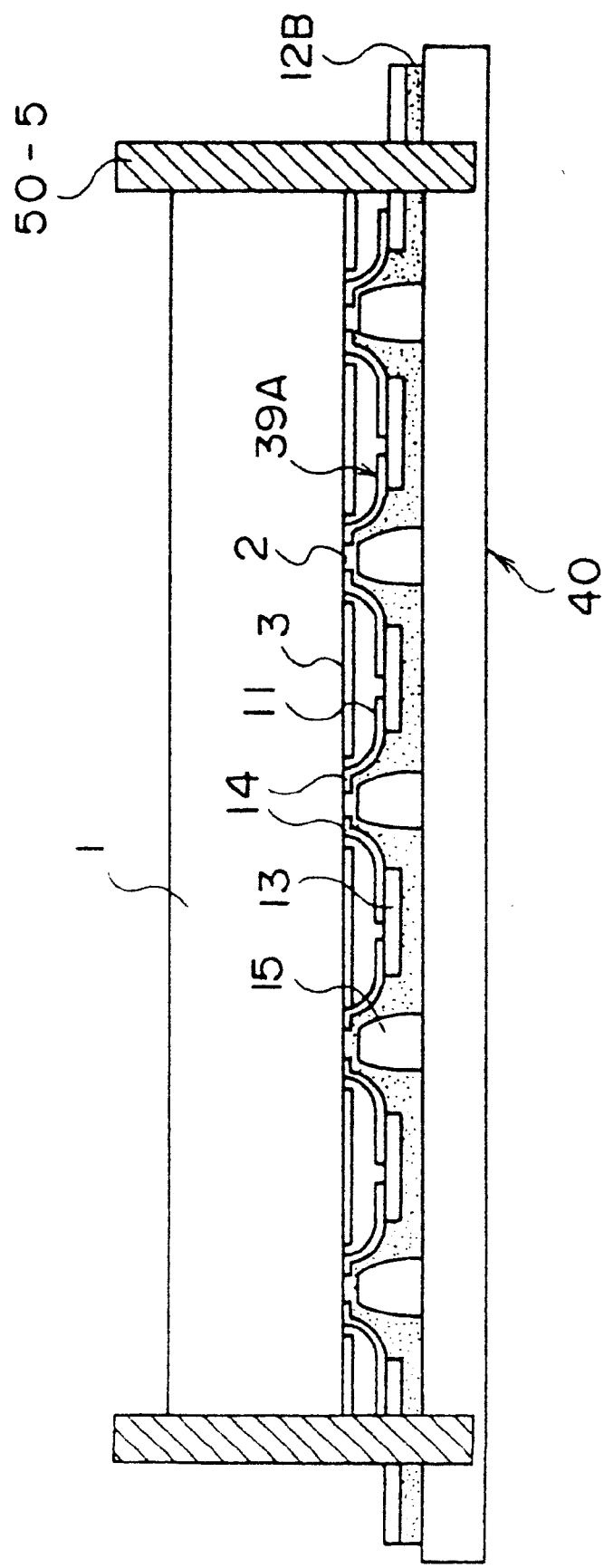
FIG. 26 shows a semiconductor test apparatus according to an eighteenth embodiment of the present invention.

As in the seventeenth embodiment described above, a semiconductor test apparatus 10A-18 according to the eighteenth embodiment shown in FIG. 26 uses guide pins 50-5 in order to position the test substrate 39A, the buffer member 12B and the upholding substrate 40. The semiconductor test apparatus 10A-18 is constructed such that the guide pins 50-5 also function as guide members for guiding the semiconductor device 1.

More specifically, the inner lateral surface of the guide pins 50-5 touches the semiconductor device 1 when the guide pins 50-5 are inserted through the test substrate 39 A, the buffer member 12B and the upholding substrate 40.

Positioning of the plate connection terminals 2 and the connection parts 14 with respect to each other as well as positioning of the connection parts 14 with respect to the upholding parts 15 is effected by mounting the semiconductor device 1 on the semiconductor test apparatus 10A-18 such that the semiconductor device 1 is guided by the guide pins 50-5 inserted through the test substrate 39 A, the buffer member 12B and the upholding substrate 40.

Figure 27A:
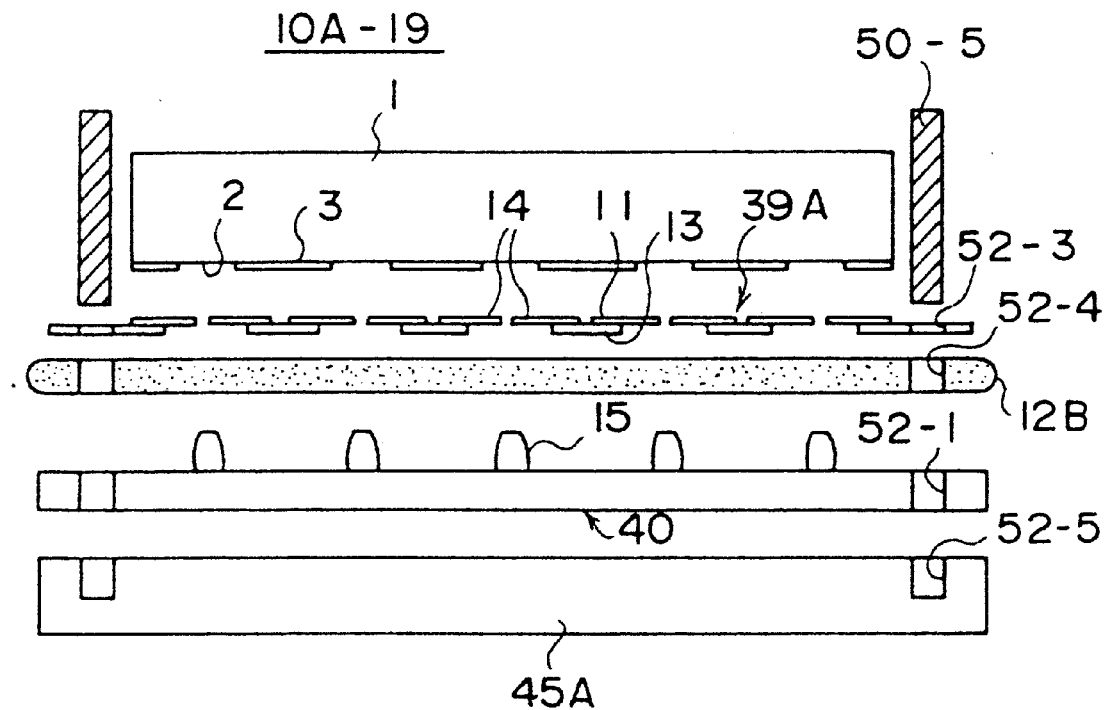
FIGS. 27A and 27B show a semiconductor test apparatus according to a nineteenth embodiment of the present invention.

A semiconductor test apparatus 10A-19 according to the nineteenth embodiment shown in FIGS. 27A and 27B features addition of the stage 45A to the semiconductor test apparatus 10A-17 according to the seventeenth embodiment described with reference to FIGS. 25A and 25B. The stage 45A is provided with the positioning holes 52-5 in which the respective guide pins 50-5 are inserted.

Figure 27B:
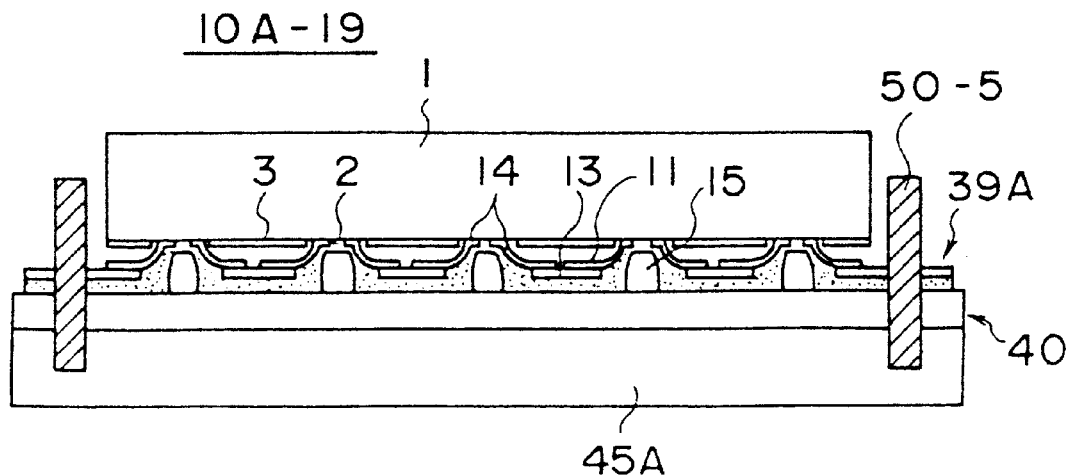

As shown in FIG. 27B, positioning according to the nineteenth embodiment is performed such that the guide pins 50-5 through the positioning holes 52-1, 52-3 and 52-4 are inserted in the positioning holes 52-5 formed in the stage 45A. With this construction, the positions of the test substrate 39, the buffer member 12D, the upholding substrate 40 and the stage 45A are defined by the guide pins 50-5 so that the connection parts 14 and the upholding parts 15 are properly positioned with respect to each other.

Since the stage 45A does not play a direct role in testing the semiconductor device 1, the thickness and size thereof can be determined as desired. Therefore, the depth of the positioning holes 52-5 may be established as desired so as to prevent play of the guide pins 50-5 inserted in the positioning holes-52-5. Accordingly, precision in positioning the connection parts 14 and the upholding parts 15 with respect to each other is improved.

Figure 28A:
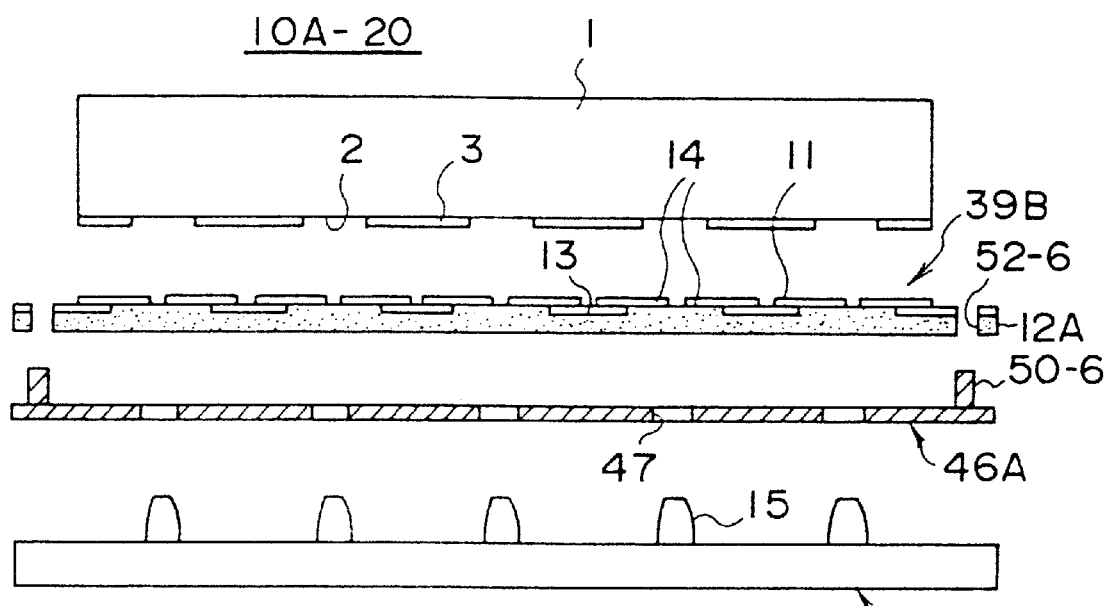
FIGS. 28A and 28B show a semiconductor test apparatus according to a twentieth embodiment of the present invention.
Figure 28B:
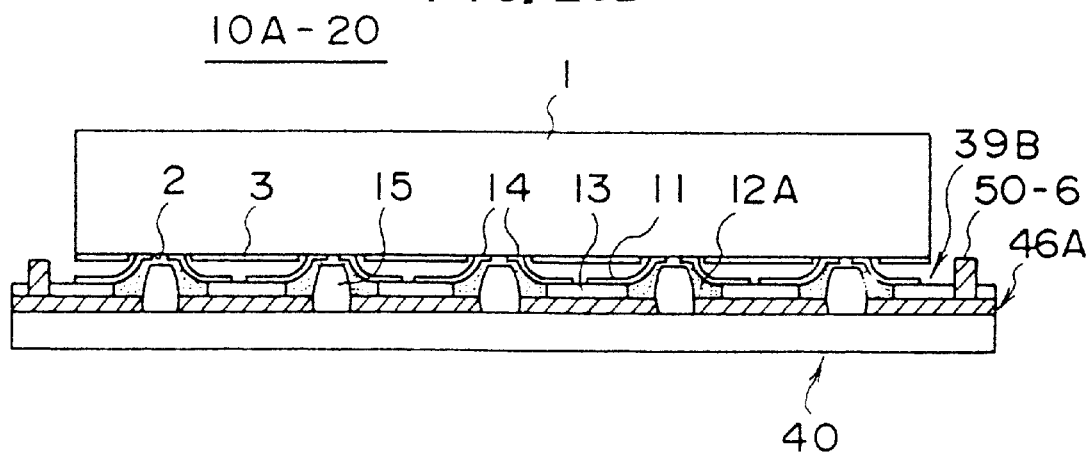

A semiconductor test apparatus 10A-20 according to the twentieth embodiment shown in FIGS. 28A and 28B is constructed such that an aligning jig 46A having guide pins 50-6 is provided between the test substrate 39B and the upholding substrate 40. As shown in FIG. 28A, through holes 47 for accepting the upholding parts 15 are formed in the aligning jig 46A at positions that correspond to the upholding parts 15 provided in the upholding substrate 40. The positioning holes 52-6 are formed in the test substrate 39B.

As shown in FIG. 28B, the test substrate 39B is positioned with respect to the upholding substrate 40 by inserting the upholding parts 15 provided in the upholding substrate 40 through the respective through holes 47 of the aligning jig 46A, and by inserting the guide pins 50-6 provided in the aligning jig 46A in the respective positioning holes 52-6 provided in the test substrate 39B. With this, the test substrate 39B and the upholding substrate 40 are positioned with respect to each other via the aligning jig 46A so that the connection parts 14 and the upholding parts 15 are positioned with respect to each other.

Figure 29:
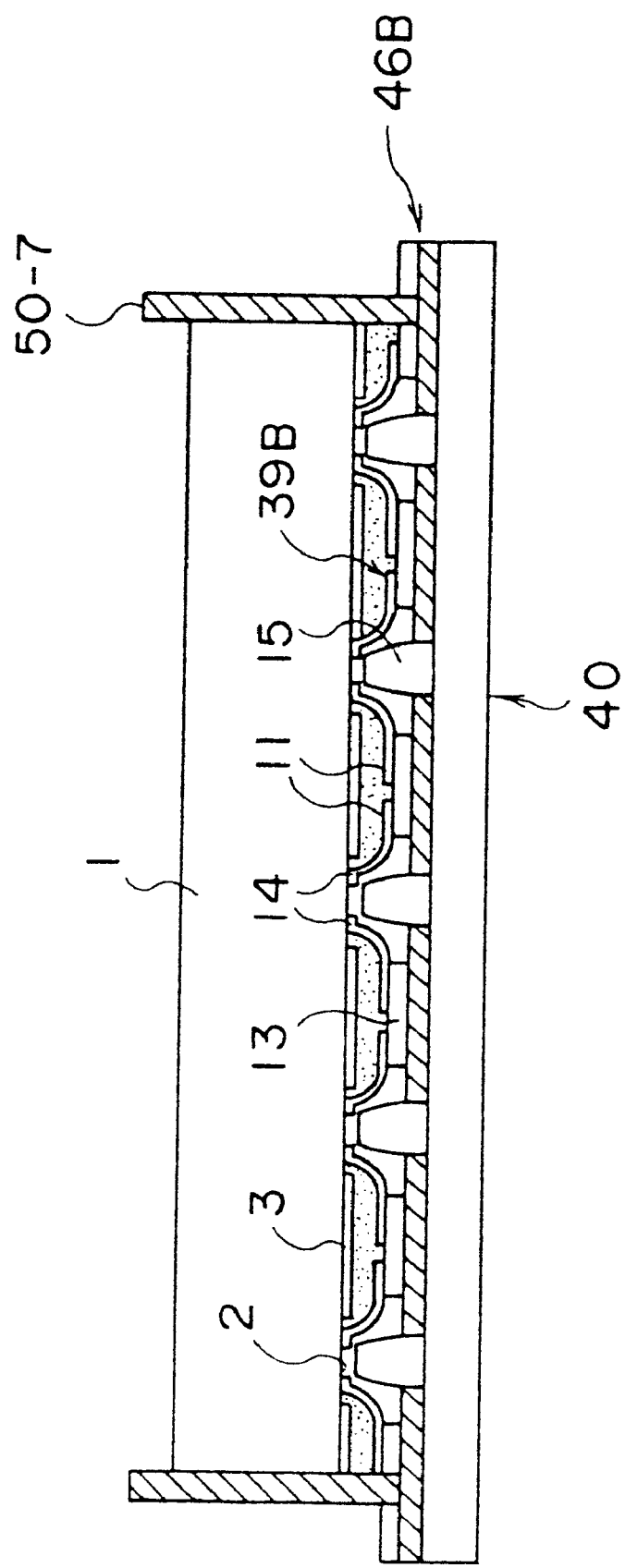
FIG. 29 shows a semiconductor test apparatus according to a twenty-first embodiment of the present invention.

A semiconductor test apparatus 10A-21 according to the twenty-first embodiment shown in FIG. 29 uses the aligning jig 46A of the twentieth embodiment described above to position the test substrate 39B and the upholding substrate 40 with respect to each other. Additional feature of the semiconductor test apparatus 10A-21 of this embodiment is further is that the guide pins 50-7 function as guides for the semiconductor device 1.

More specifically, the inner lateral surface of the guide pins 50-7 touches the semiconductor device 1 when the guide pins 50-7 are inserted through the test substrate 39B and the through holes 47 (see FIG. 28A) are mounted on the respective upholding parts 15 of the upholding substrate 40. With this construction, in addition to positioning of the connection parts 14 and the upholding parts 15 with respect to each other, positioning of the plate connection terminals 2 and the connection parts 14 with respect to each other is performed.

A semiconductor test apparatus 10A-22 according to the twenty-second embodiment as shown in FIGS. 30A and 30B features guide pins 50-8 provided to stand on or extend from the upholding substrate 40. The positioning holes 52-6 are formed in the test substrate 39B.

As shown in FIG. 30B, positioning of the test substrate 39B and the upholding substrate 40 with respect to each other is performed merely by inserting the guide pins 50-8 formed in the upholding substrate 40 in the positioning holes 52-6 of the test substrate 39B. This insertion properly positions the test substrate 39B and the upholding substrate 40 with respect to each other, so that the connection parts 14 and the upholding parts 15 are positioned with respect to each other. Thus, the constitution of the semiconductor test apparatus 10A-22 is simple and the positioning process using the same is easy.

A semiconductor test apparatus 10A-23 according to the twenty-third embodiment shown in FIG. 31 is constructed such that, as in the twenty-second embodiment, guide pins 50-9 are provided to stand on or extend from the upholding substrate 40 so as to position the test substrate 39B and the upholding substrate 40 with respect to each other. In the semiconductor test apparatus 10A-23 of this embodiment, the guide pins 50-9 also function as guide members for the semiconductor device 1.

More specifically, the inner lateral surface of the guide pins 50-9 touches the semiconductor device 1 when the guide pins 50-9 are inserted in the positioning holes 52-6 of the test substrate 39B. With this construction, in addition to positioning of the connection parts 14 and the upholding parts 15 with respect to each other, positioning of the plate connection terminals 2 and the connection parts 14 with respect to each other is performed.

In the thirteenth through twenty-third embodiments, positioning of the plate connection terminals 2 and the connection parts 14 with respect to each other and positioning of the upholding part 15 and the connection part 14 with respect to each other is performed using a simple construction since the guide pins 50-1–50-9 are used as a positioning mechanism.

A description will now be given, with reference to FIGS. 32A–38, of constructions that use a guide pin frame as a positioning mechanism.

Figure 32A:
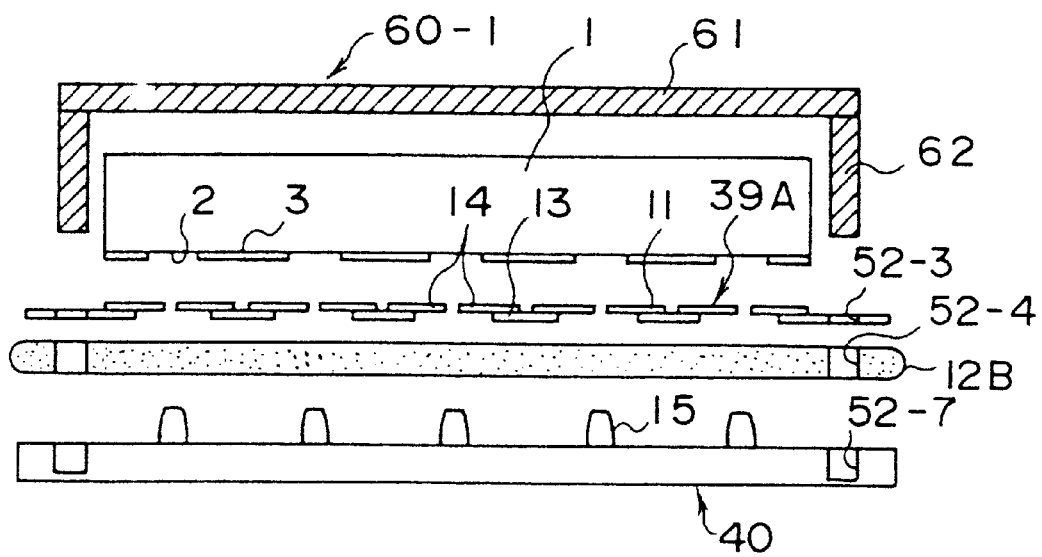
FIGS. 32A–32C show a semiconductor test apparatus according to a twenty-fourth embodiment of the present invention.
Figure 32B:
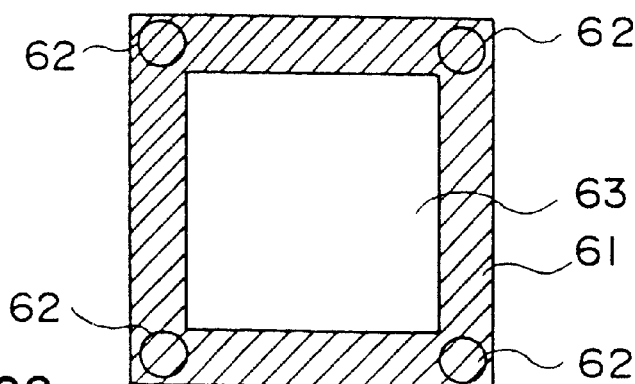
Figure 32C:
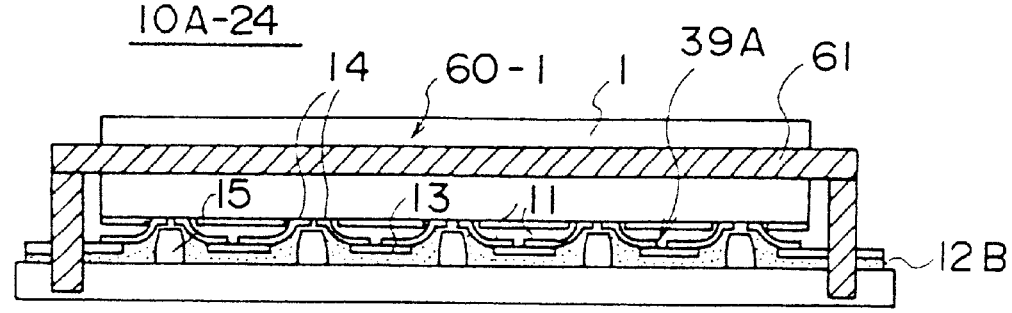

FIGS. 32A–32C show a semiconductor test apparatus 10A-24 according to the twenty-fourth embodiment.

The twenty-fourth embodiment features a guide pin frame 60-1 used to position the test substrate 39A, the buffer member 12B and the upholding substrate 40.

The guide pin frame 60-1 used in this embodiment comprises a frame part 61 and guide pins 62 provided in the frame part 61. As shown in FIG. 32B, the frame part 61 has an internal space 63 configured to correspond to the outline of the semiconductor device 1. The guide pins 62 extend downward from the four corners of the frame part 61.

As shown in FIG. 32A, the positioning holes 52-3 are formed at predetermined positions of the test substrate 39A, the positioning holes 52-4 are formed at predetermined positions of the buffer member 12B, and the positioning holes 52-7 are formed at predetermined positions of the upholding substrate 40. The positioning holes 52-3, 52-4 and 52-7 are positioned so as to correspond to the positions of the guide pin parts 62 provided in the guide pin frame 60-1.

As shown in FIG. 32C, positioning using the semiconductor test apparatus 10A-24 is such that the guide pins 62 of the guide pin frame 60-1 are inserted through the positioning holes 52-3, 52-4 and 52-7. With this, the positions of the test substrate 39A, the buffer member 12B and the upholding substrate 40 are defined by the guide pins 62 so that they are positioned with respect to each other.

As described above, the guide pin frame 60-1 is provided with the frame part 61 in which the internal space 63 that corresponds to the outline of the semiconductor device 1 is formed. Thus, the position of the semiconductor device 1 is determined by the frame part 61. Therefore, according to the semiconductor test apparatus 10A-24, positioning of the test substrate 39A, the buffer member 12B, the upholding substrate 40 and the semiconductor device 1 with respect to each other is performed easily, so that high-precision tests on the semiconductor device 1 can be performed.

Figure 33B:
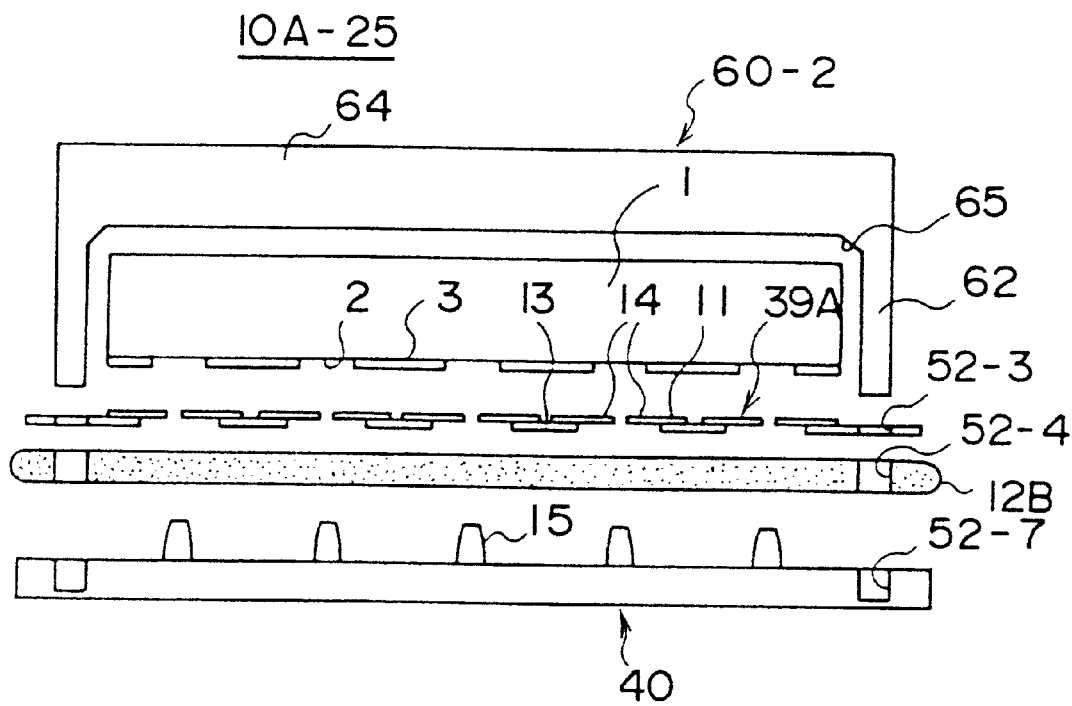
FIGS. 33A and 33B show a semiconductor test apparatus according to a twenty-fifth embodiment of the present invention.
Figure 33A:
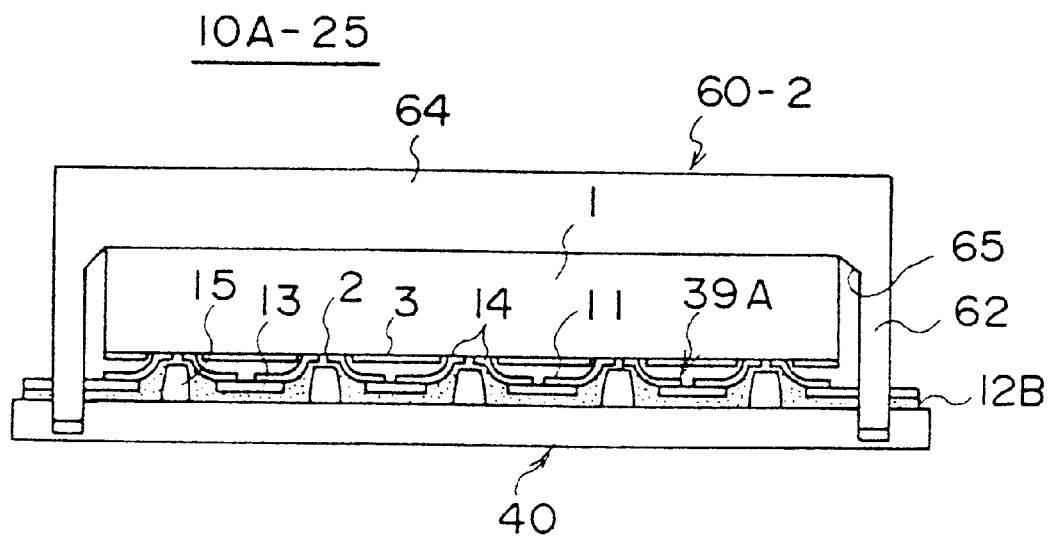

FIGS. 33A and 33B show a semiconductor test apparatus 10A-25 according to the twenty-fifth embodiment.

A guide pin frame 60-2 used in this embodiment is constructed such that a frame part 64 covers the semiconductor device 1 and a tapered surface 65 for positioning the semiconductor device 1 is formed on the inner wall of the frame part 64. The guide pins 62 are provided so as to extend downward from the four corners of the frame part 64.

In this embodiment, as shown in FIG. 33A, the positioning holes 52-3 are formed at predetermined positions in the test substrate 39A and the positioning hole 52-4 are formed at predetermined positions in the buffer member 12B and the positioning holes 52-7 are formed at predetermined positions in the upholding substrate 40. The positions of the positioning holes 52-3, 52-4 and 52-7 correspond to the positions of the respective guide pins 62 provided in the guide pin frame 60-2.

As shown in FIG. 33B, positioning using the semiconductor test apparatus 10A-25 of the above-described construction is such that the guide pins 62 of the guide pin frame 60-2 are inserted into the respective positioning holes 52-3, 52-4 and 52-7. With this, the positions of the test substrate 39A, the buffer member 12B and the upholding substrate 40 are defined by the guide pins 62 so that they are positioned with respect to each other.

As described above, the periphery of the inner wall of the frame part 64 comprising the guide pin frame 60-1 is provided with the tapered surface 65 so that the upper major surface of the semiconductor device 1 is engaged with the tapered surface 65 as the guide pin frame 60-2 is mounted, thus positioning the semiconductor device 1 properly. Thus, with the semiconductor test apparatus 10A-25 according to this embodiment, not only the test substrate 39A, the buffer member 12B and the upholding substrate 40 are positioned with respect to each other but also the semiconductor device 1 is positioned with respect to these components, so that a high-precision test on the semiconductor device 1 is enabled.

FIG. 34 shows a semiconductor test apparatus 10A-26 according to the twenty-sixth embodiment.

The semiconductor test apparatus 10A-26 according to this embodiment has basically the same construction as the semiconductor test apparatus 10A-25 according to the twenty-fifth embodiment described above, a difference being that an elastomer 66 is provided at the inner wall of the frame part 64 comprising the guide pin frame 60-2 so as to be opposite to the upper major surface of the semiconductor device 1. The elastomer 66 is formed of a material having flexibility (for example, a silicon rubber) and is provided with buffer capability.

By interposing the elastomer 66 between the frame part 64 and the semiconductor device 1, even if the guide pin frame 60-2 is pressed hard toward the test substrate 39A, the pressure is moderated by the elastomer 66 as well as by the buffer member 12D. For this reason, excessive stress is prevented from occurring in a joint between the plate connection terminal 2 and the connection part 14 and damage or deformation of the plate connection terminals 2 is prevented.

Figure 35:
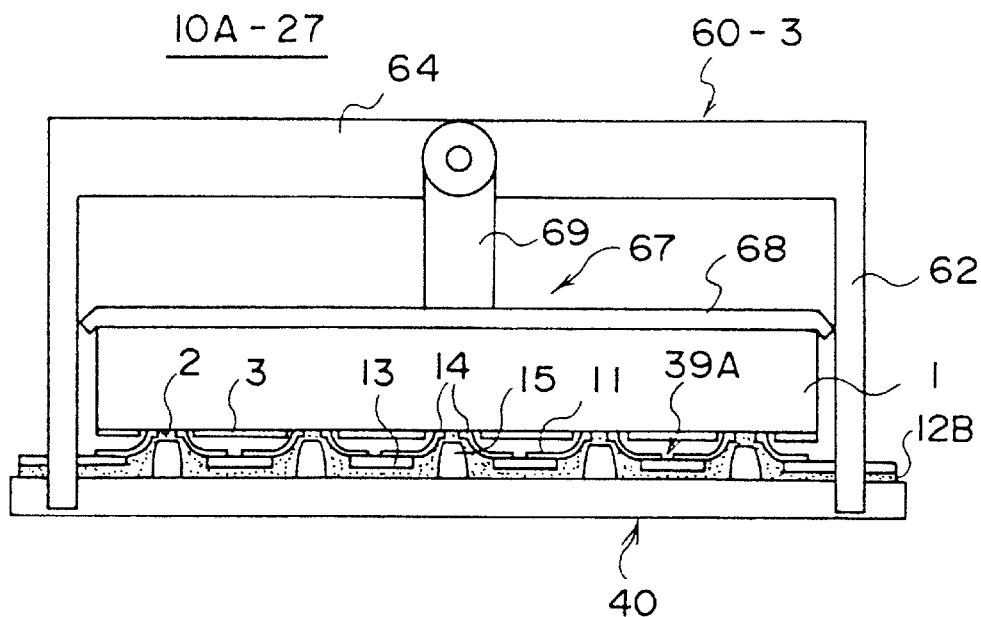
FIG. 35 shows a semiconductor test apparatus according to a twenty-seventh embodiment of the present invention.

FIG. 35 shows a semiconductor test apparatus 10A-27 according to the twenty-seventh embodiment.

The semiconductor test apparatus 10A-27 according to this embodiment is constructed such that an aligning mechanism 67 for aligning the semiconductor device 1 is provided inside the frame part 64 that constitutes the guide pin frame 60-2. The aligning mechanism 67 comprises an engagement part 68 engaged with the upper major surface of the semiconductor device 1 and a swingable arm 69 for swingably connecting the engagement part 68 to the frame part 64.

The aligning mechanism 67 is constructed such that, when the semiconductor device 1 is displaced in the lateral direction as a result of the plate connection terminal 2 being connected to the connection part 14, the engagement part 68 is displaced accordingly. In this way, by providing the aligning mechanism 67 for positioning the plate connection terminals 2 with respect to the respective connection parts 14, the plate connection terminals 2 and the connection parts 14 are positioned properly with respect to each other even if the plate connection terminals 2 are dislocated with respect to the respective connection parts 14 immediately after the semiconductor device 1 is inserted in the frame part 64.

Figure 36:
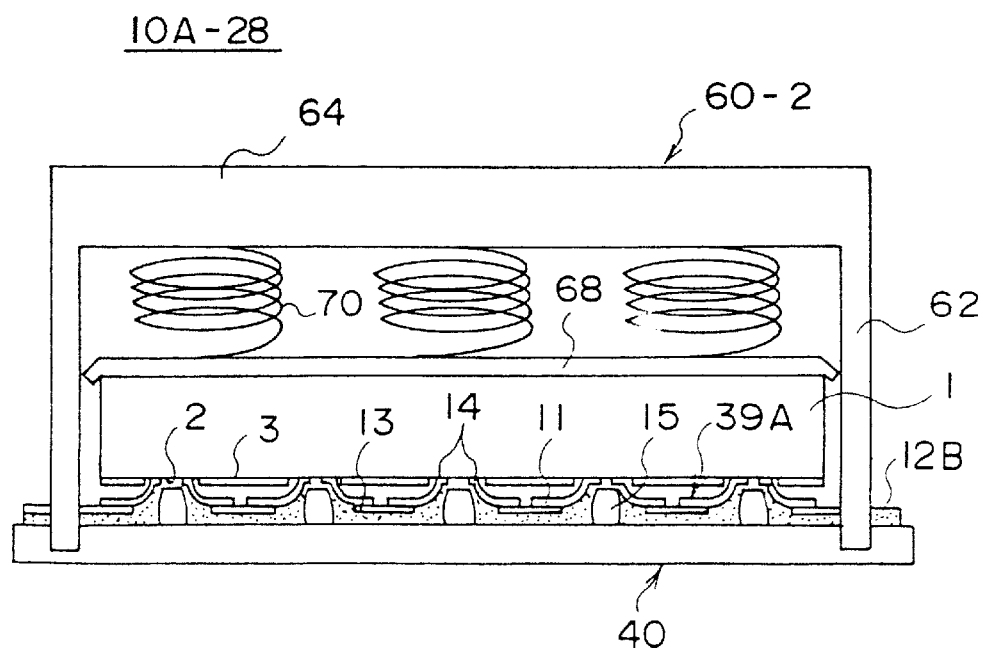
FIG. 36 shows a semiconductor test apparatus according to a twenty-eighth embodiment of the present invention.

FIG. 36 shows a semiconductor test apparatus 10A-28 according to the twenty-eighth embodiment.

The semiconductor test apparatus 10A-28 according to this embodiment is constructed such that a coil spring 70 is provided between the frame part 64 constituting the guide pin frame 60-2 and the engagement part 68 engaged with the upper surface of the semiconductor device 1. This coil spring 70 functions as an urging mechanism for urging the semiconductor device 1 in a mounted state toward the test substrate 39A (conductor layer 11).

Since the coil spring 70 is provided between the frame part 64 and the engagement part 68, a predetermined urging force is permanently present between the plate connection terminals 2 and the respective connection parts 14. Accordingly, electrical connection between the plate connection terminals 2 and the connection parts 14 is improved, and the plate connection terminals 2 are prevented from being dislocated with respect to the respective connection parts 14 during a test.

Figure 37:
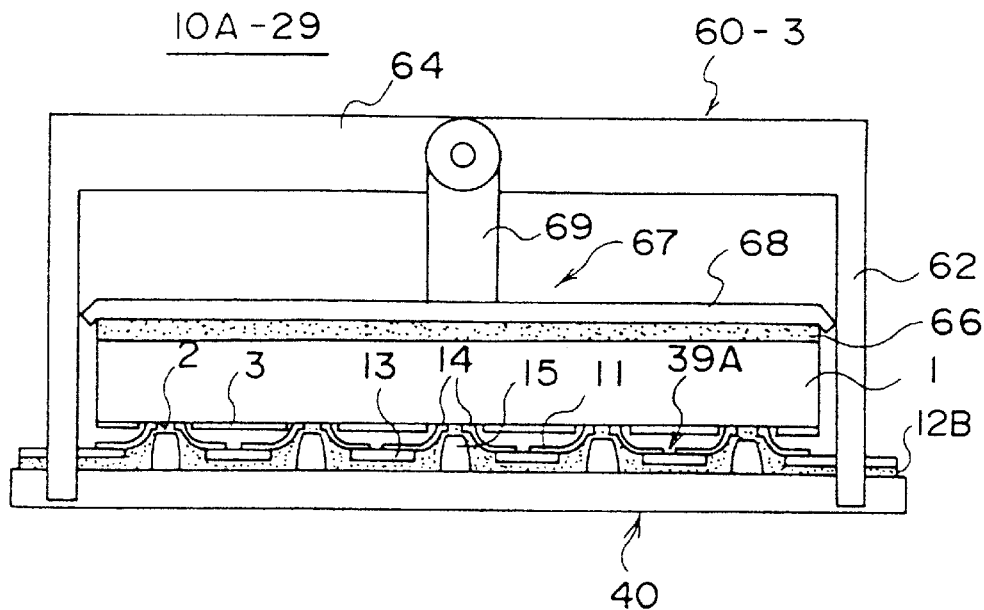
FIG. 37 shows a semiconductor test apparatus according to a twenty-ninth embodiment of the present invention.

FIG. 37 shows a semiconductor test apparatus 10A-29 according to the twenty-ninth embodiment.

The semiconductor test apparatus 10A-29 according to this embodiment is constructed such that the elastomer 66 is inserted between the upper major surface of the semiconductor device 1 and the engagement part 68 of the semiconductor test apparatus 10A-27 of the twenty-seventh embodiment shown in FIG. 35. Therefore, according to this embodiment, it is possible to provide the effect of the twenty-sixth embodiment and the effect of the twenty-seventh embodiment at the same time.

Figure 38:
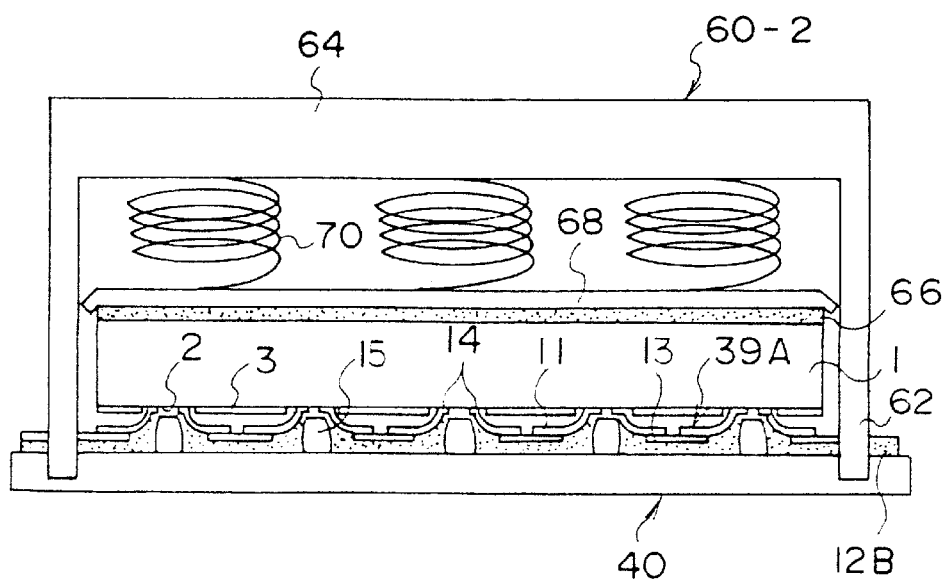
FIG. 38 shows a semiconductor test apparatus according to a thirtieth embodiment of the present invention.

FIG. 38 shows a semiconductor test apparatus 10A-30 according to the thirtieth embodiment.

The semiconductor test apparatus 10A-30 according to this embodiment is constructed such that the elastomer 66 is inserted between the upper major surface of the semiconductor device 1 and the engagement part 68 of the semiconductor test apparatus 10A-28 of the twenty-eighth embodiment shown in FIG. 36. Therefore, according to this embodiment, it is possible to provide the effect of the twenty-sixth embodiment and the effect of the twenty-eighth embodiment at the same time.

Figure 39A:
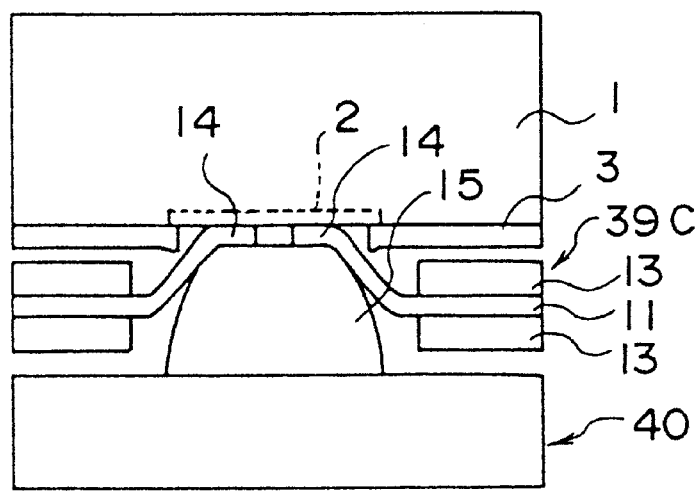
FIGS. 39A–39C shows a test method whereby a test substrate is turned upside down after a first test is performed so as to perform a second test.

A description will now be given, with reference to FIG. 39, of tests conducted successively on a plurality of semiconductor device 1 using a test substrate 39C.

The test base 39C used in this embodiment is constructed such that a support film is provided on both surfaces of the conductor layer 11. That is, the test base 39C is configured to be symmetrical in a cross section.

According to the test method of this embodiment, a plurality of semiconductor devices 1 are tested in succession. Every time a test is completed, the test substrate 39C is turned upside down. By turning the test substrate 39C upside down every time a test is completed, proper connection between the connection part 14 and the plate connection terminal 2 is ensured for each test.

For example, as the upholding part 15 causes the connection part 14 to be deformed so as to be electrically connected to the plate connection terminal, plastic deformation (the state in which the original state before the deformation is resumed) may occur in the thin plate connection part 14 which is part of the conductor layer 11.

Therefore, when a test is performed for a second time in this state, the mounting condition of the semiconductor device 1 may change in the second test and the depression of the plate connection terminal 2 may vary between the tests. In this case, the connection part 14 may not be properly connected to the plate connection terminal 2.

Figure 39B:
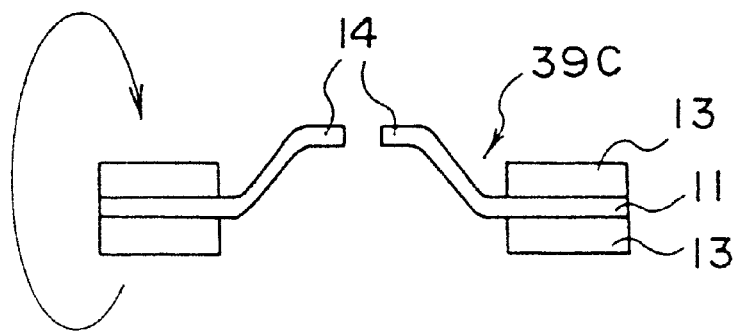
Figure 39C:
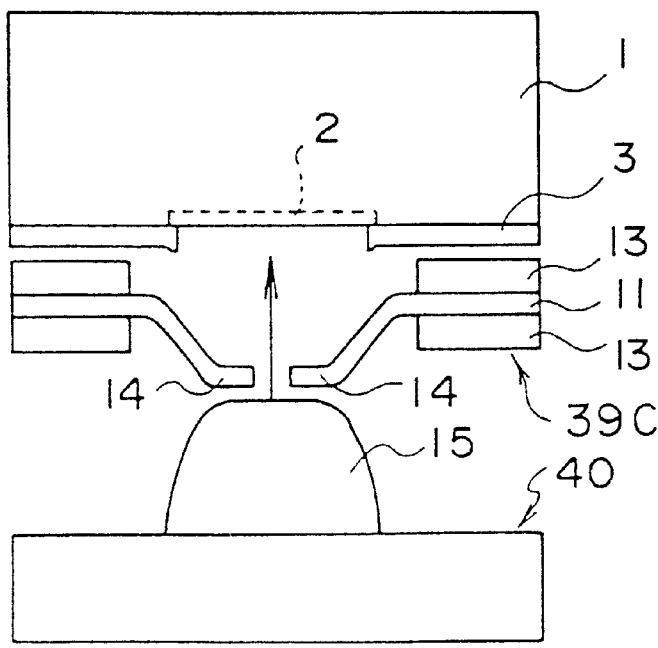

As shown in FIG. 39B, when the second test is performed, the test substrate 39C is turned upside down. With this, as shown in FIG. 39C, the connection part 14 is projected toward the upholding substrate 40 when the test substrate 39C is turned upside down. Thus, it is possible to deform the connection part 14 toward the plate connection terminal 2.

By turning the test substrate 39C upside down every time a test is completed, the connection part 14 is deformed accordingly so that previous deformation of the connection part 14 is not retained. Thus, the connection part 14 and the plate connection terminal 2 are properly connected to each other every time a test is conducted.

A description will now be given of the thirty-first embodiment of the present invention.

FIG. 40 is a vertically exploded view of the semiconductor test apparatus 10B-1 according to the thirty-first embodiment of the present invention. Referring to FIG. 40, a fixing jig 113 secures the semiconductor device 1 in a horizontal state and is held so as to be movable up and down. The fixing jig is provided with a suction part 114 connected, for example, to a vacuum pump (not shown) so as to hold the semiconductor device 1 by vacuum.

An aligning mechanism 115 for swingably supporting the fixing jig 113 to control a swinging motion of the fixing jig 113 is provided on top of the fixing jig 113. The aligning mechanism 115 comprises a ball-shaped support part 115b provided at an end of a rod 115a for raising and lowering the fixing jig 113, and a bearing part 115c with which the ball-shaped support part 115b is engaged. Thus, the construction of the aligning mechanism 115 that includes the ball-shaped support part 115b and the bearing part 115c is similar to that of a universal coupling.

When, for example, an array substrate 116 immediately underneath the fixing jig 113 is inclined, a force is generated which causes the semiconductor device 1, subjected to vacuum by the fixing jig 113, to be inclined. Responsive to this, the ball-shaped support part 115b of the aligning mechanism 115 is inclined in the direction in which the semiconductor device 1 is inclined causing the semiconductor device 1 to adapt for the motion of the array substrate 116. This prevents the semiconductor device 1 and the semiconductor test apparatus 10B-1 from being damaged.

The array substrate 116 is formed of machinable ceramics or the like. A plurality of positioning depressions 117 opposite to the respective plate connection terminals 2 of the semiconductor device 1 are provided on the upper major surface of the array substrate 116. The positioning depressions 117 are provided to correspond to an outline of connection electrodes 112A described later. The connection electrodes 112A are mounted on the array substrate 116 by being lodged downward.

Figure 41:
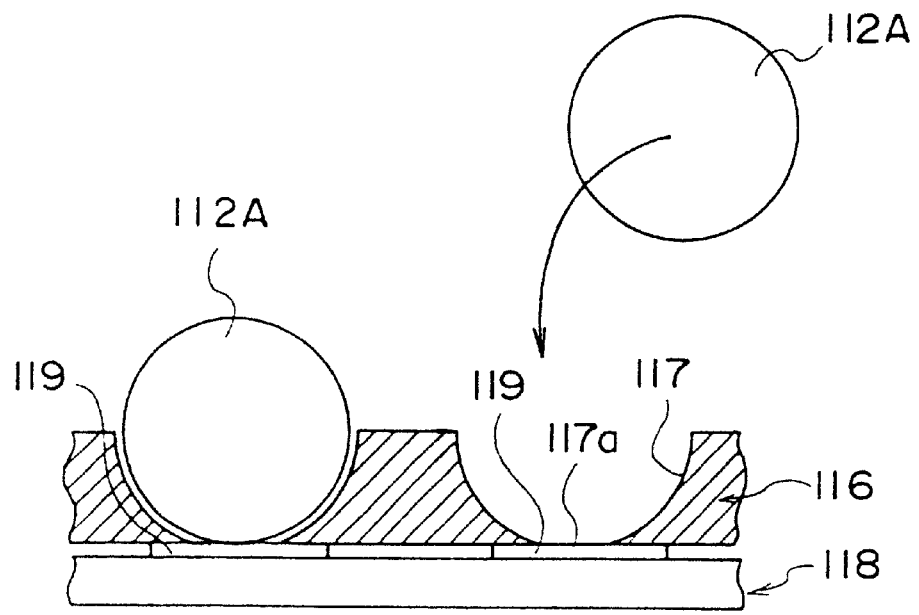
FIG. 41 shows how the connection electrodes is mounted in the array substrate.

The connection electrodes 112A are formed of a conductive metal (for example, solder or copper) and are formed as spheres. The connection electrodes 112A are mounted in the positioning depressions 117 formed in the array substrate 116, as shown in FIG. 41. As described above, the positioning depressions 117 are provided to correspond to the plate connection terminals 2. Moreover, the configuration of the positioning depression 117 corresponds to the outline of the connection electrode 112A. Thus, when the semiconductor device 1 is mounted, the connection electrodes 112A are positioned to correspond to the plate connection terminals 12.

The connection electrode 112A is formed so that its top projects from the upper major surface of the array substrate 116. Holes 117a are formed at the bottom of the positioning depressions 117. When the connection electrode 112A is mounted in the positioning depression 117, the bottom of the connection electrodes 112A is exposed at the bottom of the array substrate 116 via the hole 117a.

A measurement substrate 118 is provided beneath the array substrate 116. The measurement substrate 118 is constructed such that a wiring layer 120 is formed on an insulating base film. Measurement terminals 119 are formed on the wiring layer 120 so as to correspond to the respective plate connection terminals 2.

The measurement terminals 119 are provided to test the electrical performance of the semiconductor device 1. As shown in FIG. 41, the measurement terminal 19 is opposite to the hole 117a provided at the bottom of the positioning depression 117 of the array substrate 116. As shown in FIG. 40, an assembly comprising the array substrate 116 built on the measurement substrate 118 is mounted on the semiconductor test apparatus 10B-1 such that the bottom of the connection electrode 112A mounted in the array substrate 116 is electrically connected with the measurement terminal 119 via the hole 117a.

When the fixing jig 113 holding the semiconductor device 1 is lowered, the top of the connection electrode 112A mounted in the positioning depression 117 formed in the array substrate 116 comes into contact with the plate connection terminal 2 formed in the semiconductor device 1.

Since the top of the connection electrodes 112A is configured to project from the array substrate 116, the connection electrodes 112A and the respective plate connection terminals 2 are properly connected.

A stage 121 is provided beneath the measurement substrate 118 described above so as to support the array substrate 116 and the measurement substrate 118 and to be opposite to the lower major surface of the fixing jig 113. The top of the stage 121 is provided with a holder part 122 for holding the array substrate 116 and the measurement substrate 118 at respective predetermined positions.

The bottom of the stage 121 is provided with an aligning mechanism 123 for controlling the positions of the array substrate 116 and the measurement substrate 118 with respect to the semiconductor device 1. The aligning mechanism 123 has a construction similar to the construction of the aligning mechanism 115 described above. For example, the aligning mechanism 123 comprises a ball-shaped support part 123b provided at an end of a rod 123a projecting downward from the lower major surface of the stage 121, and a bearing part 123c with which the ball-shaped support part 123b is engaged.

Thus, the construction of the aligning mechanism 123 including the ball-shaped support part 123b and the bearing part 123c is similar to that of a universal coupling. When, for example, the semiconductor device 1 is mounted in an inclined state, a force that causes the stage 121 to be inclined is exerted on the array substrate 116. However, since the ball-shaped part 123b of the aligning mechanism 123 is inclined so that the array substrate 116 adapts for the motion of the semiconductor device 1, the stage 121 holding the array substrate 116 is controlled to be parallel with the fixing jig 113. Accordingly, the array substrate 116 and the measurement substrate 118 are prevented from being damaged.

A description will now be given of how the semiconductor device 1 is tested using the semiconductor test apparatus 10B-1 describe above.

The semiconductor device 1 is tested using the semiconductor test apparatus 10B-1 by joining the measurement substrate 118 provided with the measurement terminals 119 at positions that correspond to the respective plate connection terminals 2 with the array substrate 116 provided with the positioning depressions 117. Further, the connection electrodes 112A are mounted in the positioning depressions 117.

In this way, the connection electrodes 112A are positioned so as to correspond to the respective plate connection terminals 2. The bottom of the connection terminal 112A mounted in the positioning depression 117 is electrically connected to the measurement terminal 119. The top of the connection terminal 112A projects upward from the array substrate 116.

When the fixing jig 113 holding the semiconductor device 1 is lowered in this state toward the connection electrodes 112A, the top of the connection electrode 112A mounted in the positioning depression 117 comes into contact with the plate connection terminal 2 formed in the semiconductor device 1 and is electrically connected with the plate connection terminal 2 by being pressed against the plate connection terminal 2.

Since the connection electrodes 112A are configured to project upward from the array substrate 116, the projecting connection electrodes 112A press the respective plate connection terminals 2 even if the plate connection terminals 2 formed in the semiconductor device 1 are flush with the bottom of the semiconductor device 1 or depressed therefrom. Thus, electrical connection between the connection terminals 112A and the plate connection terminals 2 is ensured.

Figures 42A, 42B:
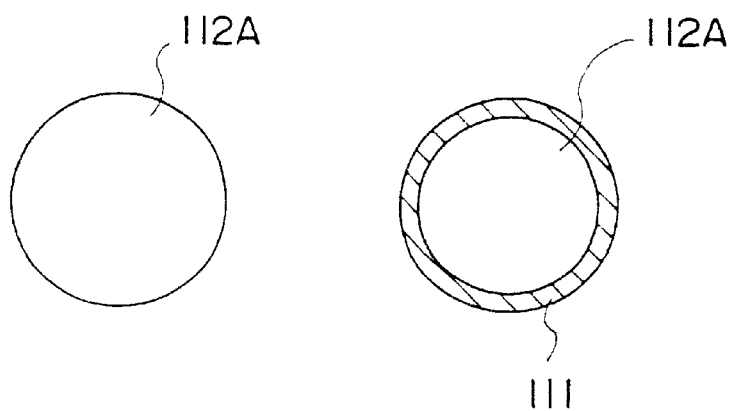
FIGS. 42A and 42B show how a protection film is formed on the connection electrode.

A description will now be given of a variation of the connection electrodes 112A As shown in FIGS. 42A and 43, the connection electrodes 112A of the semiconductor test apparatus 10B-1 are embodied by balls formed of a solder or a copper. However, as shown in FIG. 42B, the connection electrodes 112A may be provided with a protection film 111 at its circumference. The protection film 111 may be formed of gold (Au), palladium (Pd) or nickel (Ni).

By forming the protection film 111 at the circumference of the connection electrodes 112A, transformation, such as oxidization, of the connection electrodes 112A and damage on the connection electrodes 112A due to sliding contact with the plate connection terminals 2 are prevented. Further, the protection film 111 facilitates matching with the material forming the plate connection terminal 2.

Figure 44:
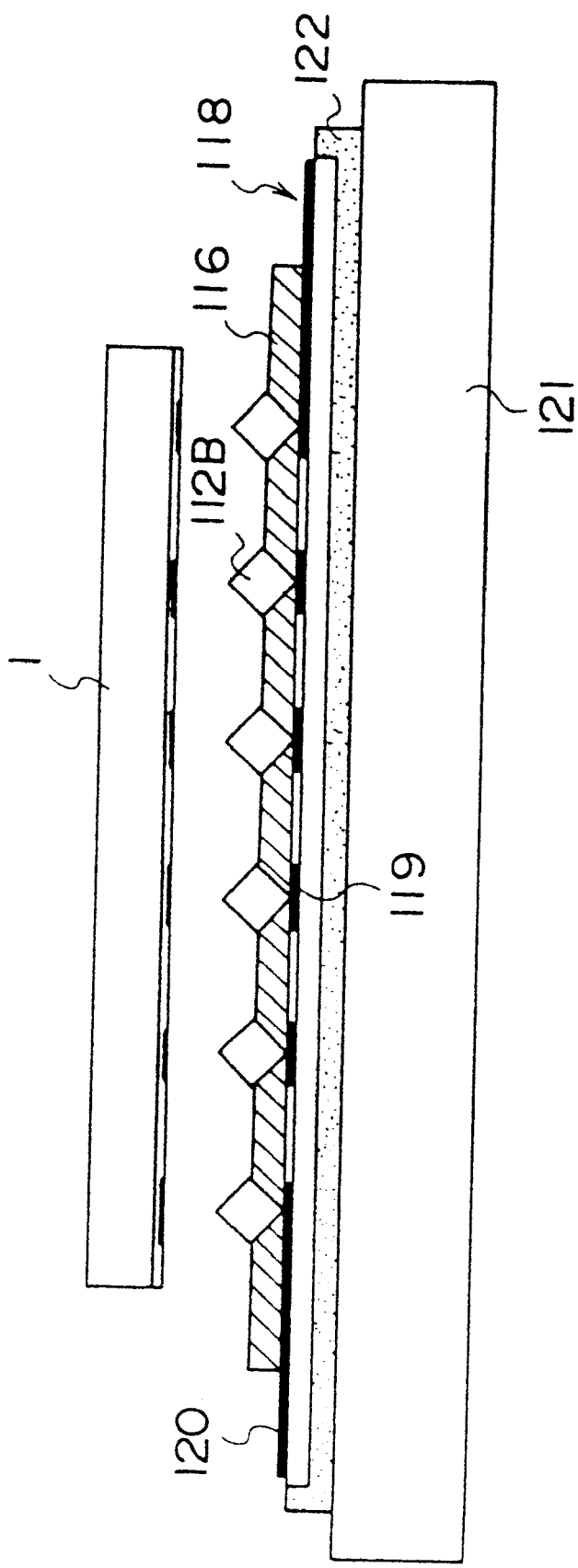
FIG. 44 shows a variation of the connection electrode.
Figure 45:
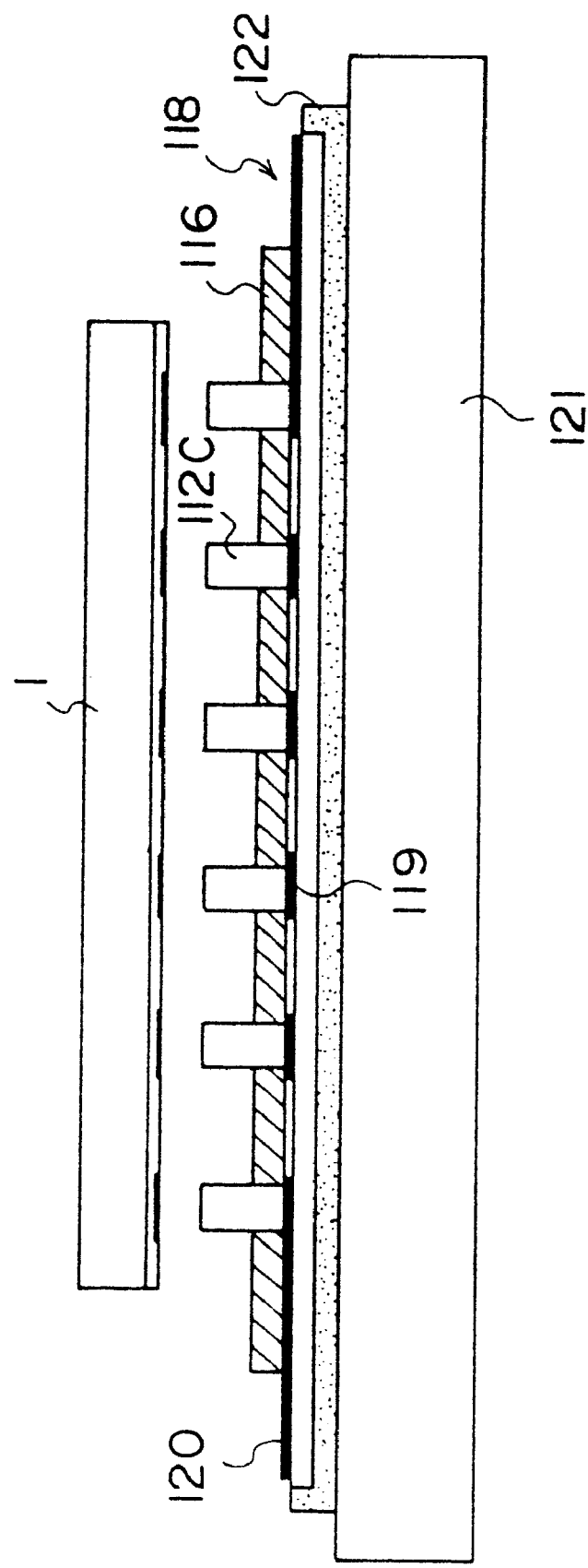
FIG. 45 shows another variation of the connection electrode.
Figure 46A:
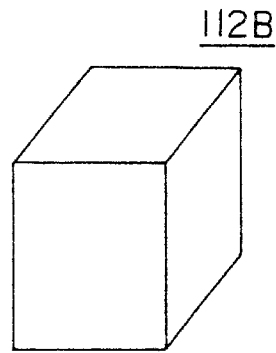
FIG. 46A is an enlarged view of the connection electrode of FIG. 44.
Figure 46B:
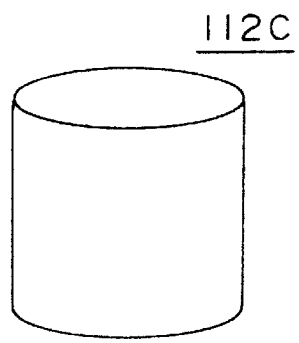
FIG. 46B is an enlarged view of the connection electrode of FIG. 45.

The connection electrodes 112A may not necessarily be ball-shaped. For example, as shown in FIGS. 44 and 46A, connection electrodes 112B having a square cross section may be used. Alternatively, as shown in FIGS. 45 and 46B, connection electrodes 112C formed as a cone may be used. If the connection electrodes 112B are used, the corner of the connection electrode 112B may be pressed against the plate connection terminal 2 so that a test is conducted while the corner bites slightly into the plate connection terminal 2. If the cone-shaped connection electrodes 112C are used, the connection electrodes 112C and the plate connection terminals 2 are in surface contact so that the area of contact increases and proper electrical connection is established.

FIGS. 47 to 52 and FIGS. 67A and 67B show variations of connection between the connection electrodes 112A and the measurement terminals 119.

Figure 47:
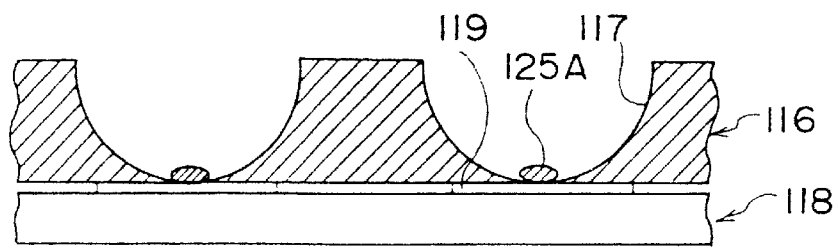
FIG. 47 shows how a projection terminal is provided in a measurement terminal.

The connection shown in FIG. 47 features provision of a projection terminal 125A in the measurement terminal 119 so as to touch the connection electrode 112A. The projection terminal 125A is embodied, for example, by a stud bump.

Thus, by providing the projection terminal 125A in the measurement terminal 119 so as to project toward the positioning depression 117, electrical connection between the connection electrodes 112A and the measurement terminals 119 is improved.

Figure 48:
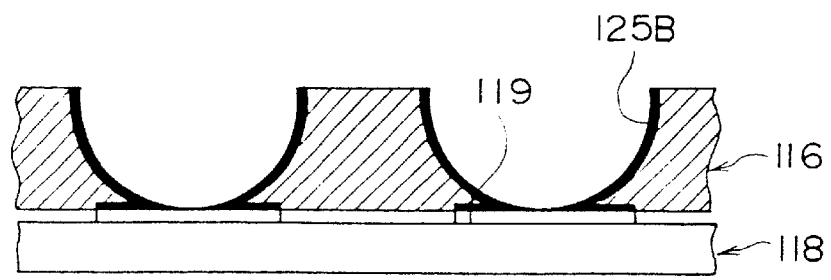
FIG. 48 shows how a conductive plating is provided on the measurement terminal.

The connection shown in FIG. 48 features provision of a conductive plating 125B electrically connected to the measurement terminal 119 on the inner wall of the positioning depression 117. By forming the conductive plating 125B on the inner wall of the positioning depression 117, the area of contact between the measurement terminals 119 and the connection electrodes 112A is substantially increased because the connection electrodes 112A come into contact with the conductive plating 125B, thus improving electrical connection between the measurement terminals 119 and the connection electrodes 112A. It is ensured that, even when the connection electrode 112A are displaced inside the positioning depression 117, electrical connection between the measurement terminals 119 and the connection electrodes 112A is secured.

Figure 49:
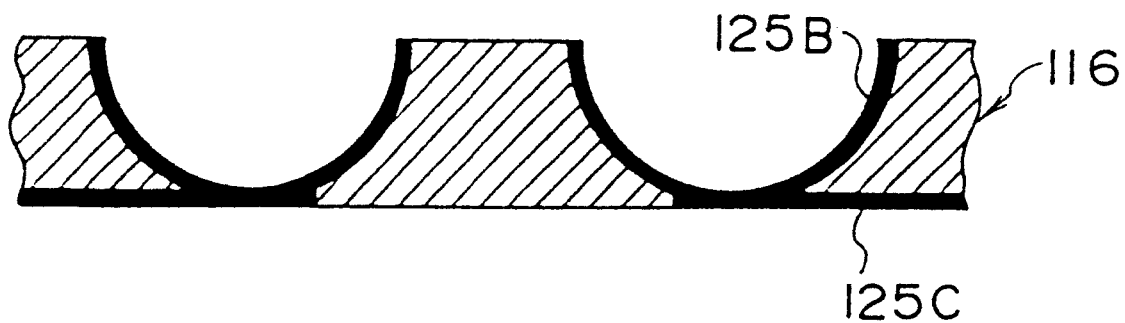
FIG. 49 show how the conductive plating is integrated with the measurement terminal.

The connection shown in FIG. 49 is similar to the connection shown in FIG. 48 in that a conductive plating 125B electrically connected to the measurement terminal 119 is formed on the inner wall of the positioning depressions 117. Further, the conductive plating 125B is integrated with the measurement terminals 119. By integrating the measurement terminals 119 with the conductive plating 125B, it is possible to simplify the construction of the semiconductor test apparatus and reduce the cost of producing the same.

The connection shown in FIGS. 67A and 67B is constructed such that a deformable conductive resin 127 is provided in the measurement terminals 119. By providing the deformable conductive resin 127 in the measurement terminals 119, the conductive resin 127 is extended when the connection electrodes 112A are mounted in the positioning depressions 117.

Due to the conductivity of the conductive resin 127, the area of contact between the measurement terminals 119 and the connection electrodes 112A is increased. Therefore, electrical connection between the measurement terminals 119 and the connection electrodes 112A is improved. Even when the connection electrode 112A is displaced inside the positioning depressions 117, proper electrical connection between the measurement terminals 119 and the connection electrodes 112A is ensured.

Figure 50:
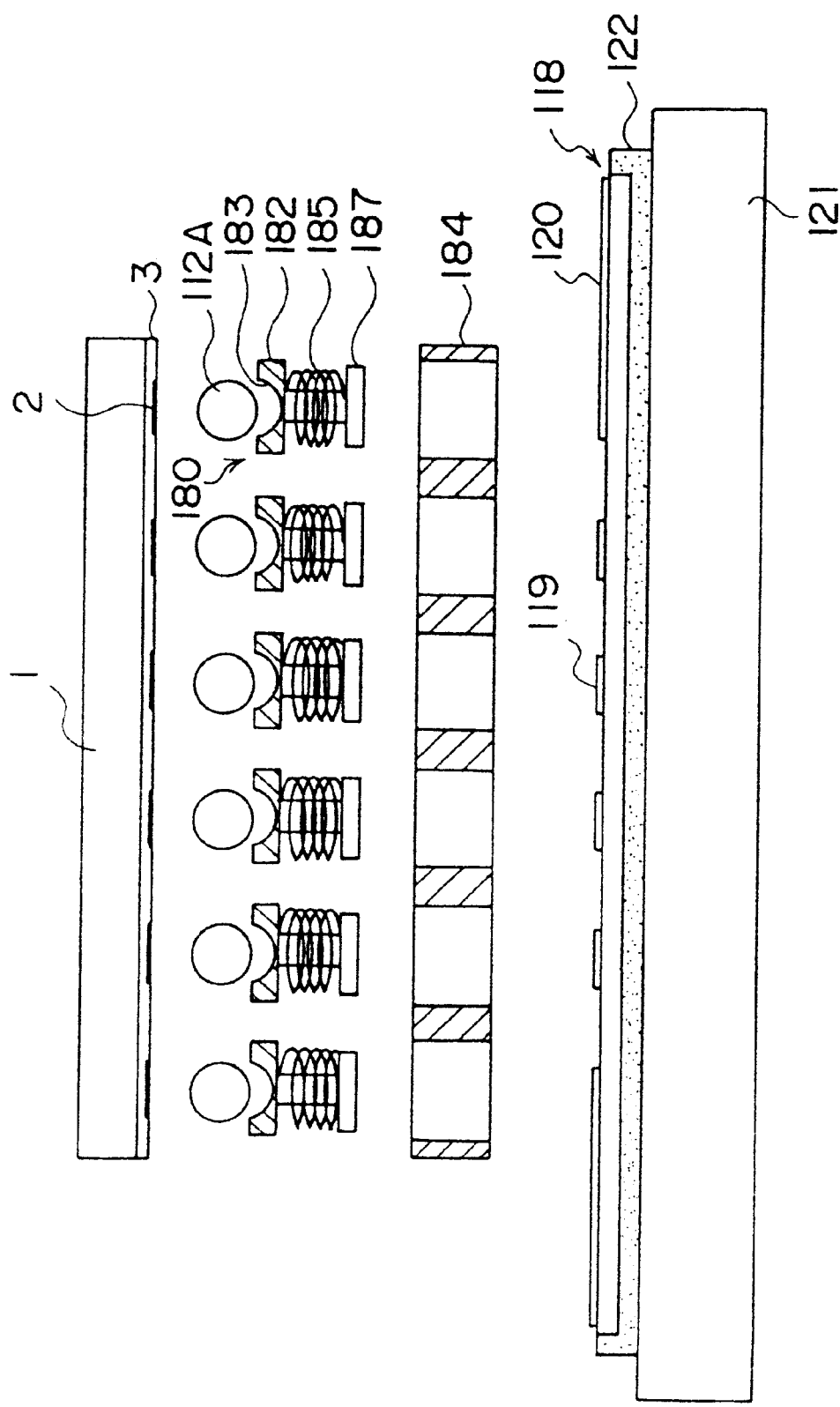
FIGS. 50–52 show a construction in which a test unit is used.
Figure 51:
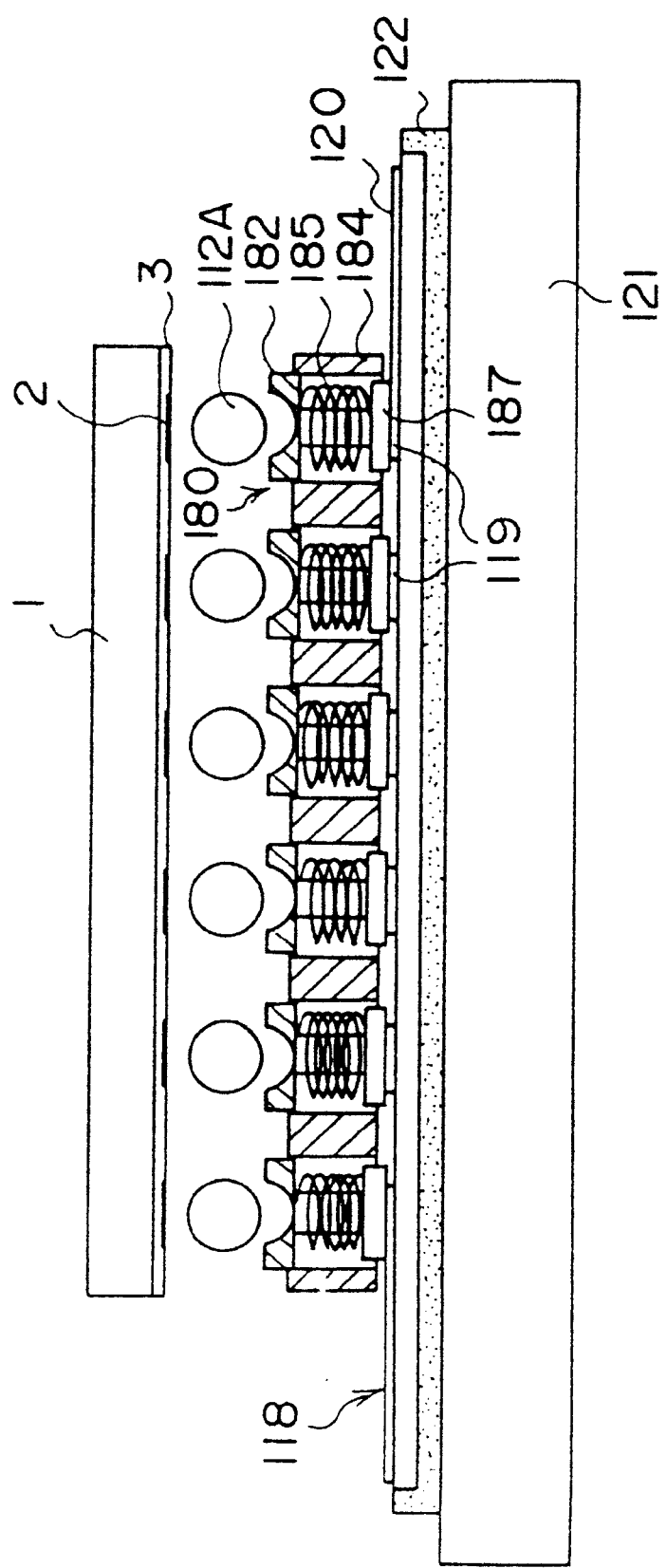
Figure 52:
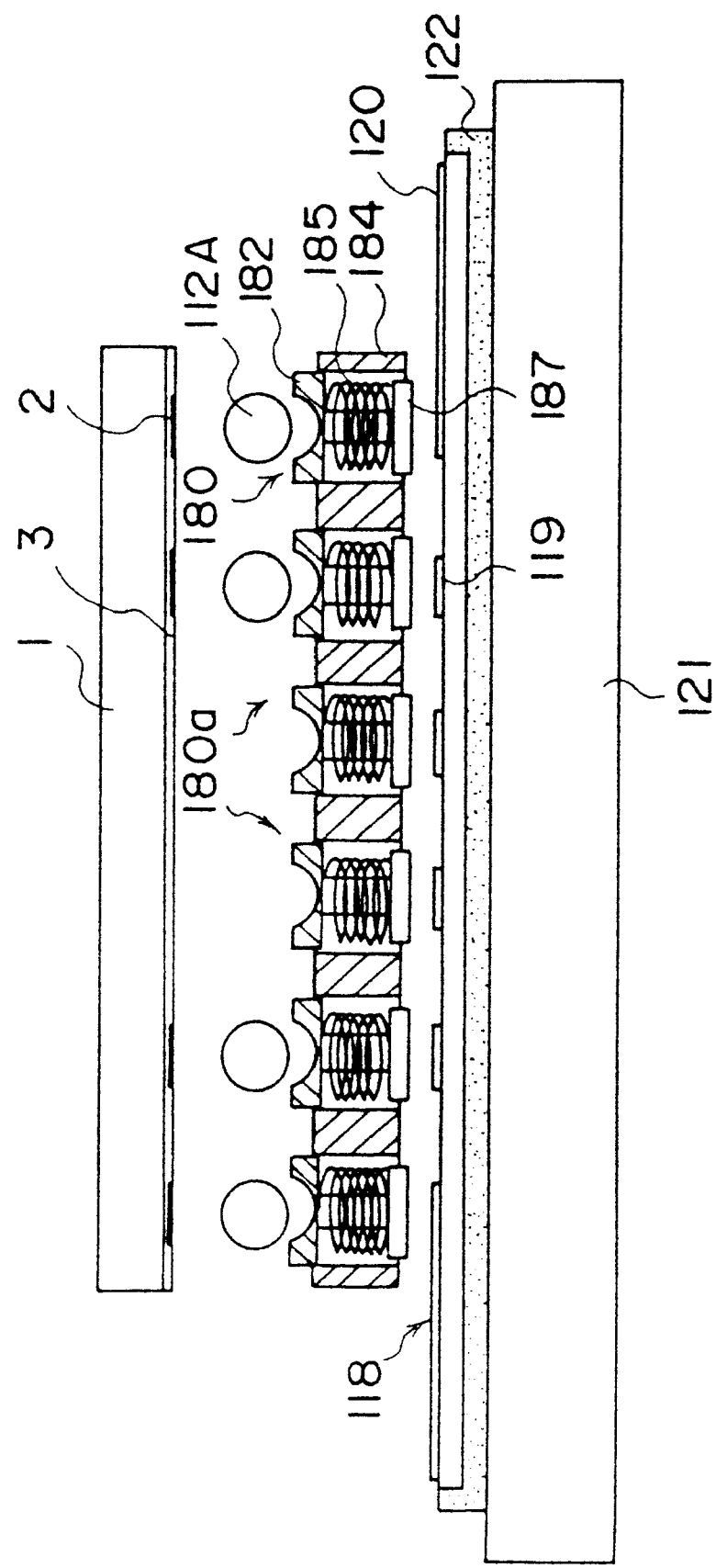

The connection shown in FIGS. 50–52 is constructed such that a test unit 180 is used to connect the connection electrodes 112A to the measurement terminals 119. FIG. 50 is an exploded view showing the test units 180; and FIG. 51 shows the test units 180 mounted on the measurement substrate 118.

As shown in FIGS. 50 and 51, each of the test units 180 comprises a terminal 182 to which the connection terminal 112A is fitted, a guide part 187 on which a rod is provided, a coil spring 185 for urging the terminal 182 upward, and a case 184 for accommodating the components listed above.

A depression 183 that corresponds to an outline of the connection terminal 112A is formed on the upper major surface of the terminal 182. When the test unit 180 shown in FIG. 51 is mounted on the measurement substrate 118, the guide part 187 is electrically connected to the measurement terminal 119 and so that the test unit 180 and the measurement terminal 119 are electrically connected to each other.

A spring force of the coil spring 185 urges the terminal 182 accommodated in the case 184 upward so that the connection electrode 112A mounted on the terminal 182 is pressed against the connection terminal 2 of the semiconductor device 1. The connection electrode 112A mounted in the terminal 182 projects from the top of the case 184. The connection electrode 112A remain projecting even when the coil spring 185 contracts. The case 184 is formed of an insulating material so that the connection electrodes 112A are not short-circuited.

The terminal 182 is movably fitted to a rod provided in the guide part 187. When a force is exerted on the terminal 182 to urge the connection electrode 112A downward, the coil spring 185 is deformed accordingly so that the terminal 182 is moved downward. Thus, proper electrical connection between the connection terminal 112A and the plate connection terminal 2 is ensured even when the semiconductor device 1 is mounted in a tilted state.

Referring to FIGS. 50 and 51, the connection electrode 112A need not be mounted on all of the terminal 182. As shown in FIG. 52, the connection electrode 112A may be mounted only on terminals that correspond to the plate connection terminals 2.

Figure 53:
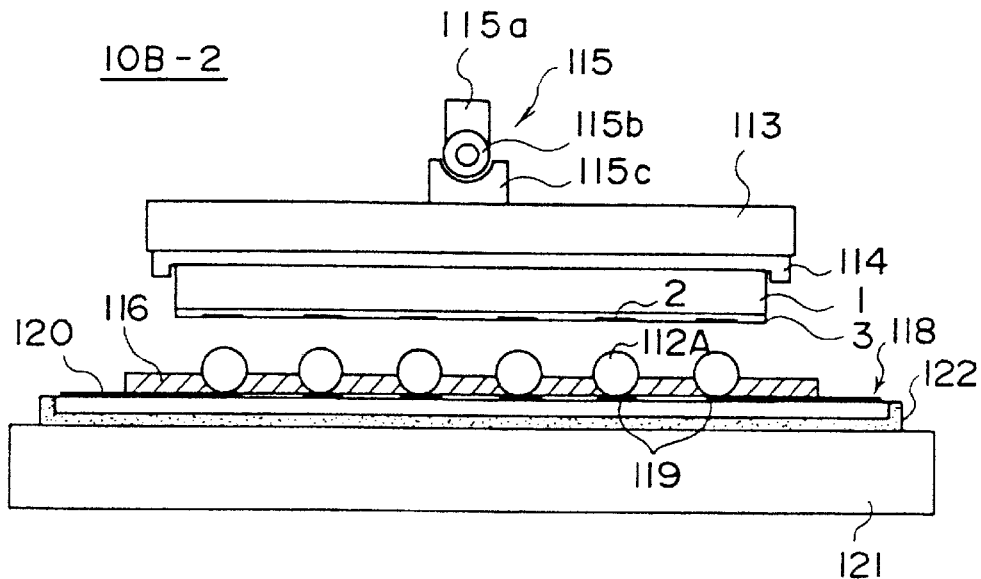
FIG. 53 shows a semiconductor test apparatus according to a thirty-second embodiment of the present invention.
Figure 54:
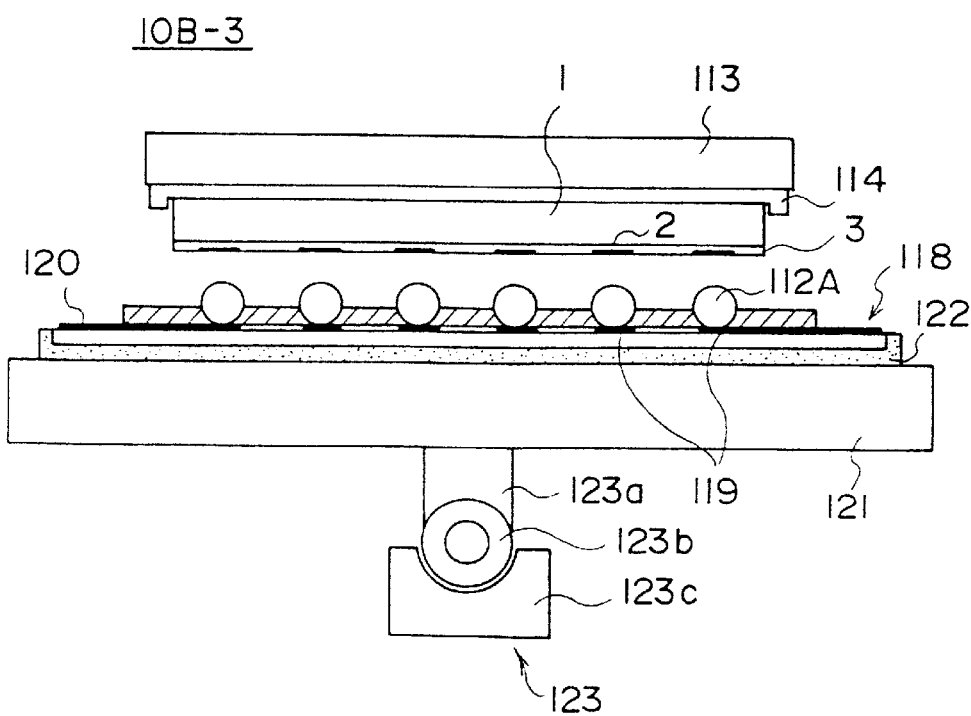
FIG. 54 shows a semiconductor test apparatus according to a thirty-third embodiment of the present invention.

FIG. 53 shows a semiconductor test apparatus 10B-2 according to the thirty-second embodiment; and FIG. 54 shows a semiconductor test apparatus 10B-3 according to the thirty-third embodiment.

The semiconductor test apparatus 10B-2 according to the thirty-second embodiment shown in FIG. 53 is constructed such that only the aligning mechanism 115 adapted for the top of the measurement substrate 118 is provided. The semiconductor apparatus 10B-3 according to the thirty-third embodiment shown in FIG. 54 is constructed such that only the aligning mechanism 123 adapted for the bottom of the measurement substrate 118 is provided. Thus, only one of the aligning mechanisms 115 and 123 may be provided so as to mount the semiconductor device 1 at the proper position.

A description will now be given, with reference to FIGS. 55–58, semiconductor test apparatuses 10B-4 and 10B-5 according to thirty-fourth and thirty-fifth embodiments, respectively, of the present invention.

The semiconductor test apparatuses 10B-4 and 10B-5 according to the thirty-fourth and thirty-fifth embodiments, respectively, are provided with members 126A–126D providing a buffer for a pressure occurring when the connection electrode 112A is connected to the plate connection terminal 2. By providing the buffer members 126A–126D, excessive pressure is prevented from occurring between the connection electrode 112A and the plate connection terminal 2. Thus, the connection electrode 112A and the plate connection terminal 2 are properly protected.

A description will now be given of a specific constructions. In the following description, it is assumed that the buffer members 126A–126D are formed of an elastomer comprising a rubber, an elastic resin or the like. For this reason, the buffer members 126A–126D will be referred to as elastomers 126A–126D.

Figure 55:
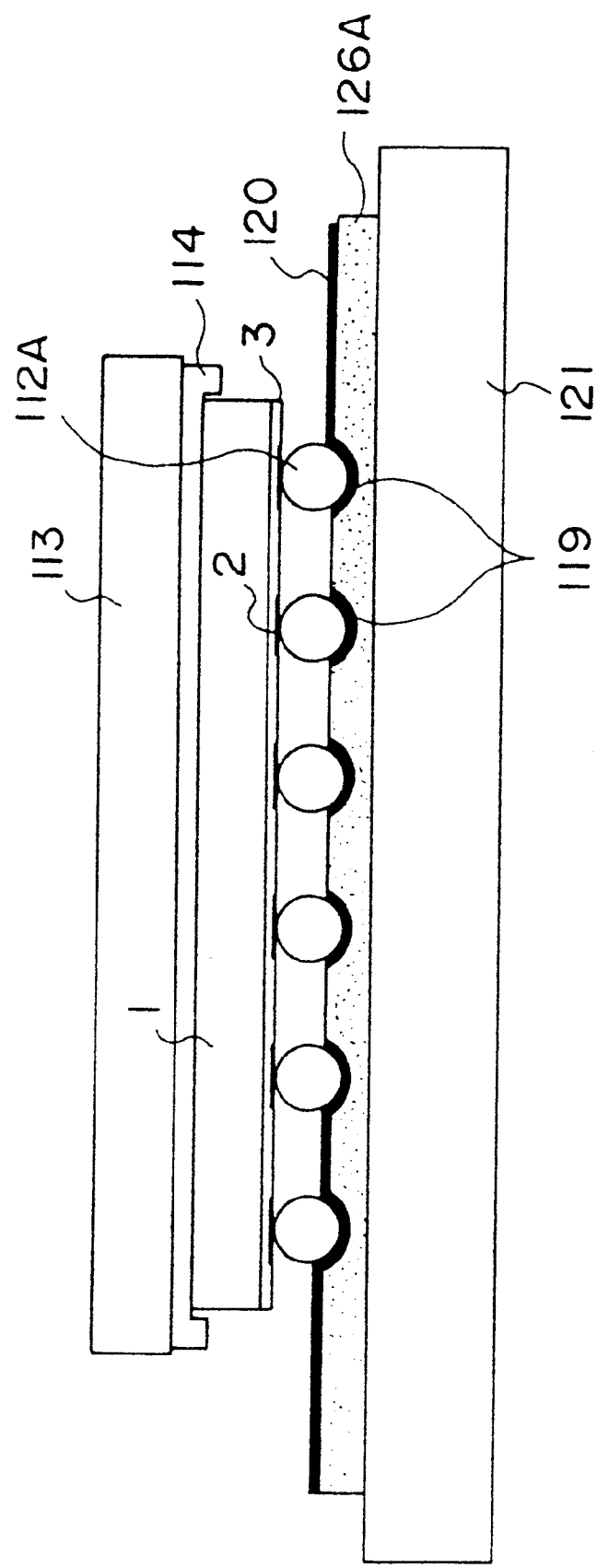
FIG. 55 shows a semiconductor test apparatus according to a thirty-fourth embodiment of the present invention.

The semiconductor test apparatus 10B-4 according to the thirty-fourth embodiment shown in FIG. 55 is provided with the elastomer 126A. More specifically, while the measurement substrate 118 used in the foregoing embodiments is constructed such that the wiring layer 120 is formed on an insulating film, the measuring substrate used in the semiconductor test apparatus 10B-4 of this embodiment is constructed such that the wiring layer 120 is formed on the elastomer 126A.

By providing the wiring layer 120 on top of the elastomer 126A, the construction of the semiconductor test apparatus 10B-4 is more simplified and the production thereof is less expensive than the apparatus wherein the elastomer 126A (buffer member) is provided separately from the measurement substrate 118.

Figure 56:
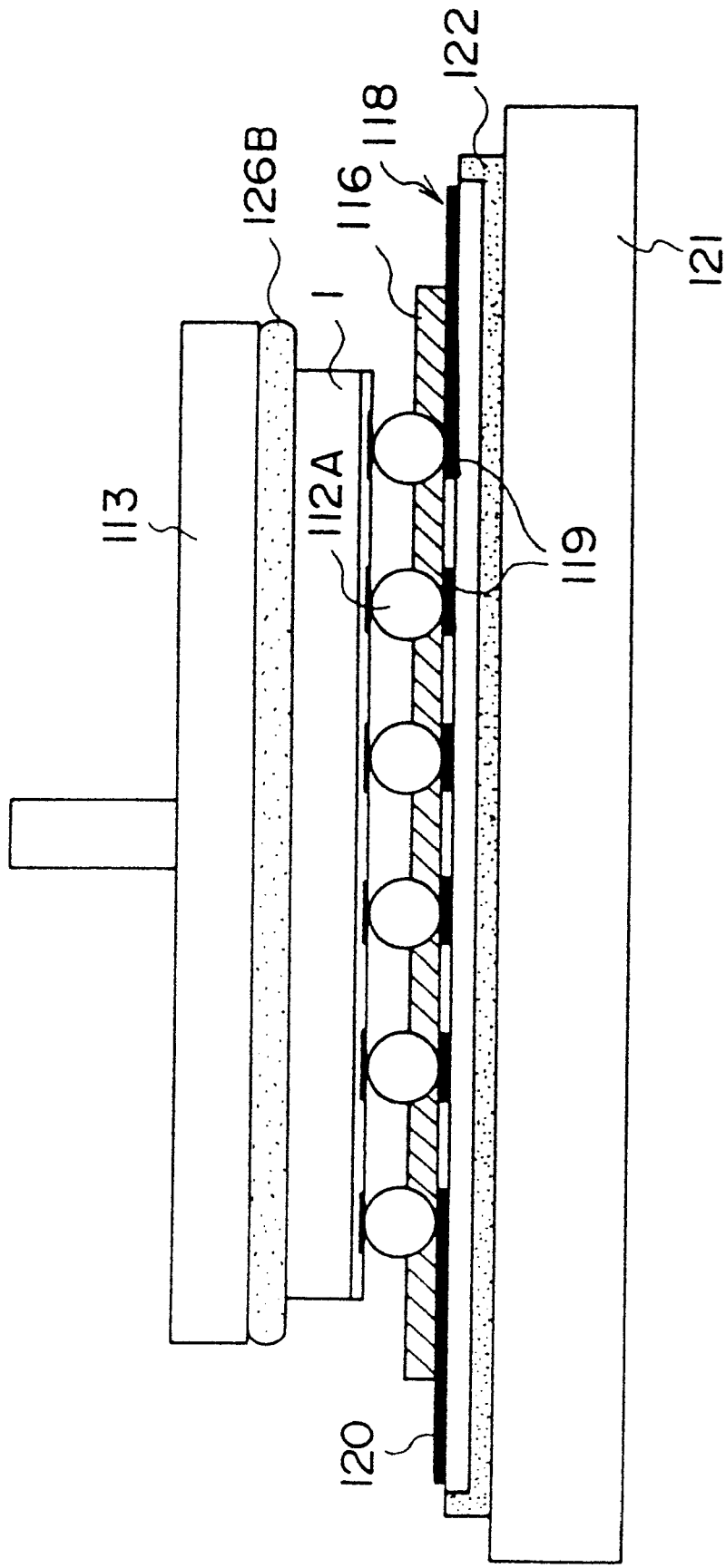
FIG. 56 shows a semiconductor test apparatus according to a thirty-fourth embodiment of the present invention.

FIG. 56 shows the semiconductor test apparatus 10B-5 according to the thirty-fifth embodiment. The semiconductor test apparatus 10B-5 is constructed such that a gel-like elastomer 126B is provided underneath the fixing jig 113. The elastomer 126B is formed as a relatively soft flat plate and can be easily deformed. An external pressure causes the elastomer 126B to be deformed in the direction of the pressure. When the semiconductor device 1 is removed after a test, the pressure on the elastomer 126B is removed so that the elastomer 126B returns to its original flat shape.

The array substrate 116 may be inclined to the semiconductor 1 and come into contact therewith in an inclined state, as the semiconductor device 1 fitted to the lower major surface of the fixing jig 113 is lowered. When this happens, the elastomer 126B is deformed so as to make the semiconductor device 1 and the array substrate 116 parallel with each other.

For example, when the array substrate 116 is inclined, a force is exerted on the semiconductor device 1 fitted to the fixing jig 113 so as to cause the semiconductor device 1 to be inclined. Since the elastomer 126B is deformed, the semiconductor device 1 is allowed to be inclined so as to adapt to the outline of the array substrate 116. Thus, it is ensured that the array substrate 116 is parallel with the semiconductor device 1.

As a result, the plate connection terminals 2 in the semiconductor device 1 are properly connected to the connection electrodes 112A mounted on the positioning holes 117 of the array substrate 116. Therefore, reliability of a test on the semiconductor device 1 is improved. Since the shock occurring when the plate connection terminals 2 are connected to the respective connection electrodes 112A is moderated by the elastomer 126B, the plate connection terminals 2 and the connection electrodes 112A are prevented from being damaged.

Figure 57:
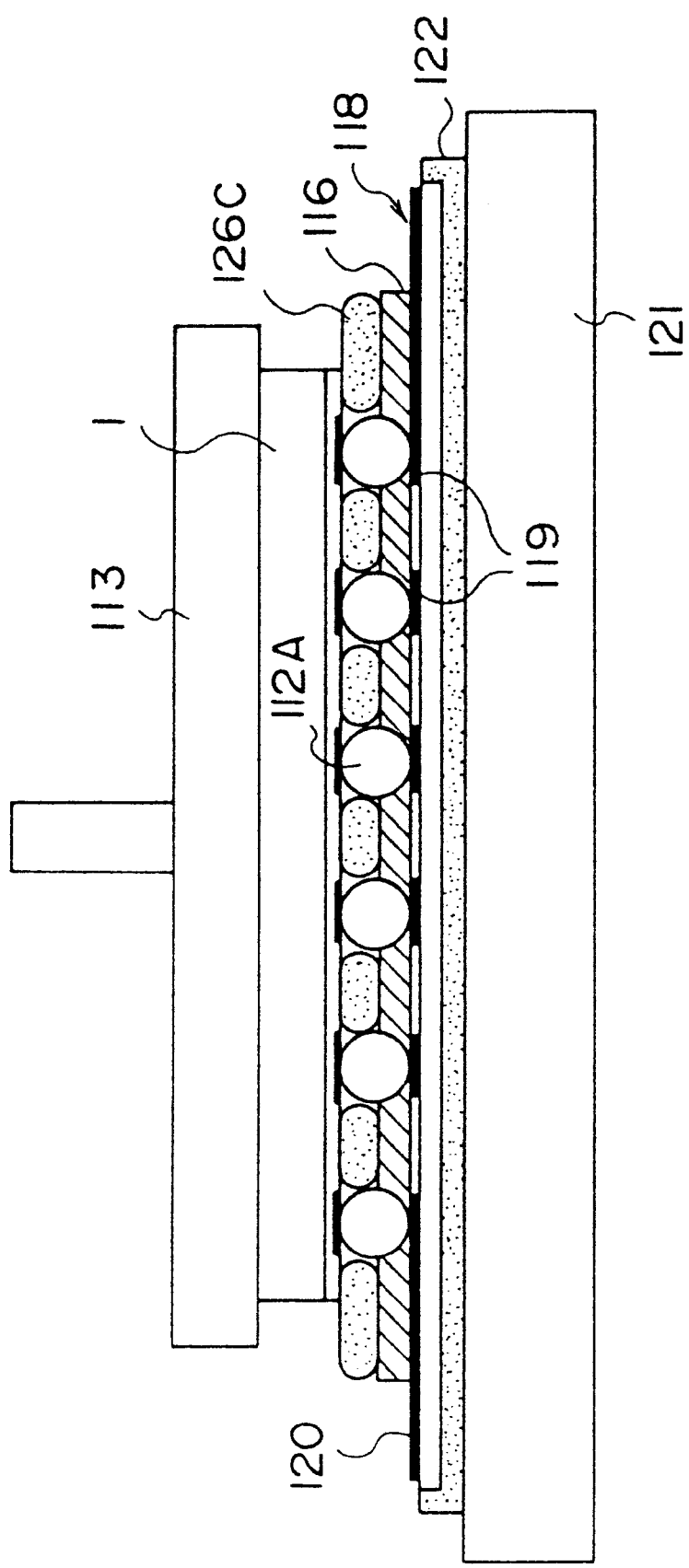
FIG. 57 shows a semiconductor test apparatus according to a first variation of the thirty-fifth embodiment.

FIG. 57 shows a semiconductor test apparatus according to a variation of the thirty-fifth embodiment.

The semiconductor test apparatus according to this variation is constructed such that a gel-like elastomer 126C is provided on top of the array substrate 116. When an external pressure is applied, the elastomer 126C is deformed in the direction of the pressure. When the semiconductor device 1 is raised after a test, the pressure on the elastomer 126C is removed so that the elastomer 126C returns to its original shape.

When the semiconductor device 1 is mounted in an inclined state, a resultant force causes the array substrate 116 to be inclined. As the elastomer 126C receiving the pressure is deformed, the semiconductor device 1 is inclined accordingly so as to adapt to the inclination of the array substrate 116. Thus, the array substrate 116 and the semiconductor device 1 are maintained in a parallel state. Since the shock occurring when the connection electrodes 112A are connected to the plate connection terminals 2 is moderated by the elastomer 126C, the plate connection terminals 2 and the connection electrodes 112A are prevented from being damaged.

Figure 58:
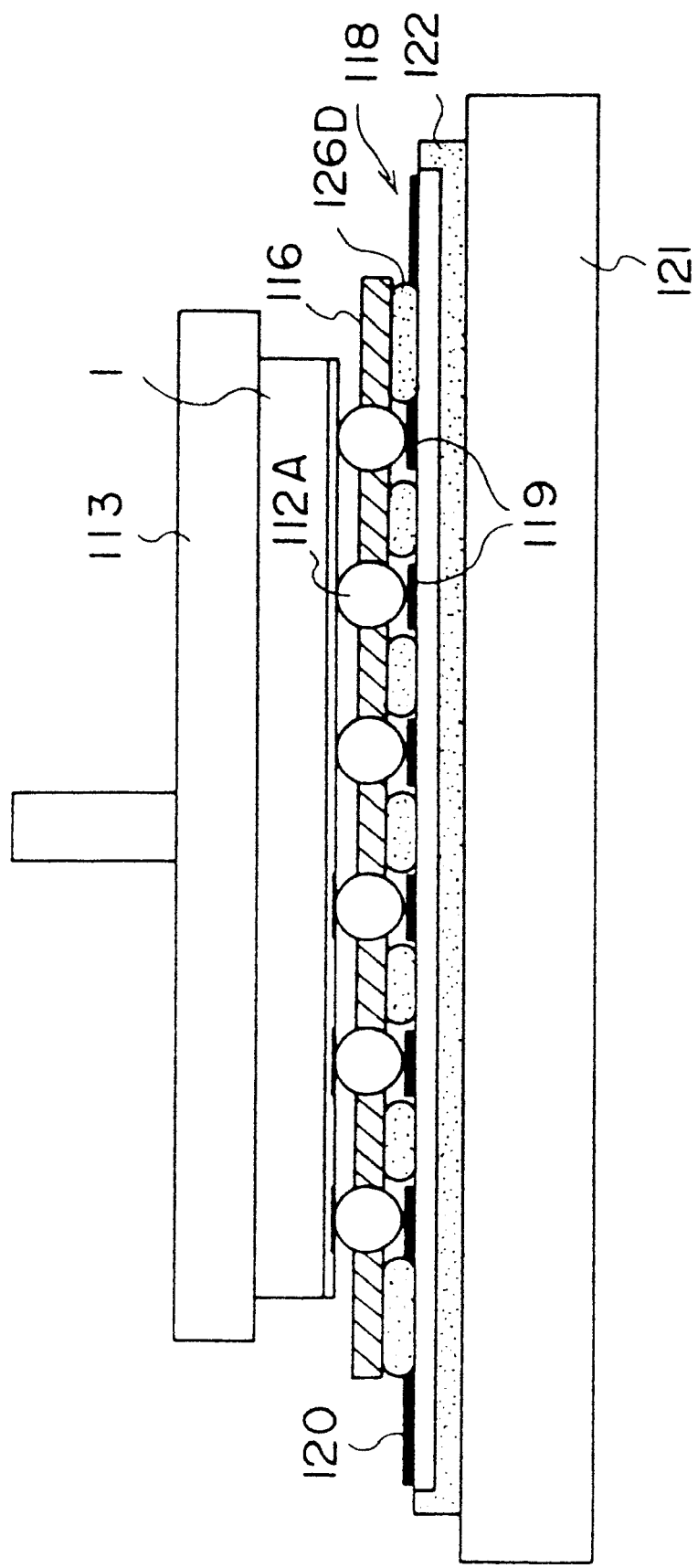
FIG. 58 shows a semiconductor test apparatus according to a second variation of the thirty-fifth embodiment of the present invention.

FIG. 58 shows a semiconductor test apparatus according to a second variation of the thirty-fifth embodiment. The semiconductor test apparatus according to this variation is constructed such that a gel-like elastomer 126D is provided between the measurement substrate 118 and the array substrate 116. The elastomer 126D is deformed when receiving an external pressure and returns to its original shape when the semiconductor device 1 is raised after a test. Accordingly, like the semiconductor test apparatus shown in FIGS. 56 and 57, the semiconductor test apparatus of this variation also ensures that the semiconductor device is tested in a highly reliable manner and the plate connection terminals 2 and the connection electrodes 112A are prevented from being damaged.

It is assumed in the above that the elastomers 126A–126D used in the semiconductor test apparatuses described with reference to FIGS. 55–58 are formed of a flat elastic member without any grooves or notches. However, the elastomers 126A 126D need not be a flat member without grooves or notches. As illustrated in FIGS. 16A and 16B, notches may be provided in the elastomers 126A–126D. Alternatively, the elastomers 126A–126D may be formed by combining a plurality of individual members. With this construction, the elasticity of the elastomers 126A–126D increases so that its action as a buffer is improved. Thus, the connection electrodes 112A and the plate connection terminals 2 are properly connected to each other.

A description will now be given of a thirty-sixth embodiment of the present invention.

Figure 59:
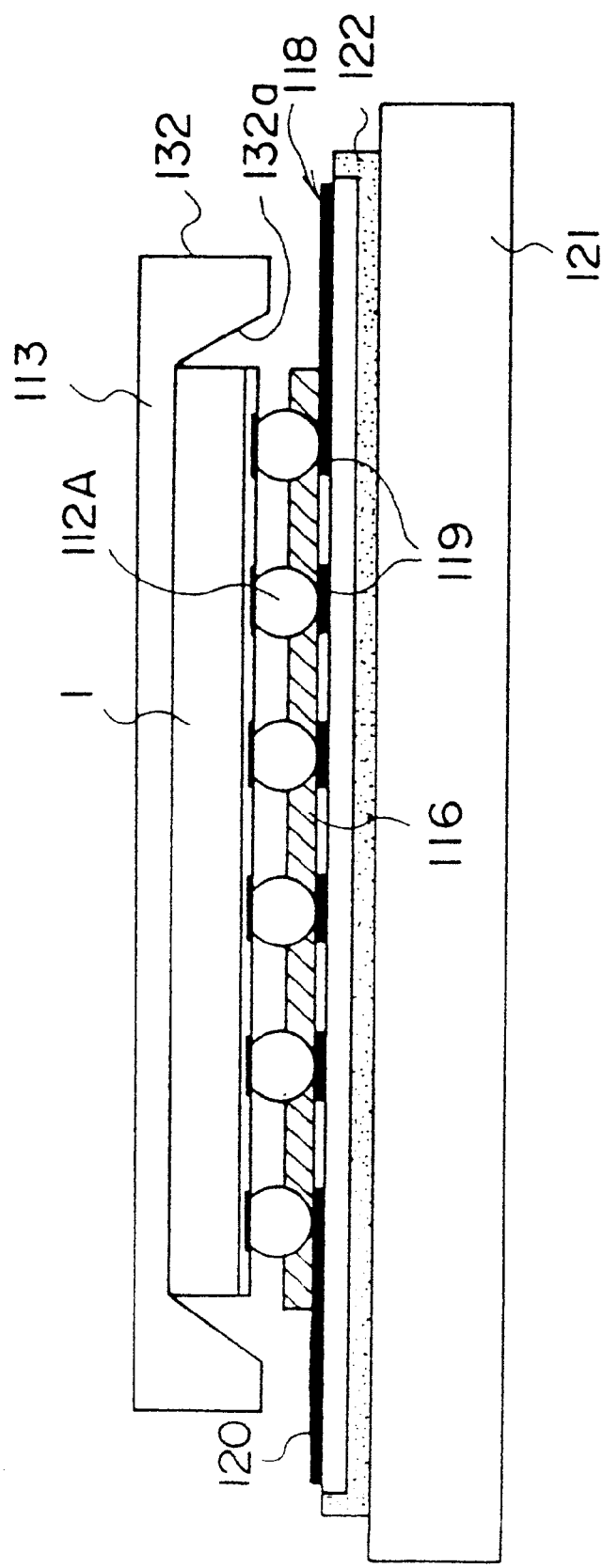
FIG. 59 shows a semiconductor test apparatus according to a thirty-sixth embodiment of the present invention.

FIG. 59 shows a semiconductor test apparatus 10B-6 according to the thirty-sixth embodiment of the present invention. The semiconductor test apparatus 10B-6 is constructed such that positioning parts 132 for defining the position of the semiconductor device 1 are provided in the fixing jig 113.

The positioning parts 132 are provided with slopes 132a having a triangular cross-section. The slopes 132a approaches the semiconductor device 1 from the top of the paper so as to come into contact with the top corners of the upper major surface of the semiconductor device 1.

When the semiconductor device 1 is mounted the semiconductor test apparatus 10B-6 using a handling device (not shown), the semiconductor device 1 may be placed in an inclined state. The 35 semiconductor test apparatus 10B-6 ensures that, as the fixing jig 113 lowers so that the plate connection terminals 2 of the semiconductor device 1 are connected to the respective connection electrodes 112A mounted in the positioning depressions 117, the top corners of the semiconductor device 1 come into sliding contact with the slopes 132a of the positioning 132 so that the semiconductor device 1 is guided into its position in a balanced manner.

Thus, the semiconductor device 1 is guided into the center of the fixing jig 113 and is positioned so as to be parallel with the array substrate 116. As a result, the plate connection terminals 2 of the semiconductor device 1 are properly connected to the connection electrodes 112A, thus enabling highly reliable tests on the semiconductor device 1 to be performed.

A description will now be given of a thirty-seventh embodiment of the present invention.

Figure 60:
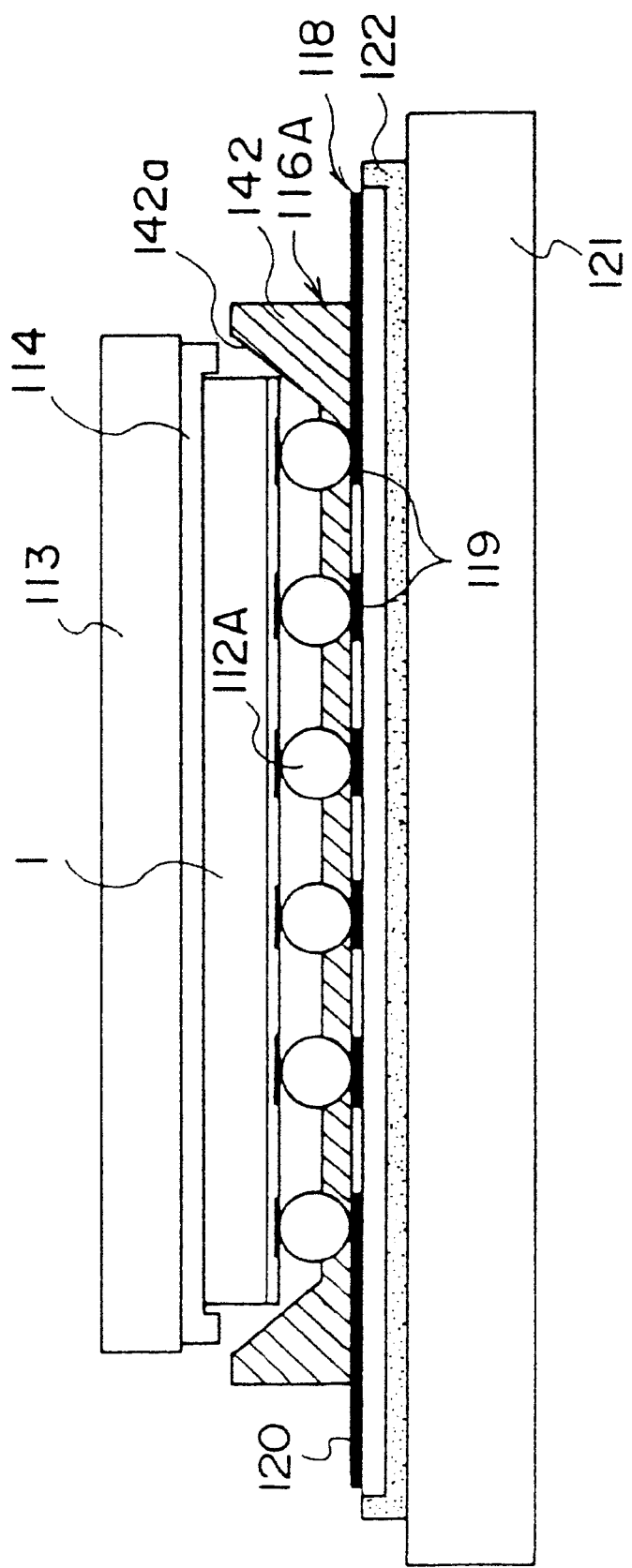
FIG. 60 shows a semiconductor test apparatus according to a thirty-seventh embodiment of the present invention.

FIG. 60 shows a semiconductor test apparatus 10B-7 according to the thirty-seventh embodiment. The semiconductor test apparatus 10B-7 is constructed such that positioning parts 142 for defining the position of the semiconductor device 1 are provided on the array substrate 116. Referring to FIG. 60, the positioning part 142 have a trapezoidal cross-section and approach the semiconductor device 1 from the bottom of the paper so as to come into contact with the bottom corners of the semiconductor device 1.

As described before, the semiconductor device 1 may be inclined when subjected to vacuum by the fixing jig 113. The semiconductor test apparatus 10B-7 ensures that, as the fixing jig 113 lowers so that the plate connection terminals 2 of the semiconductor device 1 are connected with the respective connection electrodes 112A, the bottom corners of the semiconductor device 1 come into sliding contact with the slope 142a of the positioning parts 142 so that the semiconductor device 1 is guided into its position.

Thus, the semiconductor device 1 is guided into the center of the array substrate 116 so as to be parallel therewith, as the bottom corners thereof come into sliding contact with the slope 142a of the positioning parts 142. As a result, the plate connection terminals 2 of the semiconductor device 1 are properly connected to the connection electrodes 112A mounted on the array substrate 116. Accordingly, the semiconductor device 1 is tested in a highly reliable manner.

A description will now be given of thirty-eighth through forty-third embodiments of the present invention.

FIGS. 61 to 66 show semiconductor test apparatuses 10B-8–10B-13, respectively, according to the thirty-eighth through forty-third embodiments, respectively. The semiconductor test apparatuses 10B-8–10B-13 are constructed such that a positioning mechanism for defining the position of the semiconductor device 1, the array substrate 116, the measurement substrate 118 is provided. In each of these embodiments, a guide pin is used as the positioning mechanism.

Figure 61:
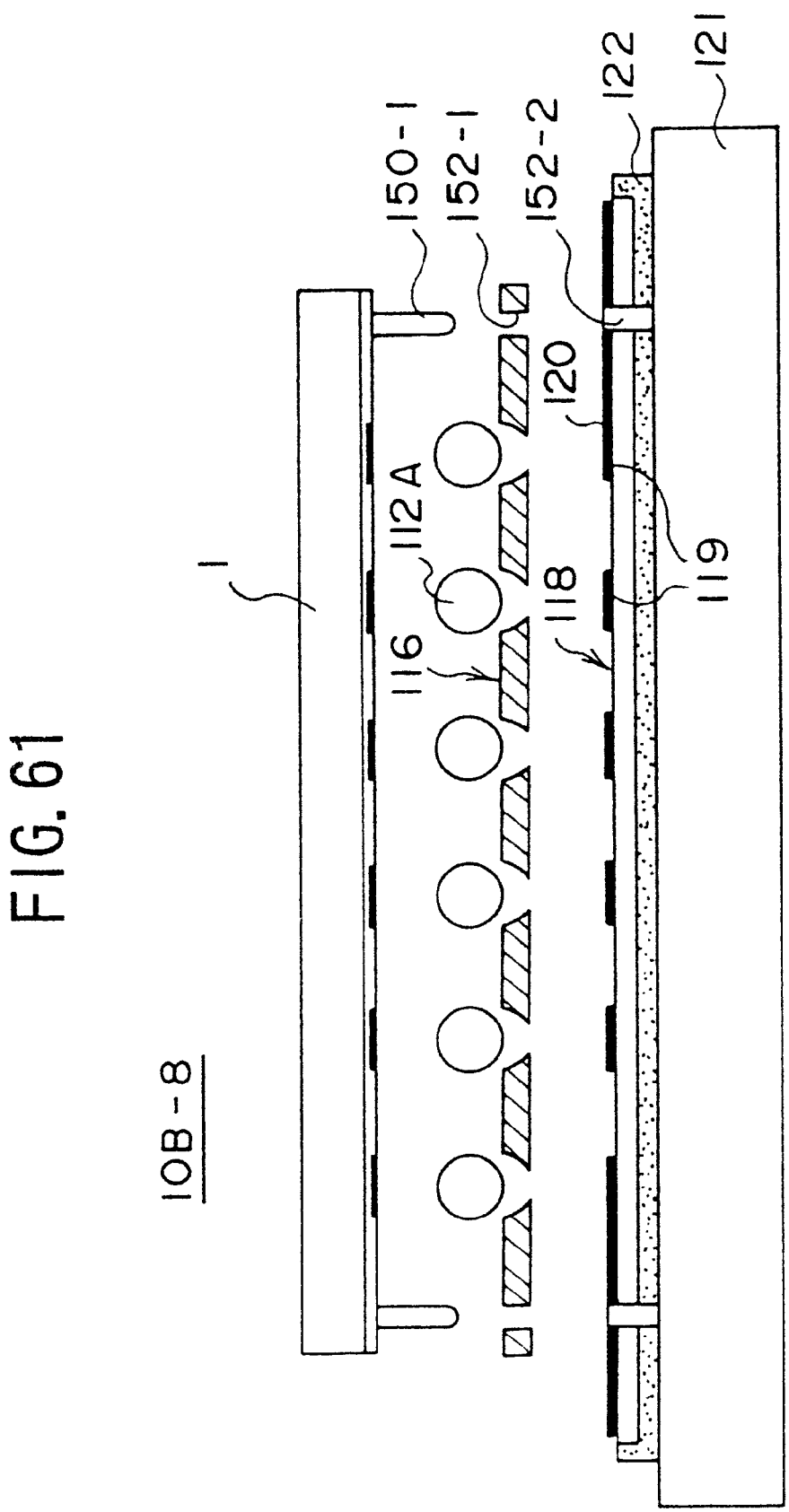
FIG. 61 shows a semiconductor test apparatus according to a thirty-eighth embodiment of the present invention.

The semiconductor test apparatus 10B-8 according to the thirty-eighth embodiment shown in FIG. 61 tests the semiconductor device 1 provided with guide pins 150-1. Positioning holes 152-1 in which the guide pins 150-1 are fitted are provided in the array substrate 116. Further, positioning holes 152-2 in which the guide pins 150-1 are provided in the measurement substrate 118 and the holder part 122.

With this construction, positioning of the plate connection terminals 2 and the connection electrodes 112A with respect to each other and positioning of the connection terminal 112A and the measurement terminals 119 with respect to each other are conducted by fitting the guide pins 150-1 provided in the semiconductor device 1 in the positioning holes 152-1 provided in the array substrate 116 and in the positioning holes 152-2 provided in the measurement substrate 118 and the holder part 122. Thus, connection failure is unlikely to occur in the semiconductor test apparatus 10B-8, enabling a reliable test to be conducted on the semiconductor device 1.

Figure 62:
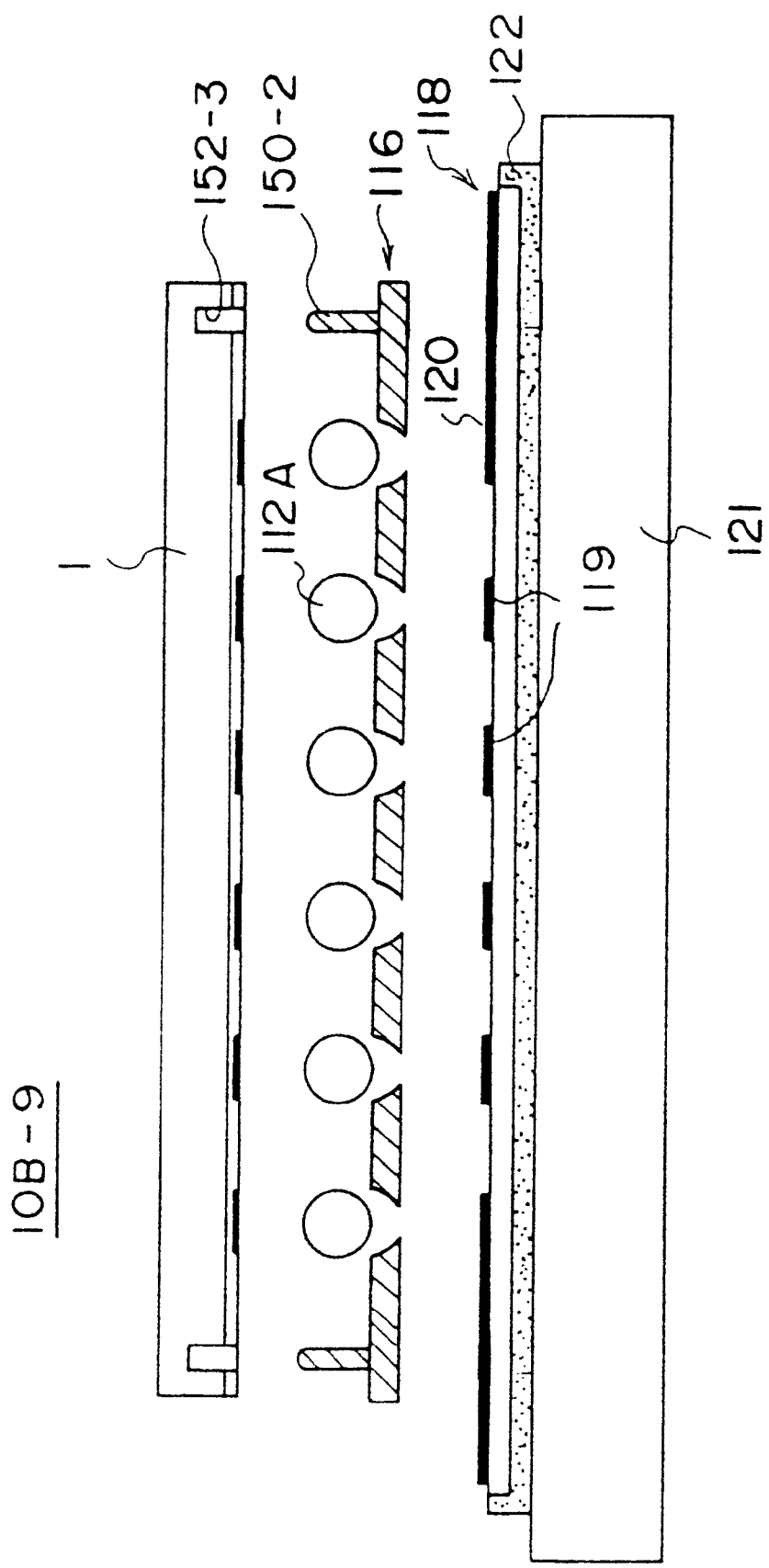
FIG. 62 shows a semiconductor test apparatus according to a thirty-ninth embodiment of the present invention.

The semiconductor test apparatus 10B-9 according to the thirty-ninth embodiment shown in FIG. 62 is constructed such that positioning holes 152-3 are provided in the semiconductor device 1 and guide pins 150-2 are provided in the array substrate 116 so as to stand upright thereon.

With this construction, positioning of the plate connection terminals 2 and the connection electrodes 112A with respect to each other is performed by fitting the guide pins 150-2 provided to stand on the substrate 116 in the positioning holes 152-3 formed in the semiconductor device 1. Thus, the semiconductor test apparatus 10B-9 ensures that the semiconductor device 1 and the array substrate 116 are positioned with respect to each other with a high precision so that the plate connection terminals 2 and the connection electrodes 112A are properly connected to each other. Accordingly, the semiconductor device 1 is tested in a highly reliable manner.

Figure 63:
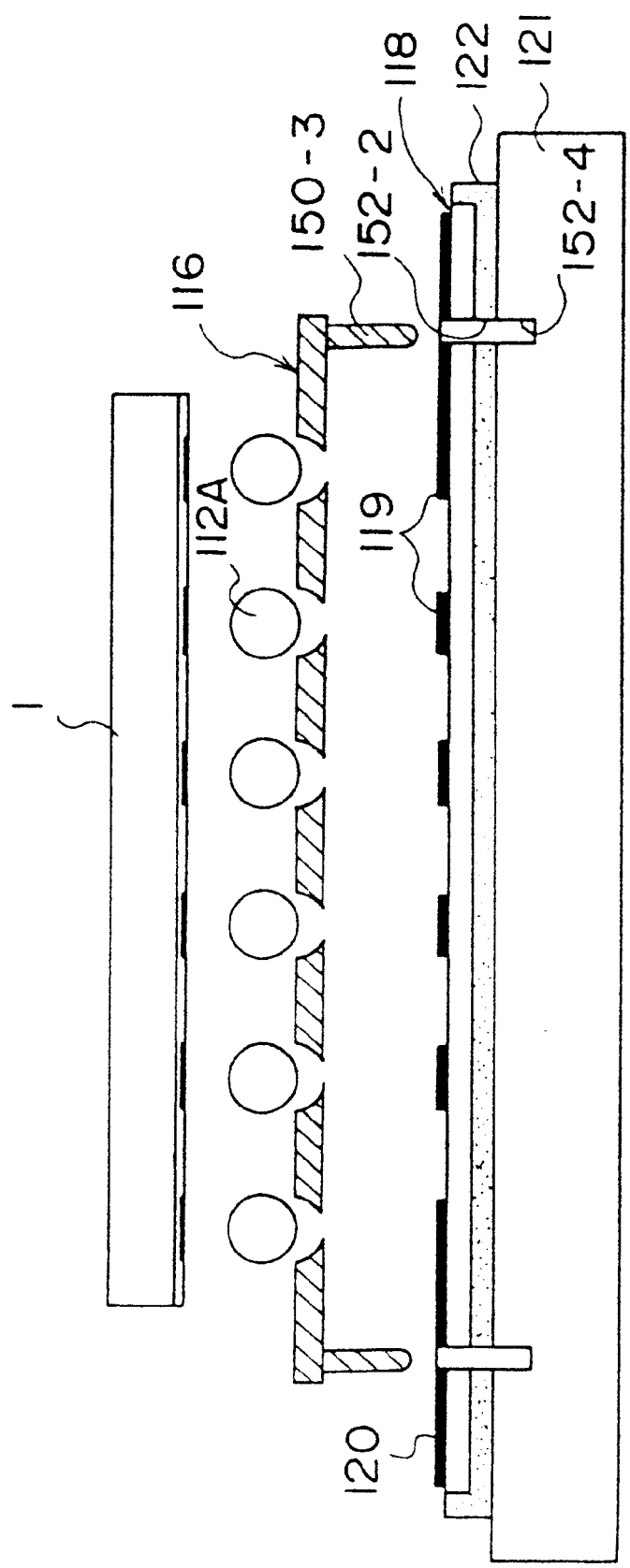
FIG. 63 shows a semiconductor test apparatus according to a fortieth embodiment of the present invention.

The semiconductor test apparatus 10B-10 according to the fortieth embodiment shown in FIG. 63 is constructed such that guide pins 150-3 are provided in the array substrate 116 so as to project downward therefrom, positioning holes 152-2 are formed in the measurement substrate 118 and positioning holes 152-4 are formed in the stage 121.

With this construction, positioning of the connection electrodes 112A and the measurement terminals 119 with respect to each other is performed by fitting the guide pins 150-3 provided in the array substrate 116 in the positioning holes 152-2 formed in the measurement substrate 118 and in the guide holes 152-4 formed in the stage 121. Thus, the semiconductor test apparatus 10B-10 ensures that the array substrate 116 and the measurement substrate 118 are positioned with respect to each other with a high precision so that the connection electrodes 112A and the measurement terminals 119 are properly connected to each other. Accordingly, the semiconductor device 1 is tested in a highly reliable manner.

Figure 64:
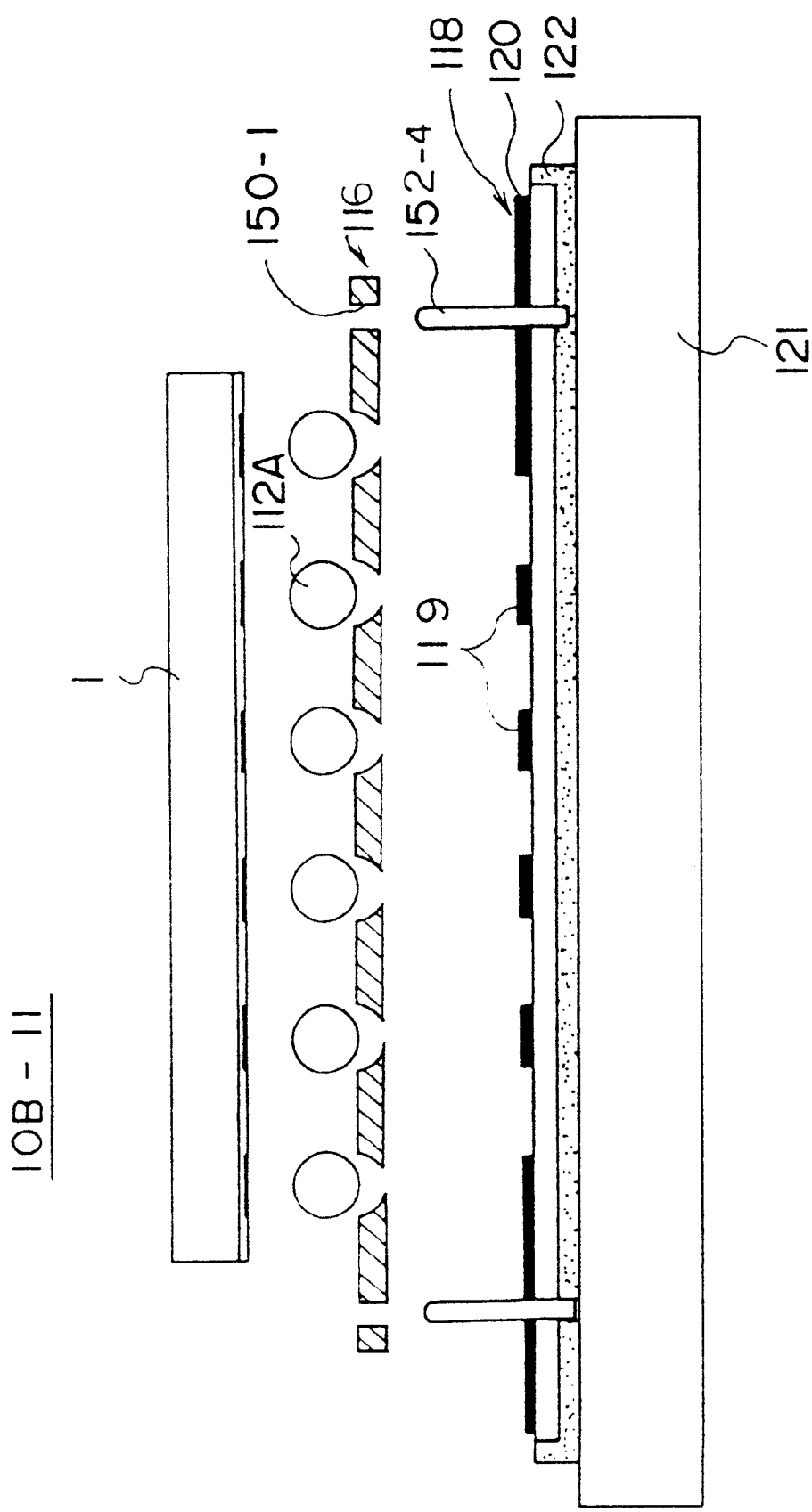
FIG. 64 shows a semiconductor test apparatus according to a forty-first embodiment of the present invention.

The semiconductor test apparatus 10B-11 according to the fourth-first embodiment shown in FIG. 64 is constructed such that guide pins 150-4 are provided in the stage 121 so as to stand upright thereon, the positioning holes 152-1 are formed in the array substrate 118 and the positioning holes 152-2 are formed in the measurement substrate 118.

With this construction, positioning of the array substrate 116 and the measurement substrate 118 with respect to each other is performed by fitting the guide pins 150-4 provided in the stage 121 in the positioning holes 152-1 formed in the array substrate 116 and in the positioning holes 152-2 formed in the measurement substrate 118. Thus, the semiconductor test apparatus 10B-11 ensures that the array substrate 116 and the measurement substrate 118 are positioned to each other with a high precision so that the connection electrodes 112A and the measurement terminals 119 are properly connected to each other. Accordingly, the semiconductor device 1 is tested in a highly reliable manner.

The semiconductor test apparatus 10B-12 according to the forty-second embodiment shown in FIG. 65 is constructed such that guide pins 150-5 are provided in the fixing jig 112 so as to extend downward, the positioning holes 152-1 are formed in the array substrate 116 and the positioning holes 152-4 are formed in the measurement substrate 118.

With this construction, positioning of the array substrate 116 and the measurement substrate 118 with respect to each other is performed by fitting the guide pins 150-5 provided in the fixing jig 113 in the positioning holes 152-1 formed in the array substrate 116 and in the positioning holes 152-4 formed in the measurement substrate 118. Thus, the semiconductor test apparatus 10B-12 ensures that the semiconductor device 1, the array substrate 116 and the measurement substrate 118 are positioned with a high precision so that the connection electrodes 112A and the measurement terminals 119 are properly connected to each other and the connection electrodes 112A and the plate connection terminals 2 are properly connected to each other. Accordingly, the semiconductor device 1 is tested in a highly reliable manner.

The semiconductor test apparatus 10B-13 according to the forty-third embodiment shown in FIG. 66 is constructed such that guide pins 150-6 are provided in the stage 121 so as to stand upright, the positioning holes 152-1 are formed in the array substrate 116, the positioning holes 152-4 are formed in the measurement substrate 118 and positioning holes 152-5 are formed in the fixing jig 113.

With this construction, positioning of the semiconductor device 1, the array substrate 116, the measurement substrate 118 with respect to each other is performed by fitting the guide pins 150-6 provided in the stage 121 in the positioning holes 152-1, 152-4 and 152-5 formed in the array substrate 116, the measurement substrate 118 and the fixing jig 113, respectively. Thus, the semiconductor test apparatus 10B-13 ensures that the semiconductor device 1, the array substrate 116, the measurement substrate 118 are positioned with a high precision so that the connection electrodes 112A and the measurement terminals 119 are properly positioned with respect to each other and the connection electrodes 112A and the plate connection terminals 2 are properly positioned with respect to each other. Accordingly, the semiconductor device 1 is tested in a highly reliable manner.

A description will now be given of a method for mounting the connection electrode 112A in the positioning depression 117 formed in the array substrate 116. FIGS. 68A to 72B show how the connection electrode 112A is mounted in the positioning depression 117.

FIGS. 68A and 68B show a construction whereby a vibration generator (not shown) is attached to the array substrate 116 so that the connection electrode 112A is mounted in the positioning depression 117 by vibrating the array substrate 116 using the vibration generator.

By vibrating the array substrate 116, the semiconductor device 1 is vibrated relative to the array substrate 116 so that the connection electrode 112A is fitted to its position in the positioning depression 117 formed in the array substrate 116. Thus, positioning of the connection electrode 112A and the positioning depression 117 with respect to each other is performed easily and automatically.

Figure 69A:
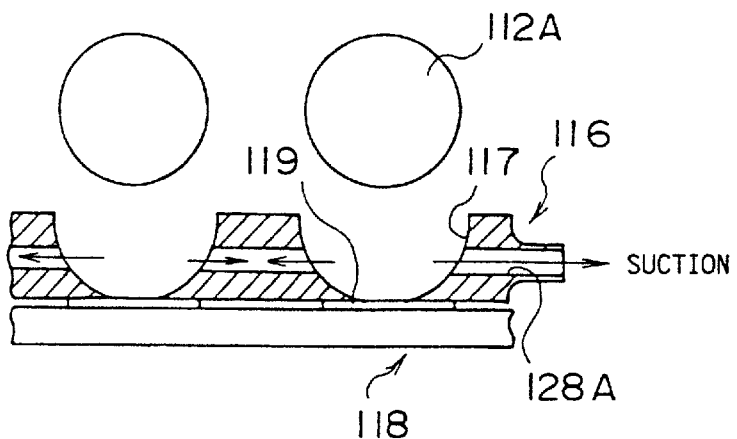
FIGS. 69A and 69B show a method whereby the connection electrode is secured in its position on the array substrate using suction.
Figure 69B:
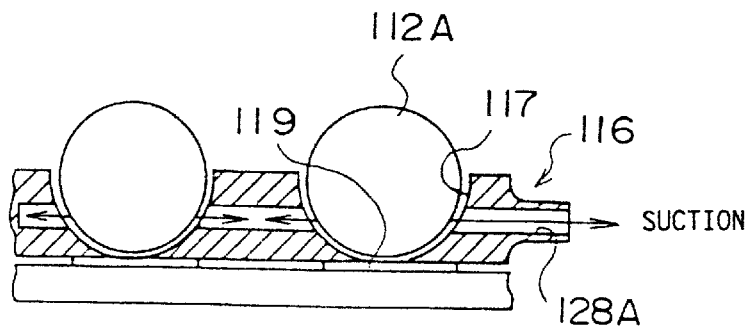

FIGS. 69A and 69B show a construction where a suction passage 128A connected to a vacuum suction device (vacuum pump) is formed in the array substrate 116 such that ends of the suction passage 128A open to the positioning depressions 117. Therefore, by driving the vacuum pump so as to hold the connection electrode 112A via the suction passage 128A, the connection electrode 112A is held by vacuum to its position in the positioning depression 117. Thus, the connection electrode 112A is positioned in the positioning depression 117 with a high precision.

Figures 70A, 70B:
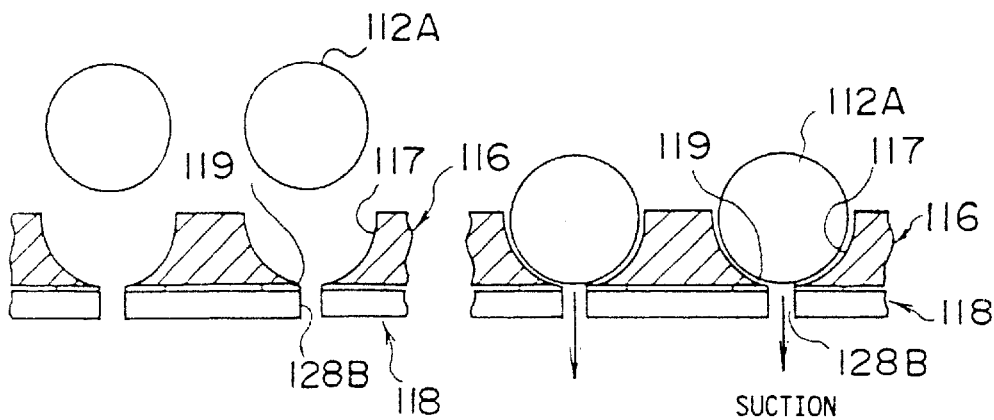
FIGS. 70A and 70B show another method whereby the connection electrode is secured in its position on the array substrate using suction.

FIGS. 70A and 70B show a construction where a suction passage 128B connected to a vacuum suction device (vacuum pump) is formed in the array substrate 116 such that ends of the suction passage 128B open to the bottom of the positioning depressions 117. Therefore, by driving the vacuum pump so as to hold the connection electrode 112A via the suction passage 128B, the connection electrodes 112A are positioned by vacuum vertically downward to the positioning depressions 117 so that the connection electrodes 112A are positioned in the positioning depressions 117 with a high precision.

FIGS. 71A and 71B show an array substrate 116B formed of a porous material and connected to a vacuum suction device (vacuum pump).

With this construction, since the array substrate 116B is formed of a porous material, the connection electrodes 112A are fitted in the positioning depressions 117 by driving the vacuum pump. Accordingly, the connection electrodes 112A are positioned in the positioning depressions 117 with a high precision.

FIGS. 72A and 72B show an array substrate 116C provided with positioning depressions 160 having first and second slopes at different angles, the first slope being relatively gentle and the second slope being relatively steep. In the example shown, the first slope embodies a guide face 161 for guiding the connection electrode 112A as the connection electrode 112A is lowered and the second slope embodies an engaging face 162 for latching the connection electrode 112A. Further, a positioning face 163 aligned with the plate terminal 2 is formed between the guide face 161 and the engaging face 162.

Thus, the connection electrode 112A reaching the positioning depression 160 is guided by the guide face 161 and is secured in its position by being latched by the latching face 162. The connection electrode 112A latched by the latching face 162 is lowered so as to be fitted in the positioning face 163.

Thus, by forming the guide face 161, the latching face 162 and the positioning face 163 in the positioning depression 160, the connection electrode 112A and the positioning depression 160 can be properly positioned with respect to each other.

Figure 73A:
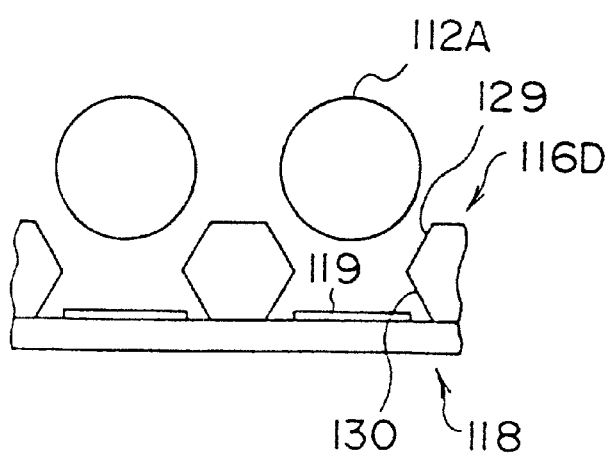
FIGS. 73A and 73B show another method whereby the connection electrode is secured in its position on the array substrate using a slope.
Figure 73B:
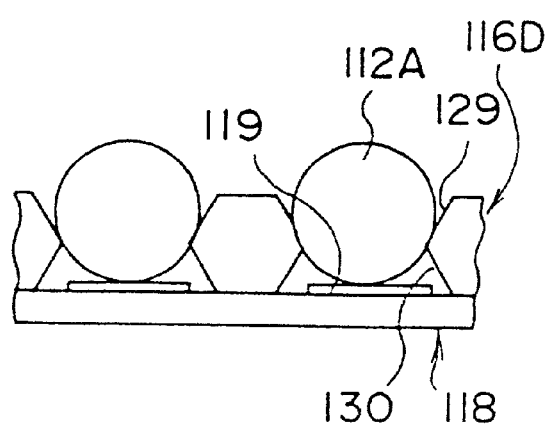

FIGS. 73A and 73B show an array substrate 116D provided with positioning depressions each comprising a first depression 129 and a second depression 130. The first depression 129 is formed at the top of the array substrate 116D and the second depression 130 is formed so as to be opposite to the measurement substrate 118. The depressions 129 and 130 are configured to have a taper.

With this construction, the tapered first depression 129 guides the connection electrode 112A into the positioning depression. Since the first and second depressions 129 and 130 are both tapered, the intersection between the first and second depressions 129 and 130 is pointed. The pointed intersection positions the connection electrode 112A in the positioning depression with a high precision.

Figure 75A:
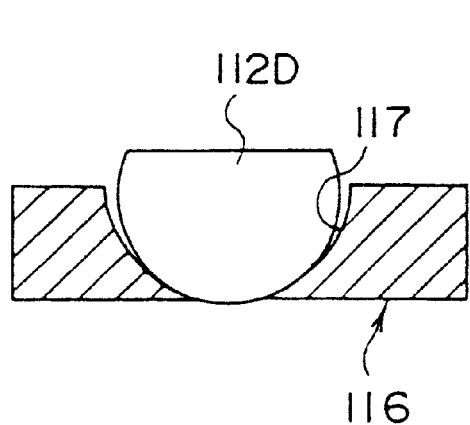
FIGS. 75A and 75B show how a deformed connection electrode is returned to its original shape.
Figure 75B:
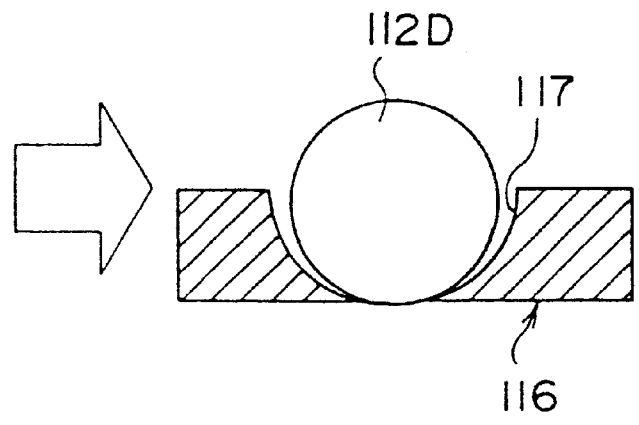

A description will now be given, with reference to FIGS. 74 to 75B, of how the connection electrode 112A, instead of the elastomer 126A–126D, cancels an inclination of the semiconductor device 1 mounted on a semiconductor test apparatus.

The semiconductor test apparatus shown in FIG. 74 uses connection electrodes 112D each formed of a soft material having a low melting point. More specifically, it is assumed that the connection electrode 112D is formed of a solder having a low melting point. Since the connection electrode 112D is soft and has a low melting point, the connection electrode 112D is easily deformed when a pressure is applied thereto and is easily melted when heat is applied thereto.

It is assumed that the semiconductor device 1 (having an inclined configuration) is mounted on a semiconductor test apparatus having the connection electrodes 112D mounted thereon. Assuming that the connection electrode is formed of a hard material, the connection electrode is hardly deformed. A problem with such a construction is that, when the semiconductor device is mounted in an inclined state, the plate connection terminal 2 at the lowest position is electrically connected to the connection electrode but the other plate connection terminals 2 form a gap with the respective connection electrodes, thus failing to establish electrical connection therewith.

By using the connection electrode 112D formed of a soft material, the connection electrode 112A is deformed as shown in FIG. 74 by a pressure exerted thereon when the fixing jig 113 presses the semiconductor device 1 against the array substrate 116 and the measurement substrate 118. Accordingly, the inclination of the semiconductor device 1 is canceled by deformation of the connection electrode 112D so that all of the plate connection terminals 2 formed in the semiconductor device 1 are electrically connected to the respective connection electrodes 112D. Accordingly, the semiconductor test 1 is tested in a highly reliable manner.

As described above, the connection electrode 112D is formed of a material having a low melting point. Even when the connection electrode 112D is deformed as a result of a test as shown in FIG. 75A, it is easy to melt the connection electrode 112D by applying heat thereto, whereupon a surface tension in the melted connection electrode 112D causes it to return to the original spherical shape, as shown in FIG. 75B. Therefore, by applying heat to the connection electrodes 112D after each test, it is possible to continue to use the spherical connection electrode 112D to test the semiconductor device 1.

FIG. 76 shows a semiconductor test apparatus in which a holder 190 is provided to prevent the connection electrodes 112A from dispersing. As described previously, the connection electrode 112A is mounted on the array substrate 116. Generally, a larger number of connection electrodes 112A are mounted on the array substrate 116 than the number of positioning depressions 117 in order to ensure that the semiconductor device 1 is properly mounted on the semiconductor test apparatus, resulting in many of the connection electrodes 112A remaining unused.

Since the diameter of the connection electrode 112A is made small enough to adapt to the configuration of the plate connection terminal 2 provided in the semiconductor device 1 with a high density, the connection electrode 112A is easily dispersed. Accordingly, it is important to efficiently retrieve the unused connection electrodes 112A.

The holder 190 is provided to cover the lower part of the stage 121. A flange-like dispersion prevention part 191 is formed to cover the position lateral to the array substrate 116 at which the connection electrodes 112A are easily dispersed. By providing the holder 190, it is possible to retrieve the connection electrodes 112A dispersed when they are mounted on the array substrate 116.

Figure 77:
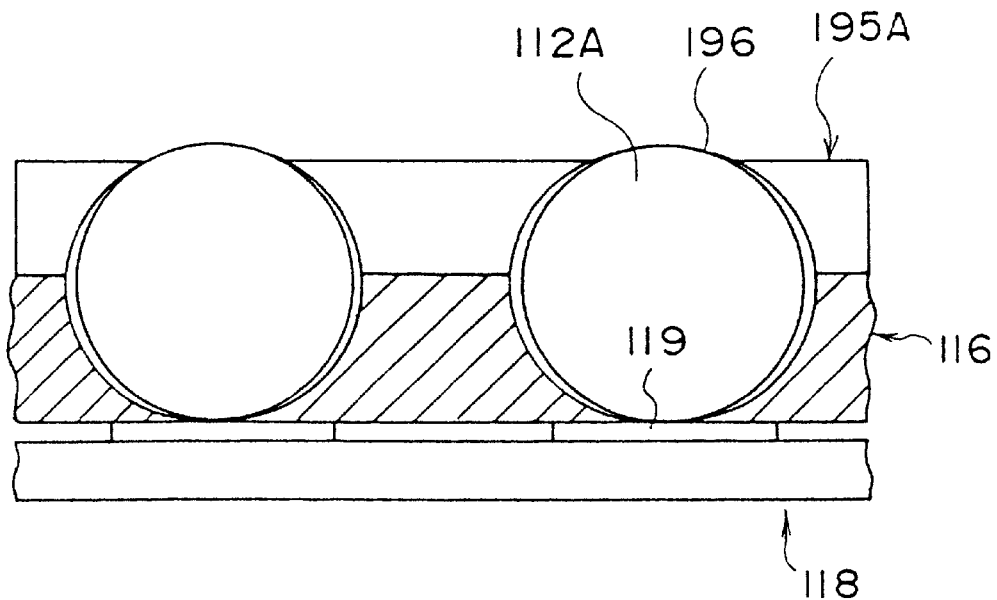
FIG. 77 shows a construction in which a cover is provided on top of the array substrate.
Figures 78A, 78B:
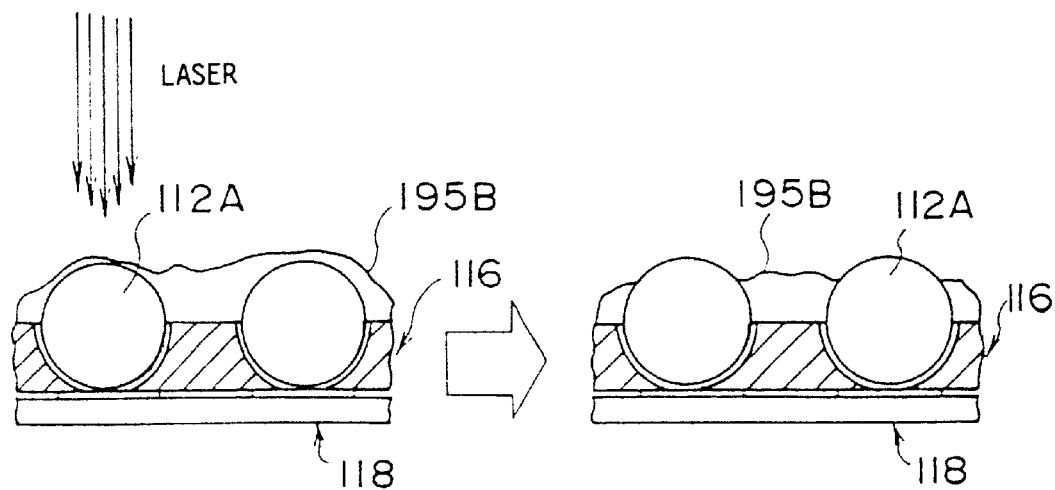
FIGS. 78A and 78B show a method whereby the connection electrode is exposed through the cover provided in the array substrate.

FIG. 77 shows a semiconductor test apparatus in which a cover 195A is formed on top of the array substrate 116 and an opening 196 is formed in the cover 195A so as to expose the top of the connection electrode 112A. By providing the cover 195A accommodating the connection electrode 112A on top of the array substrate 116, removal and dispersion of the connection electrodes 112A from the array substrate 116 is prevented.

By forming the cover 195A of a material having elasticity, the cover 195A acts as a buffer for an external force applied to the semiconductor device 1 mounted in the semiconductor test apparatus. As a result, it is possible to prevent a large stress from occurring between the plate connection terminal 2 and the measurement terminal 119, thus protecting the plate connection terminals 2 and the connection electrodes 112A.

Providing the cover 195A does not cause improper electrical connection between the plate connection terminal 2 and the connection electrode 112A because the top of the connection electrode 112A is exposed via the opening 196.

FIGS. 78A to 79B show how the opening 196 is formed so as to expose the top of the connection electrode 112A. In the method shown in FIGS. 78A and 78B, a cover 195B for covering the entirety of the connection electrodes 112A is first formed on top of the array substrate 116 (see FIG. 78A). Subsequently, that part of the cover 195B covering the top of the connection electrode 112A is removed using a laser beam. As a result, as shown in FIG. 78B, an opening is formed in the cover 195B, exposing the top of the connection electrode 112A through the cover 195B.

Figure 79A:
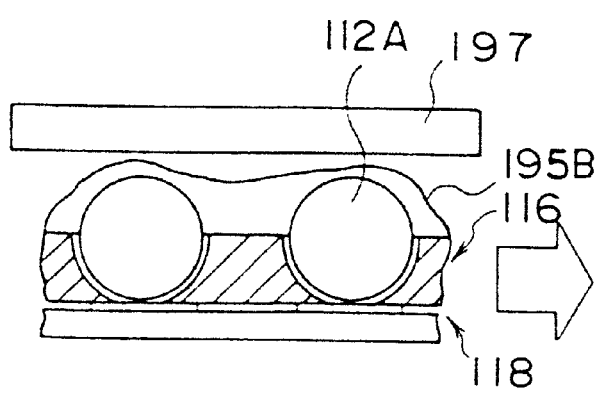
FIGS. 79A and 79B show another method whereby the connection electrode is exposed through the cover provided in the array substrate.
Figure 79B:
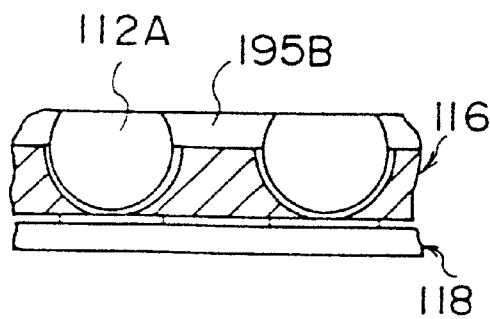

In the method shown in FIGS. 79A and 79B, the cover 195B is formed on top of the array substrate 116 so as to cover the connection electrodes 112A. Subsequently, that part of the cover 195B covering the top of the connection electrode 112A is removed using a polishing jig 197 (a file or the like). As a result, an opening is formed in the cover 195B, a shown in FIG. 79B, exposing the top of the connection electrode 112A through the cover 195B. Thus, the process of exposing the top of the connection electrode 112A through the cover 195B is performed easily.

The present invention is not limited to the above-described embodiments, and variations and modifications may be made without departing from the scope of the present invention.

What is claimed is:

1. A semiconductor test method for testing a semiconductor device having plate connection terminals, using a semiconductor test apparatus that comprises:

a test substrate comprising a support film and a conductive layer, said support film formed of an insulating material and said conductive layer formed on said support film and having deformation connection parts connected with said plate connection terminals; and an upholding substrate having upholding parts formed to project at a position that faces said connection parts and which urges, in cooperation with said test substrate, said connection parts toward said plate connection terminals of said semiconductor device so as to electrically connect said deformable connection parts to said plate connection terminals in a state in which said deformed parts are bent, said semiconductor test method comprising the steps of:

mounting said semiconductor device on said test substrate and assembling said test substrate to said upholding substrate; and deforming said connection parts by urging said connection parts against said upholding parts as a result of said assembling, and establishing electrical connection between said connection parts and said plate connection terminals.

2. The semiconductor test method as claimed in claim 1, wherein said test substrate is turned upside down every time a test is completed.

3. A semiconductor test apparatus for testing a semiconductor device having plate connection terminals, comprising:

a measurement substrate having measurement terminals provided at positions that correspond to said plate connection terminals;

an array substrate detachably mounted on said measurement substrate and having positioning depressions, for exposing said measurement terminals, provided at positions that correspond to said plate connection terminals, such that said array substrate is detachably mounted or such that said connection electrodes are detachably mounted in said positioning depressions; and connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, wherein a top of each of said connection electrodes is configured to project from said array substrate.

4. The semiconductor test apparatus as claimed in claim 3, wherein a protection film is formed at a periphery of each of said connection electrodes.

5. The semiconductor test apparatus as claimed in claim 3, wherein a stud bump projecting in a direction of a corresponding one of said connection electrodes is provided in each of said measurement terminals.

6. The semiconductor test apparatus as claimed in claim 3, wherein a conductive plating electrically connected to a corresponding one of said measurement terminals is provided in an inner wall of each of said positioning depressions.

7. The semiconductor test apparatus as claimed in claim 6, wherein said conductive plating is made integral with the corresponding one of said measurement terminals.

8. The semiconductor test apparatus as claimed in claim 3, wherein a deformable conductive resin is provided in each of said measurement terminals.

9. The semiconductor test apparatus as claimed in claim 3, further comprising a test unit having a lower end thereof electrically connected to a corresponding one of said measurement terminals and a top end thereof being provided with a corresponding one of said connection electrodes, said test unit accommodating an urging mechanism for urging the corresponding one of said connection electrodes against a corresponding one of said plate connection terminals.

10. The semiconductor test apparatus as claimed in claim 3, further comprising a buffer member providing a buffer to a pressure occurring when said connection electrodes are connected to said plate connection terminals.

11. The semiconductor test apparatus as claimed in claim 10, wherein a notch is formed in said buffer member.

12. The semiconductor test apparatus as claimed in claim 10, wherein said buffer member is formed by combining a plurality of individual members.

13. The semiconductor test apparatus as claimed in claim 10, wherein said array substrate is formed of an elastic material.

14. The semiconductor test apparatus as claimed in claim 3, further comprising a positioning mechanism for positioning said plate connection terminals and said connection electrodes with respect to each other.

15. The semiconductor test apparatus as claimed in claim 14, wherein said positioning mechanism is implemented by guide pins.

16. The semiconductor test apparatus as claimed in claim 14, wherein said positioning mechanism is implemented by a fixing jig for holding said semiconductor device.

17. The semiconductor test apparatus as claimed in claim 14, wherein said positioning mechanism is implemented by positioning parts provided in said array substrate.

18. The semiconductor test apparatus as claimed in claim 3, further comprising an aligning mechanism for aligning said plate connection terminals and said connection electrodes with respect to each other by controlling a position of said semiconductor device.

19. The semiconductor test apparatus as claimed in claim 3, further comprising a holder for preventing said connection electrodes from being dispersed when said connection electrodes are mounted on said array substrate.

20. A semiconductor test method for testing a semiconductor device having plate connection terminals, using a semiconductor test apparatus that comprises:
a measurement substrate having measurement terminals provided at positions that correspond to said plate connection terminals;
an array substrate mounted on said tested substrate and having positioning depressions, for exposing said measurement terminals, provided at positions that correspond to said plate connection terminals; and
connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, wherein
a top of each of said connection electrodes is configured to project from said array substrate, and wherein said semiconductor test method comprising the steps of:
mounting said connection electrodes in said positioning depressions provided in said array substrate so as to position said connection electrodes; and
testing said semiconductor device by electrically connecting said connection electrodes thus positioned to said plate connection terminals.

21. The semiconductor test method as claimed in claim 20, further comprising the step of positioning said connection electrodes in said positioning depressions by vibrating said array substrate.

22. The semiconductor test method as claimed in claim 20, further comprising the steps of:
forming a suction passage in said array substrate;
connecting said suction passage to a suction device; and
positioning said connection electrodes in said positioning depressions by providing a suction to said connection electrodes via said suction passage.

23. The semiconductor test method as claimed in claim 20, further comprising the steps of:
forming said array substrate of a porous material;
connecting a suction device to said array substrate; and
positioning said connection electrodes in said positioning depressions by providing a suction to said connection electrodes to said array substrate.

24. The semiconductor test method as claimed in claim 20, further comprising the steps of:
forming first and second slopes at different angles in each of said positioning depressions; and
positioning each of said connection electrodes in a corresponding one of said positioning depressions based on a difference in angles of said first and second slopes.

25. The semiconductor test method as claimed in claim 20, further comprising the steps of:
forming each of said connection electrodes of a soft material having a relatively low melting point; and
returning each of said connection electrodes to its original shape when a test on said semiconductor device is completed, by melting each of said connection electrodes.

26. A semiconductor test apparatus for testing a semiconductor device having plate connection terminals, comprising:
a measurement substrate having measurement terminals provided at positions that correspond to said plate connection terminals;
an array substrate mounted on said tested substrate and having positioning depressions, for exposing said measurement terminals, provided at positions that correspond to said plate connection terminals;
connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, and a positioning mechanism for positioning said plate connection terminals and said connection electrodes with respect to each other, wherein a top of each of said connection electrodes is configured to project from said array substrate and said positioning mechanism is implemented by guide pins.

27. A semiconductor test apparatus for testing a semiconductor device having plate connection terminals, comprising:

a measurement substrate having measurement terminals provided at positions that correspond to said plate connection terminals;

an array substrate mounted on said tested substrate and having positioning depressions, for exposing said measurement terminals, provided at positions that correspond to said plate connection terminals;

connection electrodes mounted in said positioning depressions so that a lower end of each of said connection electrodes is electrically connected to a corresponding one of said measurement terminals and a top end of each of said connection electrodes is electrically connected to a corresponding one of said plate connection terminals, and a positioning mechanism for positioning said plate connection terminals and said connection electrodes with respect to each other, wherein a top of each of said connection electrodes is configured to project from said array substrate and said positioning mechanism is implemented by a fixing jig for holding said semiconductor device.

* * * * *